(12) United States Patent
Yamana et al.

(10) Patent No.: US 7,359,191 B2
(45) Date of Patent: Apr. 15, 2008

(54) STORAGE DEVICE SYSTEM AND COOLING STRUCTURE FOR LOGIC CIRCUIT BOARD FOR STORAGE DEVICE SYSTEM

(75) Inventors: Shunsuke Yamana, Odawara (JP); Hiroshi Fukuda, Odawara (JP); Kenji Fujita, Odawara (JP); Takayuki Atarashi, Tsuchiura (JP); Hitoshi Matsushima, Ryugasaki (JP)

(73) Assignee: Hitachi, Ltd., Tokyo (JP)

( * ) Notice: Subject to any disclaimer, the term of this patent is extended or adjusted under 35 U.S.C. 154(b) by 302 days.

(21) Appl. No.: 10/917,281

(22) Filed: Aug. 13, 2004

(65) Prior Publication Data

US 2005/0286221 A1   Dec. 29, 2005

(30) Foreign Application Priority Data

Jun. 23, 2004   (JP) .............................. 2004-185557

(51) Int. Cl.
*H05K 7/20* (2006.01)
(52) U.S. Cl. ........................ 361/687; 361/697; 361/721
(58) Field of Classification Search ................ 361/687, 361/697, 721
See application file for complete search history.

(56) References Cited

U.S. PATENT DOCUMENTS

| | | | |
|---|---|---|---|
| 4,770,242 A * | 9/1988 | Daikoku et al. ............ | 165/185 |
| 5,705,854 A | 1/1998 | Atarashi et al. | |
| 5,709,263 A | 1/1998 | Mira | |
| 5,927,385 A | 7/1999 | Yeh | |
| 6,118,656 A * | 9/2000 | Wang .......................... | 361/687 |
| 6,657,858 B2 | 12/2003 | Rothschild | |
| 6,697,255 B1 * | 2/2004 | Banton et al. .............. | 361/690 |
| 6,888,725 B2 * | 5/2005 | Kubo et al. ................. | 361/719 |
| 6,913,069 B2 | 7/2005 | Barsun et al. | |
| 6,935,419 B2 * | 8/2005 | Malone et al. .............. | 165/185 |
| 7,027,299 B2 * | 4/2006 | Wrycraft et al. ............ | 361/695 |
| 7,080,201 B2 * | 7/2006 | Suzuki et al. ............... | 711/114 |
| 7,080,701 B2 * | 7/2006 | Bloom et al. ................ | 175/51 |
| 2002/0152339 A1 | 10/2002 | Yamamoto | |

* cited by examiner

*Primary Examiner*—Jayprakash Gandhi
*Assistant Examiner*—Ingrid Wright
(74) *Attorney, Agent, or Firm*—Antonelli, Terry, Stout & Kraus, LLP.

(57) ABSTRACT

In this invention, the CPU of a NAS board, which is liable to become hot, is cooled by concentrating a larger amount of air onto a heat sink. A plurality of logic circuit boards 3 are mounted on a control section 1D of a disc array device 1. The circuit component 4A for realizing the NAS function, liable to become hot, is provided with a heat sink 5. The aperture of the main air inlet section (Wb) is covered with a top plate 8. Airflow guidance sections (Wa, Wc) are respectively provided on both sides of the main air inlet section. Since the fin pitch of the airflow guidance sections is set narrow, the air inflow resistance (airflow resistance) of these is higher than that of the main air inlet section. Due to this difference in airflow resistance, the air in the vicinity of the airflow guidance sections is guided into the main air inlet section. The top plate 8 prevents outflow of air that has flowed into the main air inlet section to outside the heat sink 5.

18 Claims, 43 Drawing Sheets

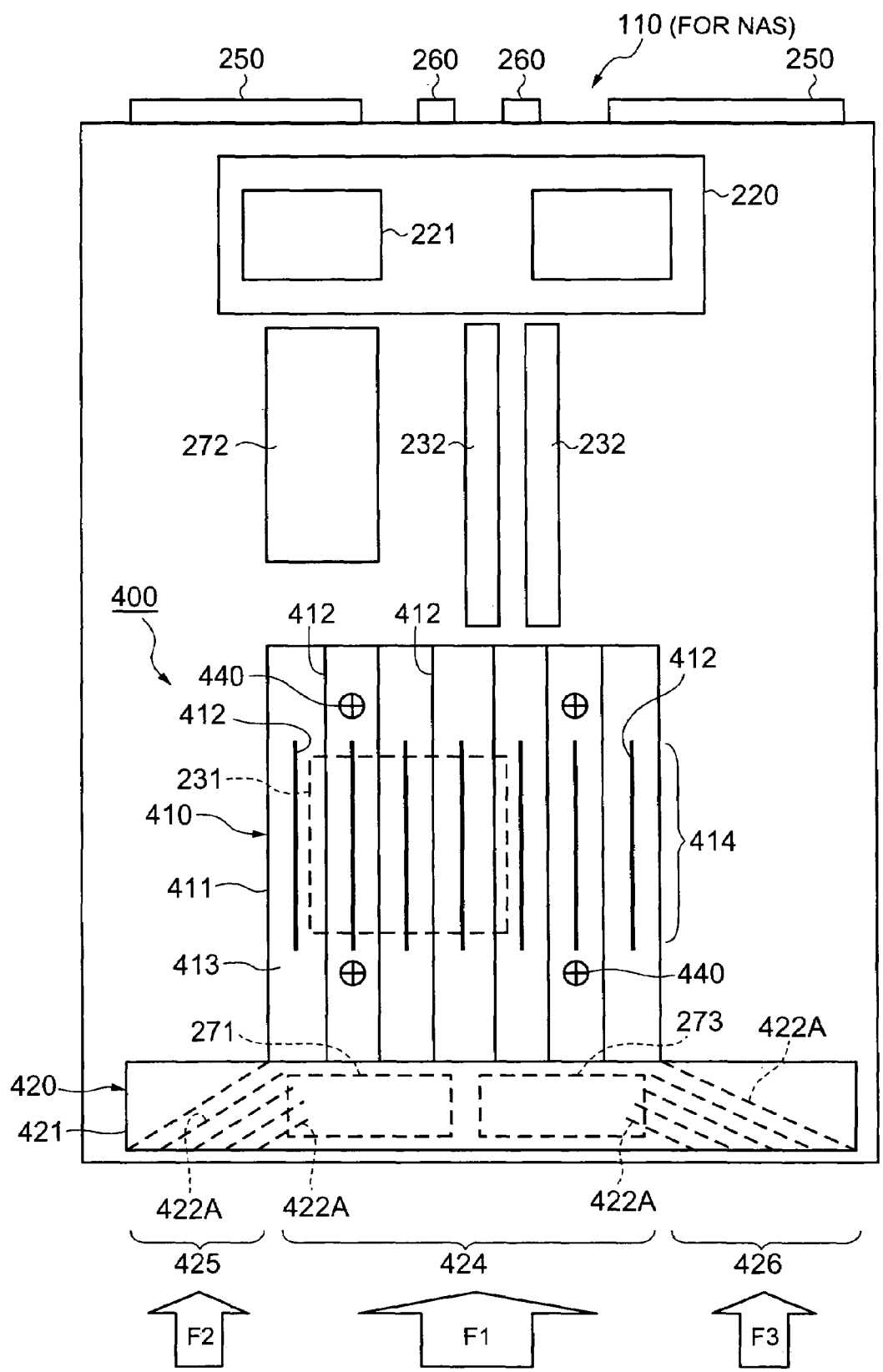

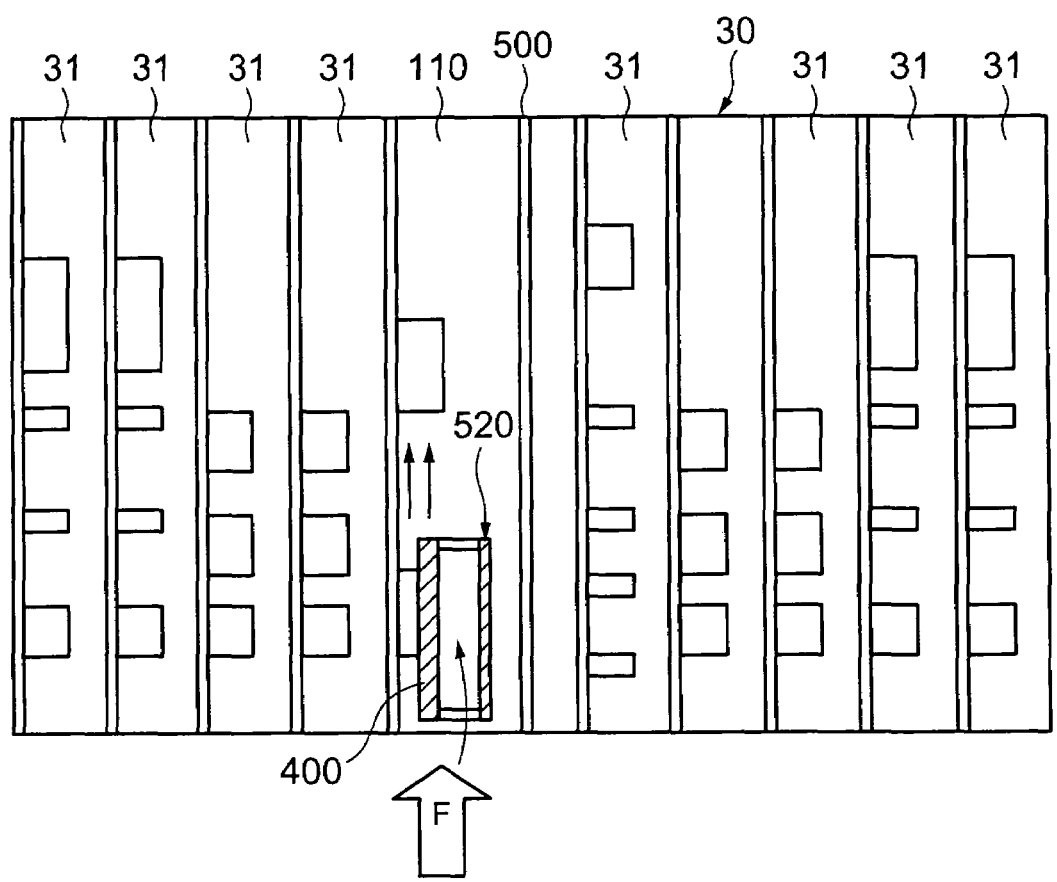

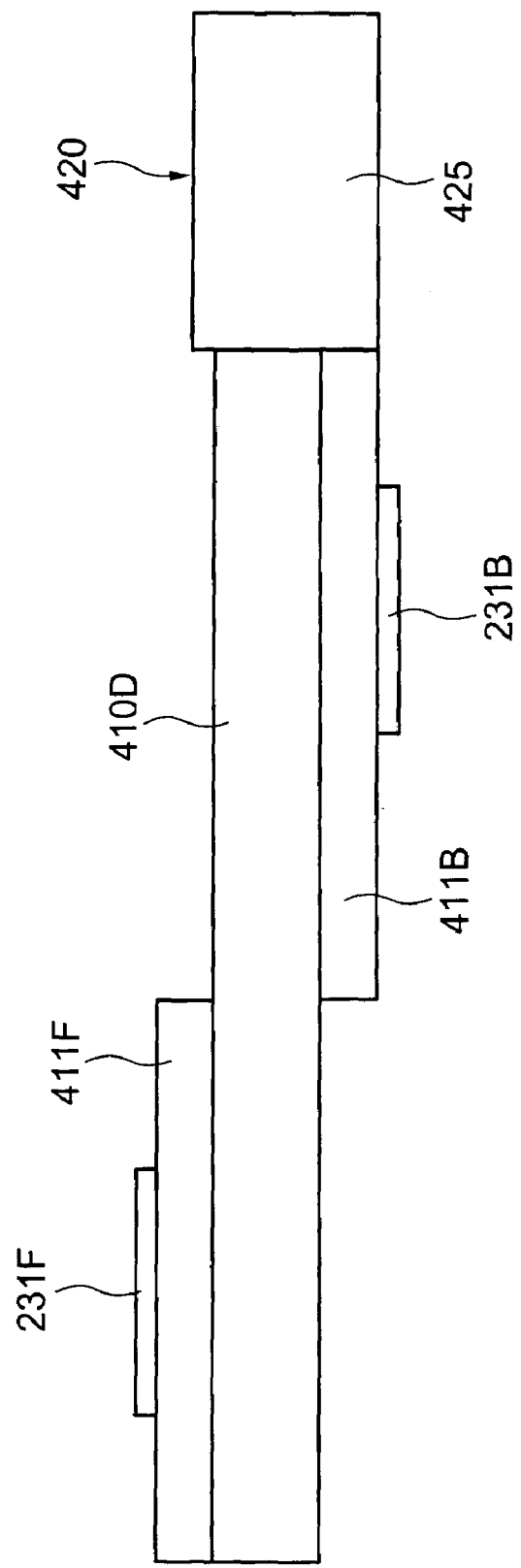

STORAGE DEVICE SYSTEM AND COOLING STRUCTURE FOR LOGIC CIRCUIT BOARD FOR STORAGE DEVICE SYSTEM

CROSS-REFERENCE TO RELATED APPLICATIONS

This application relates to and claims priority from Japanese Patent Application No. 2004-185557 filed on Jun. 23, 2004, the entire disclosure of which is incorporated herein by reference.

BACKGROUND OF THE INVENTION

1. Field of the Invention

The present invention relates to a storage device system such as for example a disc array device and a cooling structure for a logic circuit board for a storage device system.

2. Description of the Related Art

In a storage device system, for example large-capacity storage volumes are formed by arranging storage devices such as hard disc drives in the form of an array and these storage volumes are made available to a host device such as a mainframe or server. In one type of storage device system, data exchange at block level is performed under the control of for example Fibre Channel Protocol. Also, in another type of storage device system, exchange of data at file level is performed under the control of TCP/IP (Transmission Control Protocol/Internet Protocol) between NAS (Network Attached Storage) servers. In yet another type of storage device system, both block level data exchange under the control of Fibre Channel Protocol and file level data exchange under the control of TCP/IP can be performed (Laid-open U.S. patent application Ser. No. 2002/0152339).

A storage device system is constituted by mounting a large number of logic circuit boards such as control circuit boards that control data exchange with a host device and control circuit boards that control data exchange with a hard disc drive. Also, in a storage device system, mounting density must be raised and the circuit drive frequency raised in order to cope with market demands such as for example miniaturization and improved performance. This results in a reduction in the space available for air cooling and an increase in the rate of heat generation from circuit components. A more effective cooling structure for a storage device system is therefore sought.

SUMMARY OF THE INVENTION

The present invention was made in view of the above problems. An object of the present invention is to provide a storage device system and a cooling structure for a logic circuit board for a storage device system whereby cooling performance can be improved by directing air onto heat-sink fins. A further object of the present invention is to provide a storage device system and a cooling structure for a logic circuit board for a storage device system wherein cooling performance can be improved by suppressing outflow of air from the flow path between the heat-sink fins to the outside. Other objects of the present invention will become clear from the description of the following embodiments.

In order to solve the above problems, a storage device system according to the present invention comprises: a plurality of host interface control circuit boards for respectively controlling data exchange with a host device; a plurality of subordinate interface control circuit boards for respectively controlling data exchange with storage devices; and a memory circuit board that is shared by the host interface control circuit boards and the subordinate interface control circuit boards. Also, a prescribed host interface control circuit board of the host interface control circuit boards comprises a circuit board, a plurality of circuit components provided on this circuit board and a heat sink provided at a prescribed circuit component of these circuit components. In addition, the heat sink is provided with a plurality of heat-sink fins and an airflow guidance section for guiding air towards these heat-sink fins.

An example that may be given of a prescribed host interface control circuit board is a circuit board that performs data exchange at file level using TCP/IP. Also, an example that may be given of a prescribed circuit component is an operation processing circuit that controls data exchange.

The airflow guidance section may be provided in the vicinity of the air inlet side of the flow paths respectively formed between the heat-sink fins and may comprise a high airflow resistance section having a relatively higher airflow resistance than the airflow resistance of the flow paths (for example the airflow resistance on the inlet side of the flow paths). The airflow guidance section may comprise at least a top plate section provided so as to cover the air inlet side of the flow paths. The airflow resistance is an index specifying the effect on ease of flow of the air: if the airflow resistance is made larger, airflow becomes correspondingly more difficult and if the airflow resistance is made smaller, airflow becomes correspondingly easier. Consequently, since the air tries to flow in the direction of least airflow resistance, more air flows into the flow paths of small airflow resistance than into the flow paths of large airflow resistance. In some cases, the airflow resistance may also be referred to as for example the flow path resistance.

The pitch of the heat-sink fins positioned in a prescribed region corresponding to a prescribed circuit component may be set to be narrower than the pitch of the heat-sink fins positioned in other regions.

The airflow guidance section may be arranged on the outside of the heat-sink fins along the direction of arrangement of the heat-sink fins. A high airflow resistance section may be constituted by forming a plurality of other heat-sink fins with narrower pitch than the first-mentioned heat-sink fins. The heat-sink fins of the high airflow resistance section may be arranged towards the direction of a prescribed circuit component. It is also possible to set the pitch to become narrower in stepped fashion from the first-mentioned heat-sink fins towards the other heat-sink fins. Another prescribed circuit component may be arranged on the air outlet side of the high airflow resistance section. Also, the high airflow resistance section may be constituted so as to cut off inflow of air. The other prescribed circuit component may be arranged on the air outlet side of the heat-sink fins.

An airflow guidance plate may also be arranged in an opposite position separated from the air flow paths between the heat-sink fins. Another circuit board provided adjacent to a prescribed host interface control circuit board opposite to the mounting surface of the heat sink may be employed as an airflow guidance plate. Also, the airflow guidance plate may be a dummy circuit board arranged adjacent to the prescribed host interface control circuit board opposite to the mounting surface of the heat sink. In addition, a projection projecting towards the outside from the face on the opposite side to the face opposite to the heat sink may be provided on the airflow guidance plate. The airflow resistance of the air where the projection projects is increased by this projection, so the airflow resistance between the airflow guidance plate and the prescribed host interface control circuit board where the heat sink is provided becomes relatively smaller. Consequently, more air can be guided to the heat sink. Also, the airflow guidance plate may be mounted on the heat sink so as to cover the entire heat sink.

The heat sink may be constituted so as to be capable of cooling also a prescribed circuit component provided on a further prescribed host interface control circuit board provided in a condition facing the prescribed host interface control circuit board, in addition to the first-mentioned prescribed circuit component. The front face side of the airflow guidance section may also be formed so as to be inclined towards a prescribed component.

BRIEF DESCRIPTION OF THE DRAWINGS

FIG. 19 is a plan view of a heat sink according to a modified example;

FIG. 27 is a plan view of a control section according to a modified example;

FIG. 31 is a side view of a heat sink;

DESCRIPTION OF THE PREFERRED EMBODIMENTS

Embodiments of the present invention are described below with reference to the drawings. As described below, a storage device system according to this embodiment comprises a mechanism for guiding cooling air onto a heat sink for cooling a heater element.

Figure 1:
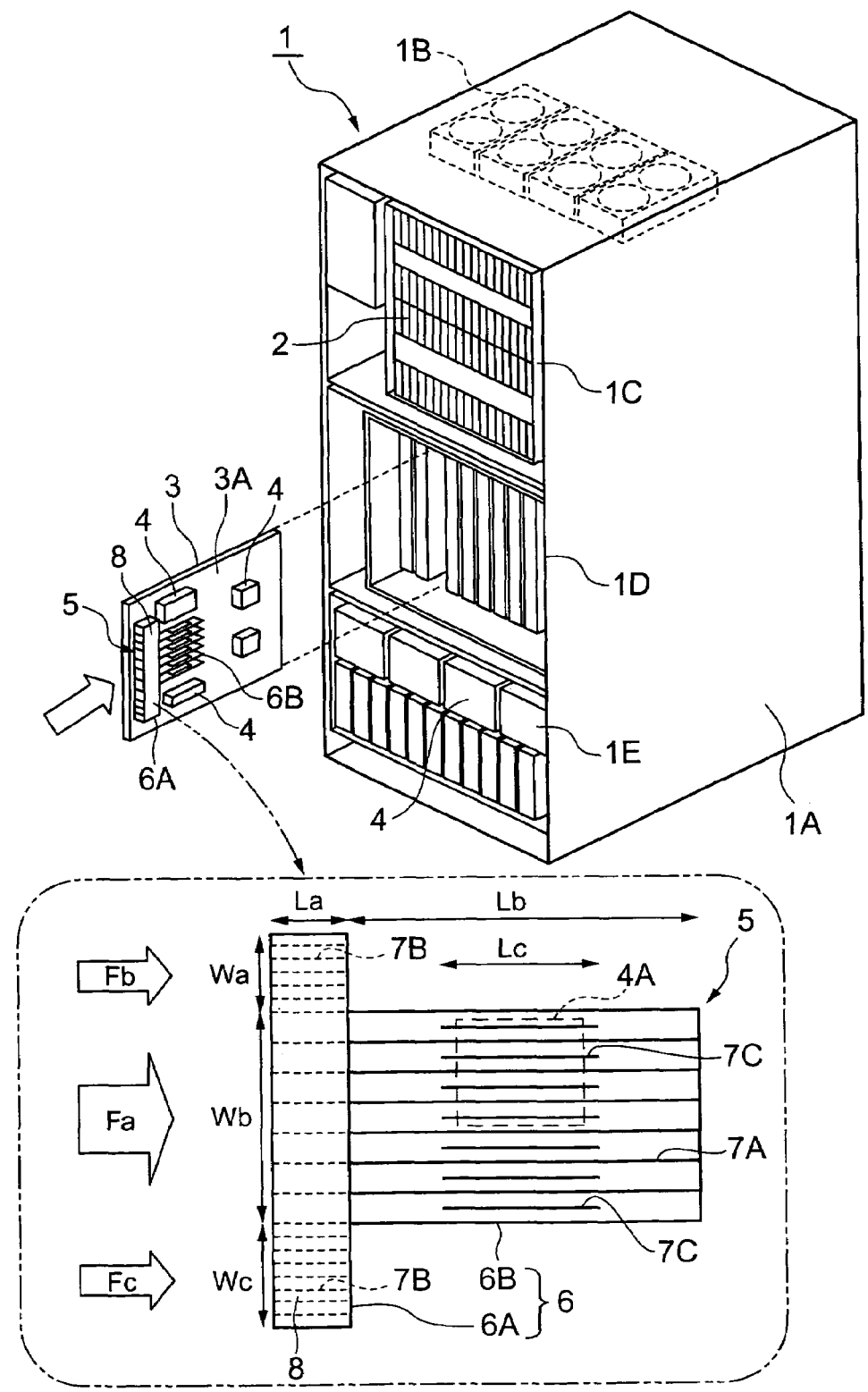
FIG. 1 is a diagram showing the overall concept of an embodiment of the present invention.

FIG. 1 is a diagram showing the overall concept of the present embodiment. A storage device system 1 is constituted for example as a disc array device. Within the casing 1A of the storage device system 1, there are provided a fan 1B, storage section 1C, control section 1D and power source section 1E. Although not shown in FIG. 1, another fan is provided between the control section 1D and the storage section 1C.

The storage section 1C comprises for example a large number of hard disc drives 2. The control section 1D comprises a plurality of logic circuit boards 3. As logic circuit boards 3, there may be mentioned by way of example a host interface control circuit board that controls data exchange with a host device such as a server and a subordinate interface control circuit board that controls data exchange with a disc drive 2 and a memory circuit board. The power source section 1E supplies prescribed power to the various power consuming sections such as the storage section 1C and control section 1D and comprises for example an AC/DC power source box 4.

Turning our attention to a prescribed logic circuit board 3, on the main circuit board unit 3A of this logic circuit board 3, there are provided a plurality of circuit components 4 and a heat sink 5. As shown in the bottom part of FIG. 1, the heat sink 5 serves to cool circuit component 4A, of the circuit components 4, that emit a large amount of heat and that require cooling. This heat sink 5 comprises a base 6 and heat-sink fins (hereinbelow abbreviated to "fins") 7A, 7B and 7C.

The base 6 is formed in substantially T shape from for example a front base section 6A and a rear base section 6B. The front base section 6A may be formed in an elongate rectangular shape having a length dimension La and width dimension (Wa+Wb+Wc). The rear base section 6B may be formed in a rectangular shape having a length dimension Lb and width dimension Wb.

As described above, directing our attention to the shape of the base 6, while the base 6 may be considered as divided into a front base section 6A and a rear base section 6B, from the point of view of the cooling function, it may be considered as divided into a main cooling section and an airflow guidance section. In this case, the main cooling section comprises the entire rear base section 6B and part of the front base section 6A (region of length dimension (La+Lb) and width dimension Wb) and also the fins 7A. The airflow guidance section comprises both ends of the front base section 6A (region of width dimension Wa, Wc) and the fins 7B. The operation will be described below, with reference to the cooling function.

Next, the construction of the fins will be described. A large number of fins 7A are arranged with prescribed pitch from the rear base section 6B to the front base section 6A. The fins 7A serve to emit heat from the circuit component 4A into the air; flow paths for flow of cooling air are formed between the fins 7A.

A plurality of fins 7B are respectively arranged with a narrower pitch than the pitch of the fins 7A on both sides of the fins 7A, positioned on the front base section 6A. The front base section 6A may be considered as divided into three regions Wa, Wb and Wc; the fins 7B are formed with narrow pitch in the regions Wa and Wc that are positioned at both ends. The fins 7A, that are formed with wider pitch, are provided in the region Wb that is positioned in the middle.

A plurality of fins 7C of narrower pitch than the pitch of the fins 7A are provided in substantially the middle of the rear base section 6B. A large number of fins 7C are provided with a narrow pitch in a region, of the rear base section 6B, (region having a length dimension Lc) corresponding to the mounting position of the circuit component 4A. Like the fins 7A, the fins 7C serve to emit heat from the circuit component 4A into the air.

The front base section 6A is provided with a top plate 8 so as to cover all of the fins 7B and some of the fins 7A. The top plate 8 prevents air that has flowed in between the fins 7A and 7B from flowing out to the outside immediately after flowing in.

As described above, the cooling function of the heat sink 5 can be considered as divided into a main cooling section and an airflow guidance section. The main cooling section chiefly comprises the rear base section 6B, the fins 7A and fins 7C and serves to cool the circuit component 4A that generate a large amount of heat. The airflow guidance section chiefly comprises the front base section 6A and fins 7B and serves to guide external air to the main cooling section. The top plate 8 has the function of suppressing outflow of air that has flowed into the main cooling section to the outside (outflow prevention function or cooling airflow maintaining function).

Next, the flow of cooling air will be described. A pressure difference between the inside and outside of the casing 1A is generated by driving the fan 1B. Due to this pressure difference, air external to the casing 1A flows onto the heat sink 5 as shown by the arrows Fa, Fb and Fc.

Since the pitch of formation of the fins 7B constituting the airflow guidance section is narrower than that of the fins 7A, the airflow resistance on the inlet side of the fins 7B is larger than that on the inlet side of the fins 7A. The amount of air flowing in between the fins 7A constituting the main cooling section is therefore greater than the amount of air flowing in between the fins 7B. In other words, in this embodiment, by setting the airflow resistance of the airflow guidance section relatively higher than that of the main cooling section, the amount of air flowing into the main cooling section is relatively increased.

The air flowing in between the fins 7A flows rearwards between the fins 7A since its outflow in the upwards direction is blocked by the top plate 8. If the top plate 8 were not present, at least some of the air flowing in between the fins 7A would escape to the outside from between the fins 7A, which offer a large resistance. Thanks to the provision of the top plate 8, escape of the air from between the fins 7A immediately after inflow is prevented, making it possible to keep the air between the fins 7A. The air that has thus been prevented from escaping is shaped to flow between the fins 7A. Thus, this cooling air abstracts the heat from the circuit component 4A whilst passing between the fins 7C and between the fins 7A and is then discharged within the casing 1A. The cooling air that is discharged within the casing 1A is discharged towards the top of the casing 1A by means of the fan 1B.

In this way, in this embodiment, by providing respective airflow guidance sections (ranges Wa, Wc) of larger airflow resistance than the main cooling section on both sides of the main cooling section (range Wb), the amount of air flowing into the main cooling section is increased. For example, the air that is positioned in the vicinity of the boundary between the fins 7B and the fins 7A tries to flow in between the fins 7A, which have a smaller resistance, so, compared the case where no airflow guidance section is provided, the amount of flowing into the main cooling section can be increased. It should be noted that the amount of cooling airflow that flows into the airflow guidance section also depends on the resistance of the air guidance section.

The direction of flow of the air that flows into the inlet of the main cooling section is aligned and its escape to the outside is prevented by the top plate 8. Although the airflow is not completely aligned, the flow direction is fairly well defined. As shown in the embodiments to be described, the top plate 8 may be provided not merely at the front base section 6A but also so as to partially or completely cover the rear base section 6B. Increasing the extent of coverage of the area of the flow path between the fins by the top plate 8 increases the degree to which outflow of air between the fins to the outside can be prevented. On the other hand, due to the provision of the top plate 8, the airflow resistance of the heat sink 5 as a whole is increased, so there is a possibility of a drop in the amount of air that is taken in from outside. The position of installation and area of the top plate 8 may therefore be set taking into account for example the required cooling performance and manufacturing costs.

The fins 7C are formed with a narrow pitch in the region corresponding to the circuit component 4A. Since the pitch of the fins 7C is narrow, the airflow resistance is increased. Consequently, part of the cooling airflow flows out to outside the heat sink 5 without flowing in between the fins 7C. However, the remaining i.e. most of the cooling airflow performs heat exchange with the fins 7C whilst passing between the fins 7C. Since the cooling airflow flowing into the heat sink 5 is shaped by the top plate 8 whilst flowing along the base section 6A, the amount of air that escapes to the outside upstream of the fins 7C can be reduced. Thus, the heat-radiating area within the range corresponding to the circuit component 4A is increased by the fins 7C that are arranged with narrow pitch. The circuit component 4A can therefore be more effectively cooled.

The present embodiments are described in more detail below. First of all, structure including the logical structure and electrical structure of the storage device system will be described, after which structure including the mechanical structure of the heat sink will be described.

1. First Embodiment

Figure 2:
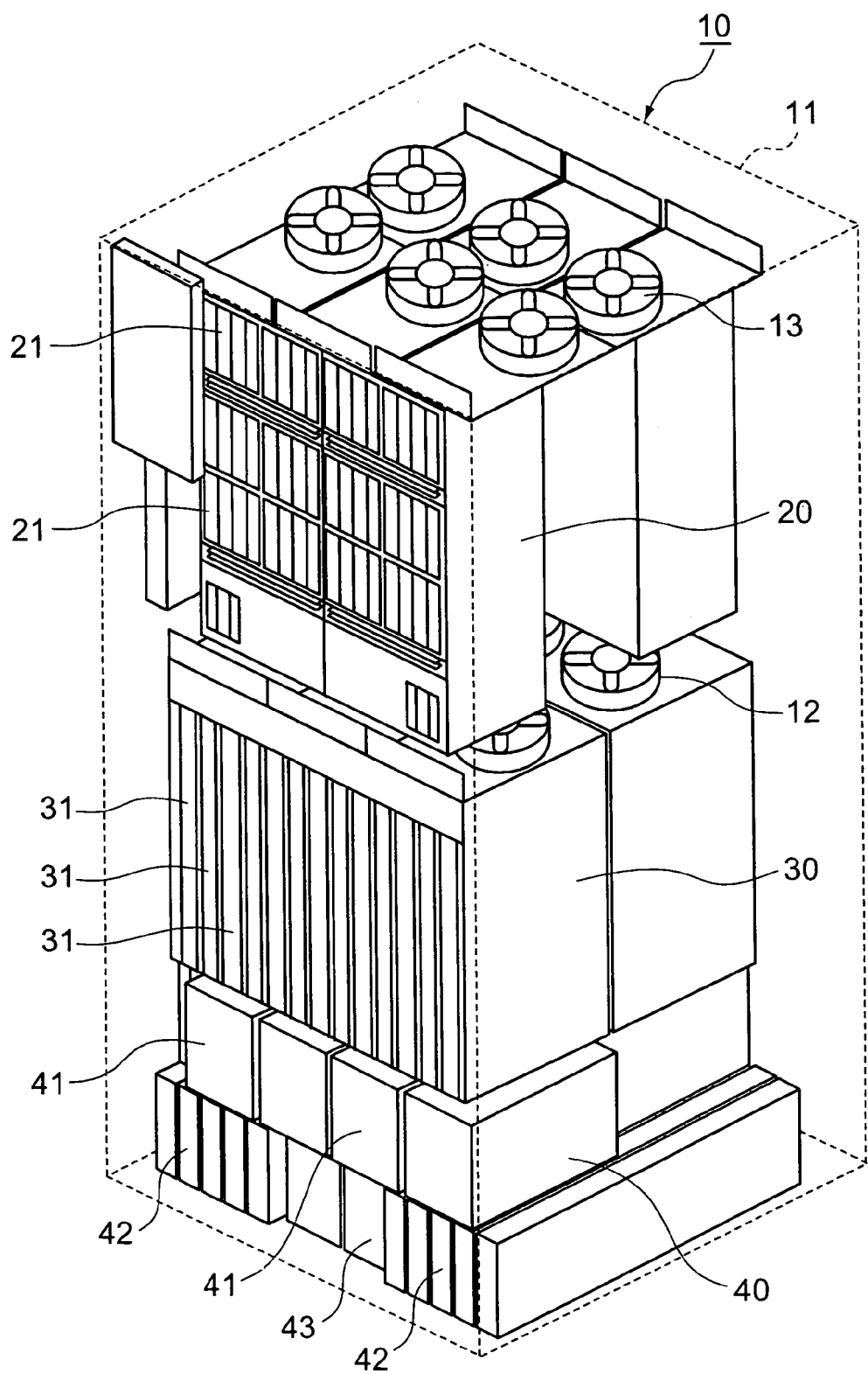
FIG. 2 is a perspective view of a disc array device.

FIG. 2 is a diagram showing the external appearance of a disc array device 10 constituting an example of a "storage device system". Within the casing 11 of the disc array device 10, there are provided fans 12 and 13, a storage section 20, control section 30 and power source section 40. The fan 12 is positioned between the control section 30 and the control section 20 and is arranged above the control section 30. The fan 13 is arranged above the control section 20. The fan 12, that is positioned substantially in the middle of the casing 11, sucks in the air within the control section 30 and discharges it into the casing 11. The air that is discharged into the casing 11 is discharged to the outside from the top of the casing 11 by means of the fan 13.

Figure 3:
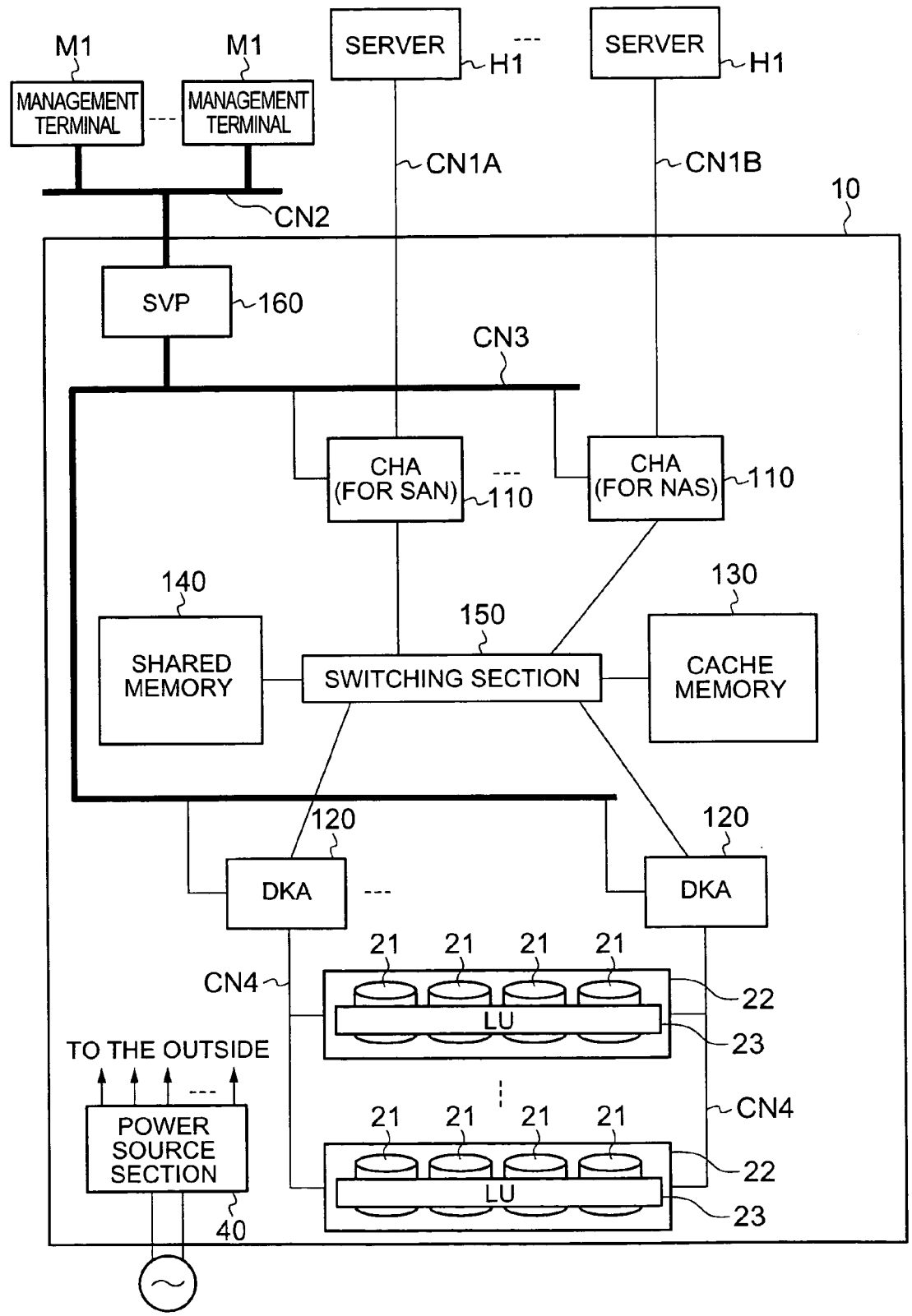
FIG. 3 is a block diagram focusing on the hardware layout of the disc array device.

FIG. 3 is a block diagram focusing on the hardware layout of the disc array device 10. The disc array device 10 can be connected so as to be capable of communication in both directions with a plurality of servers H1 through communication networks CN1A, CN1B (hereinbelow referred to as "CN1" unless they need to be particularly distinguished).

In this case, as the communication network CN1, there may be adopted for example a LAN (local area network), SAN (storage area network), the Internet or a private circuit. If a LAN is employed, data transfer between a server H1 and the disc array device 10 may be performed for example using TCP/IP. If a SAN is employed, data transfer between a server H1 and the disc array device 10 may be performed using Fibre Channel Protocol.

A server H1 is an example of a host device. As a host device, apart from a server, there may be employed for example a mainframe, personal computer, or workstation. If a mainframe is employed, data transfer may be performed using a communication protocol such as for example FICON (Fiber Connection: registered trademark), ESCON (Enterprise System Connection: registered trademark), ACONARC (Advanced Connection Architecture: registered trademark), or FIBARC (Fiber Connection Architecture: registered trademark).

Each server H1 is connected through another communication network (not shown) with a plurality of client terminals that are positioned outside the Figure. The servers H1 provide services to the client terminals by performing reading/writing of data to the disc array device 10 for example in response to requests from the client terminals.

A management terminal M1 is connected with the disc array device 10 through for example a communication network CN2 such as a LAN. The management terminal M1 is employed for acquiring and displaying on a terminal screen various types of status information of the disc array device 10 and for for example setting the configuration of the disc array device 10. A plurality of management terminals M1 may be provided.

The disc array device 10 comprises for example a plurality of channel adapters (hereinbelow abbreviated to CHA) 110, a plurality of disc adapters (hereinbelow abbreviated to DKA) 120, a cache memory 130, a shared memory 140, a switching section 150, a large number of disc drives 21 and an SVP 160, which will be respectively described later.

The disc array device 10 may be provided with a plurality, for example four or eight, of CHAs 110. The CHAs 110 may be respectively provided depending on the type (for example the type of OS or communication protocol) of the host device that is the connection target. For example, one CHA 110 may be employed for controlling the data exchange in block units utilizing the SAN while another CHA 110 may be employed for controlling data exchange in file units with the NAS server using the IP network. Specifically, the latter CHA 110 supports a protocol whereby files are shared through a network, such as for example CIFS (Common Internet File System) or NFS (Network File System) and realizes NAS functionality. A CHA 110 that realizes such NAS functionality may also be referred to as a CHN. A CHA that realizes NAS functionality will be further described later.

The CHAs 110 receive commands and data that request reading/writing data from servers H1 that are respectively connected thereto, and perform operations in accordance with the commands received from the servers H1. Continuing the description with reference also to the operation of a DKA 120, when for example a CHA 110 receives a data reading request from a server H1, it stores the read command in the shared memory 140. The DKA 120 consults the shared memory 140 from time to time and, when it discovers an unprocessed read command, reads the data from the disc drive 21 and stores it in the cache memory 130. The CHA 110 reads the data transferred to the cache memory 130 and transmits it to the server H1 that issued the command.

Also, when for example the CHA 110 receives a data write request from a server H1, it stores the write command in the shared memory 140 and stores the received data (user data) in the cache memory 130. After the CHA 110 has stored the data in the cache memory 130, it reports completion of writing to the server H1. The DKA 120 then reads the data stored in the cache memory 130 in accordance with the write command stored in the shared memory 140, and stores this in a prescribed disc drive 21.

The disc array device 10 may be provided with a plurality, for example four or eight, of DKAs 120. The DKAs 120 control data communication with the disc drives 21. The DKAs 120 and the disc drives 21 are connected for example through a communication network CN4 such as a SAN and perform data transfer in block units in accordance with the Fibre Channel Protocol.

The DKAs 120 monitor the condition of the disc drives 21 from time to time and transmit the results of this monitoring to an SVP 160 through an internal communication network CN3. The CHAs 110 and DKAs 120 respectively comprise for example printed circuit boards on which are mounted a processor and memory and a control program stored in the memory and realize the prescribed functionality by co-operative operation of their hardware and software.

The cache memory 130 stores for example user data. The cache memory 130 comprises for example memory such as volatile or non-volatile memory. The cache memory 130 may be constituted of a plurality of memories and may manage multiple user data.

The shared memory (or control memory) 140 may be constituted of for example volatile or non-volatile memory. The shared memory 140 stores for example control information. It should be noted that the information of the control information or other information can be managed in a multiple fashion by a plurality of shared memories 140. The shared memory 140 and cache memory 130 may be constituted as respectively separate memory packages or may be accommodated in a single memory package. Also, part of the memory may be employed as a cache region and another part may be employed as a control information region.

The switching section 150 serves to respectively mutually connect the CHAs 110, DKAs 120, cache memory 130 and shared memory 140. All of the CHAs 110, and DKAs 120 can thereby respectively access the cache memory 130 and shared memory 140.

The SVP (service processor) 160 collects information from the CHAs 110 and DKAs 120 through the communication network CN3. The information collected by the SVP 160 includes for example the device configuration, power source alarm, temperature alarm, and input/output speed (IOPS). The SVP 160 is connected with the management terminal M1 through the communication network CN2.

The disc array device 10 comprises a large number of disc drives 21. The disc drives 21 may be constituted as for example hard disc devices, semiconductor memory devices, optical disc devices, or magneto-optic disc devices. In addition, a prescribed number of disc drives 21, such as for example four disc drives, may constitute a single RAID group 22. At least one or more logical volumes (logical units) constituting a logical storage region may be set up on a physical storage region provided by this RAID group 22.

The power source section 40 shown in FIG. 3 supplies prescribed power respectively to the packages 110, 120, 130, 140 and to the fans 12 and 13, for example.

Figure 4:
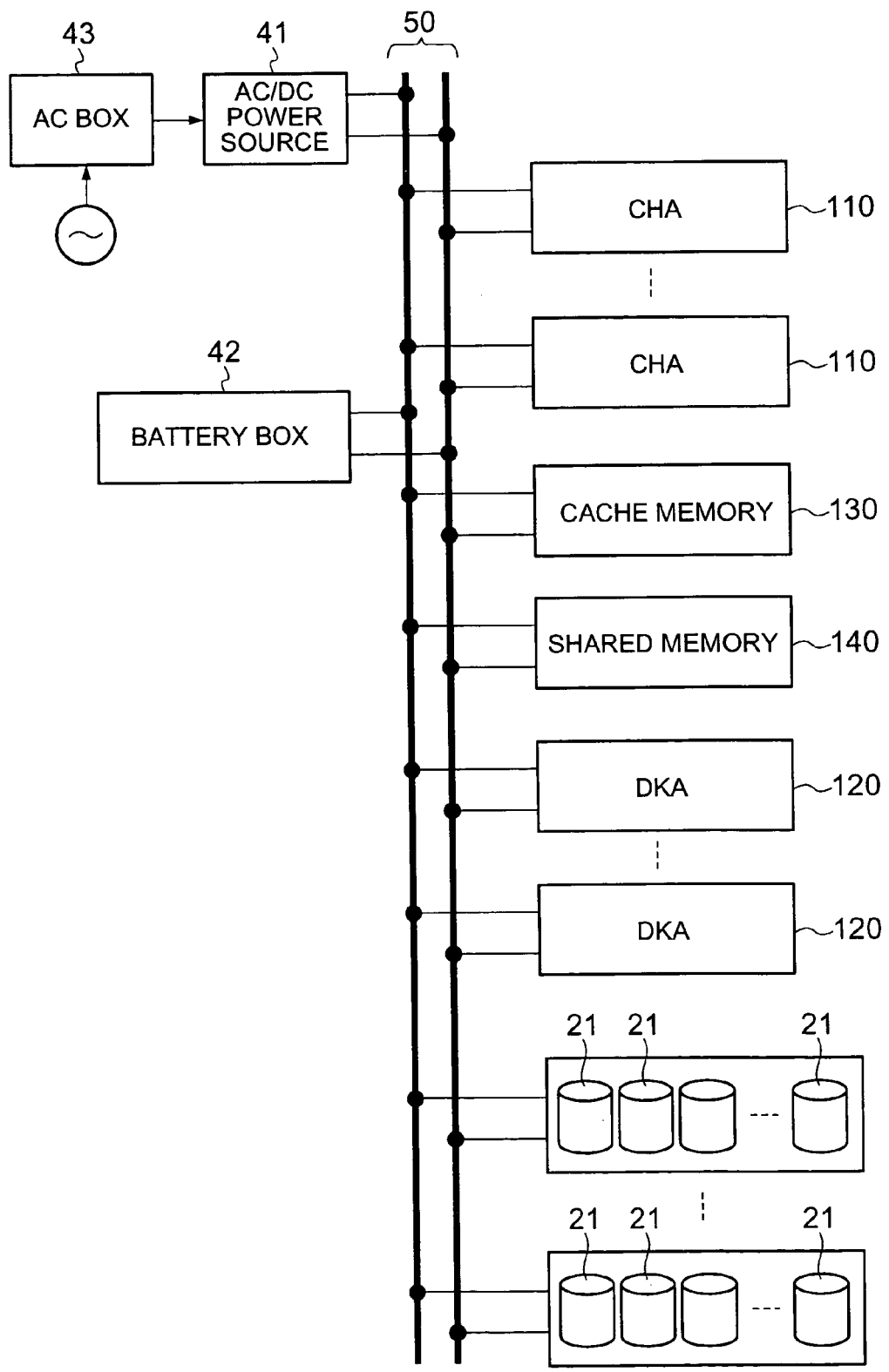
FIG. 4 is a circuit diagram showing schematically the power supply system of a disc array device.

FIG. 4 is a block diagram showing schematically the power system of the disc array device 10. To the power source common bus 50 there are respectively connected AC/DC power sources 41, battery boxes 42, CHAs 110, DKAs 120, the cache memory 130, the shared memory 140, and the various disc drives 21. Although there are respectively provided a plurality of AC/DC power sources 41 and battery boxes 42 and other components, only a single one of these is respectively shown in the Figure. Also, a plurality of power source common buses 50 may be provided, but for convenience in description only a single one is shown.

The AC/DC power sources 41 are connected with an external AC power source through an AC box 43. The AC box 43 comprises a breaker function. The AC voltage that is input to the AC/DC power sources 41 is converted to DC voltage of for example 12 V or 56 V before being supplied to the power source common bus 50. The battery boxes 42 may be constituted as for example lead batteries. The battery boxes 42 supply emergency power if the voltage of the power source common buses 50 drops below a prescribed value due for example to a power cut. Using this emergency power, the disc array device 10 for example backs up the data that is held only in the cache memory 130 to the disc drives 21 (destage control) or supplies a small amount of power exclusively to the cache memory 130 and shared memory 140 over a long period (memory back-up control).

Figure 5A:
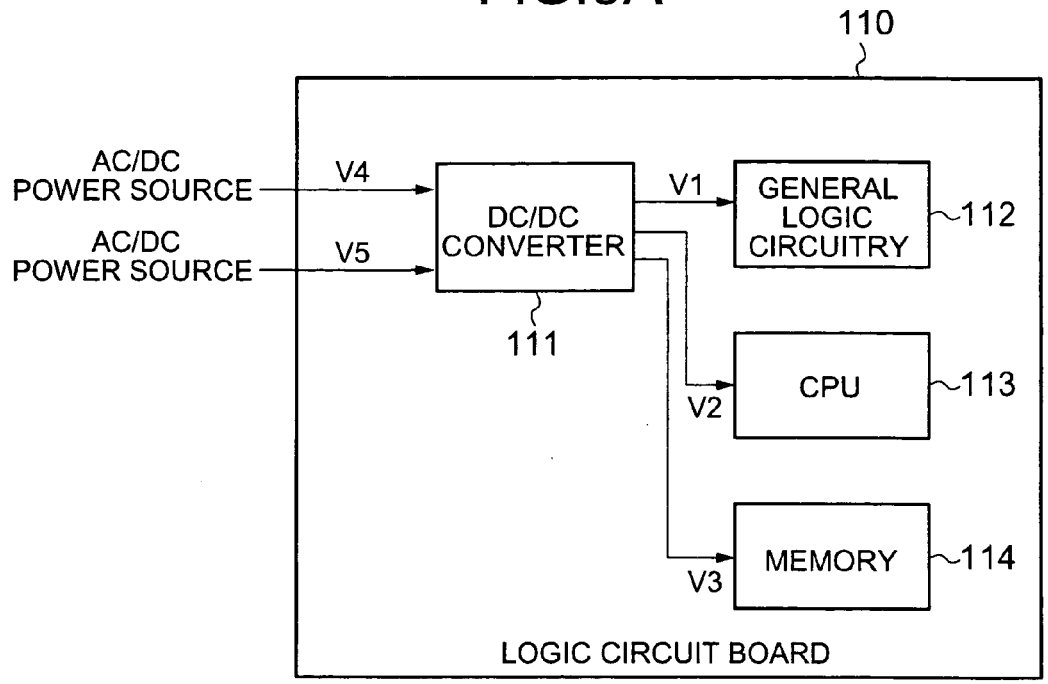
FIG. 5 is a circuit diagram showing schematically the power supply system of a logic circuit board.

FIG. 5 is a diagram showing schematically the power supply system in the logic circuit boards (CHAs 110 and/or DKAs 120). Although hereinbelow a CHA 110 will be described by way of example, the same applies to a DKA 120. As shown in FIG. 5(a), the electrical circuit of a CHA 110 can be roughly divided into for example a DC/DC converter 111, general logic circuitry 112, a CPU 113 and memory 114.

For example, the general logic circuitry 112 is operated by a voltage V1, the CPU 113 is operated by a voltage V2 and the memory 114 is operated by a voltage V3. Respective voltages V4, V5 are supplied from respectively different AC/DC power sources to the DC/DC converter 111.

The DC/DC converter 111 respectively generates voltages V1, V2 and V3 from the voltages V4, V5 that are input from the AC/DC power sources and supplies these voltages V1, V2 and V3 to the sections 112, 113 and 114. Specifically, the DC/DC converter 111 is a multi-output converter that outputs a plurality of voltages.

Figure 5B:
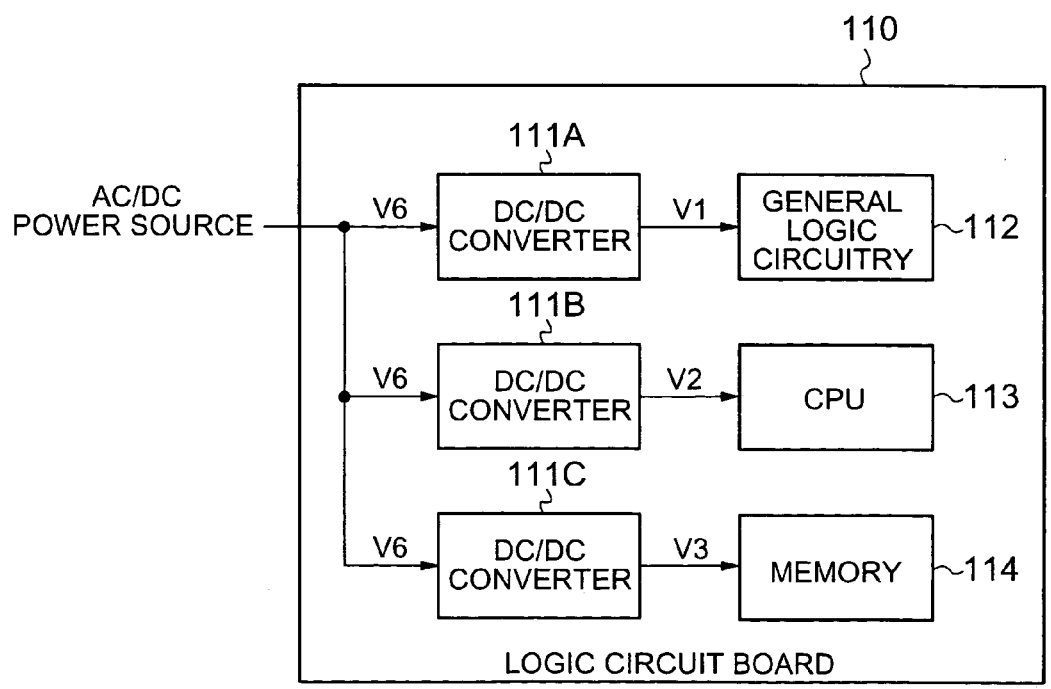

As shown in FIG. 5(b), a plurality of DC/DC converters 111A, 111B, and 111C may be employed. The DC/DC converter 11A converts the voltage V6 that is input from an AC/DC power source to the voltage V1 and supplies the voltage V1 to the general logic circuitry 112. Likewise, the DC/DC converter 111B converts the voltage V6 from the AC/DC power source to the voltage V2 and supplies the voltage V2 to the CPU 113. Likewise, the DC/DC converter 111C converts the voltage V6 from the AC/DC power source to the voltage V3 and supplies the voltage V3 to the memory 114.

Thus, respective DC/DC converters are provided at each CHA 110 and supply prescribed power to the sections 112, 113 and 114. As shown in FIG. 5(a), a plurality of voltages may be arranged to be output from a single DC/DC converter 111 or, as shown in FIG. 5(b), respectively different voltages may be arranged to be output from a plurality of DC/DC converters 111A to 111C. Also, a construction other than that shown in FIG. 5 may be adopted. The power supply structure within the CHA in this embodiment will be described later with reference to FIG. 6.

Figure 6:
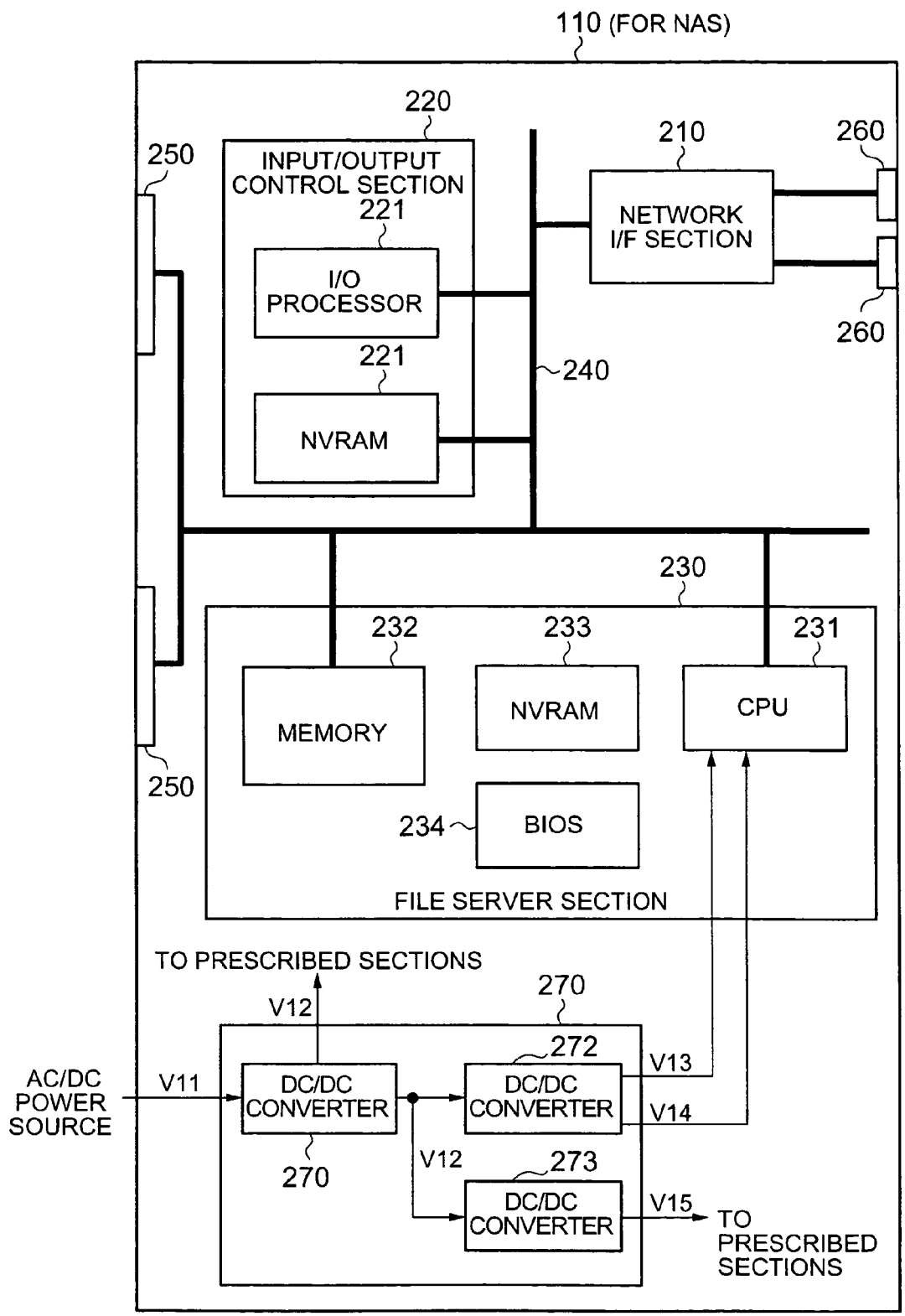
FIG. 6 is a circuit diagram of a CHA (NAS board) that provides NAS functionality.

FIG. 6 is a circuit diagram showing an example of the circuit layout of a CHA 110 implementing NAS functionality. The CHA 110 that implements NAS functionality receives a file access request from a server H1 and supplies a service as NAS to the server H1.

This CHA 110 may comprise for example a network interface section 210 (hereinbelow "interface" is abbreviated as "I/F"), an input/output control section 220, a file server section 230, a bus 240, a board connection connector 250, a communication connector 260 and a power source circuit 270.

The various sections 210 to 270 of the CHA 110 for NAS may be combined as a single unit. Such a unitary CHA 110 for NAS may be referred to in the following description as a NAS board. A NAS board comprises at least one or more circuit boards.

The network I/F section 210 performs data communication with a server H1. The network I/F section 210 is connected with a communication connector 260. The network I/F section 210 is connected from this communication connector 260 with the server H1 through for example a LAN cable or switch (neither of these are shown). The network I/F section 210 then performs data communication at file level using a protocol such as for example TCP/IP or UDP/IP (User Datagram Protocol/Internet Protocol).

The input/output control section 220 performs communication with the DKAs 120, cache memory 130, shared memory 140 and SVP 160. The input/output control section 220 may comprise for example an I/O (Input/Output) processor 221 and NVRAM (non-volatile RAM) 222. The I/O processor 221 comprises for example a single chip microcomputer. The I/O processor 221 controls for example write requests and read requests for data in respect of a logical volume 23 and relays communications between the CPU 231, to be described, and a DKA 120. The NVRAM 222 stores for example the program code that is executed by the I/O processor 221. The storage content of the NVRAM 222 can be rewritten through the SVP 160.

The file server section 230 comprises for example a CPU 231, memory 232, NVRAM 233, and BIOS (Basic Input/Output System) 234. The CPU 231 performs control to make the CHA 110 function as a NAS board. For example, the CPU 231 controls a protocol such as a file sharing protocol such as NFS or a CIFS, or TCP/IP. Also, the CPU 231 analyses a request to access a file designated from a server H1 and converts the designated file to a logical block address.

The memory 232 comprises for example a DIMM (Dual In-line Memory Module) and stores for example a lock table for exclusive control of file access or a metatable relating to files managed by the file system. The metatable may comprise information such as for example block address or data size, file size or file owner on a logical volume 23.

The BIOS 234 is software that is initially loaded into the memory 232 of the NAS board on start-up and executed and is stored for example in non-volatile memory such as flash memory that is mounted on the NAS board. The CPU 231 executes initialization processing and/or self-diagnosis etc by executing various programs that are loaded in the memory 232 by the BIOS 234. Also, the BIOS 234 loads for example the boot section of the OS that is stored on a prescribed disc drive 21 into memory 232 by issuing prescribed instructions to the I/O processor 221. The boot section that is read into memory 232 reads the main OS from the disc drive 21 and causes it to be read into the memory 232. In this way, the OS is started up on the CPU 231 and made to execute functions as a file server. It should be noted that it is also possible for the file server 230 to execute network booting using a network boot standard such as for example PXE (Preboot execution Environment).

The bus 240 mutually connects the network I/F section 210, Input/Output control section 220, file server 230 and the various board connection connectors 250. It should be noted that it could be arranged for the various prescribed sections to be connected using an internal LAN, for example, instead of the bus 240.

The board connection connector 250 serves to connect the NAS board (CHA 110 used as a NAS) with the switching section 150.

The power source circuit 270 may comprise for example at least one or more DC/DC converter. In the example illustrated in the drawings, the power source circuit 270 comprises three DC/DC converters 271, 272, and 273.

The DC/DC converter 271 that is positioned on the input side converts the voltage V11 that is input from an AC/DC power source (for example DC 56 V) to a voltage V12 (for example DC 12 V) and outputs this. The voltage V12 that is output from this DC/DC converter 271 is respectively input to the next-stage DC/DC converters 272, 273 and, in addition, is supplied to the input/output control section 220.

The next-stage DC/DC converter 272 is a converter dedicated to the CPU 231 and converts the input voltage V12 to two voltages V13 and V14, which it then respectively supplies to the CPU 231. In this case, the voltage V13 may be set to for example about DC 1 to 1.5 V and the voltage V14 may be set to for example about DC 3.3 V. The CPU 231 is constructed such that its operating voltage and drive frequency can be adjusted in accordance with the required processing performance; a plurality of voltages V13, V14 are required for this purpose.

The other DC/DC converter 273 converts the voltage V12 that is input from the DC/DC converter 271 to for example a voltage V15 of about DC 3.3 V and supplies this to the network I/F section 210 and input/output control section 220.

The values of the voltages V11 to V15 are merely examples and other values could be set. Essentially, a plurality of types of circuit components of respectively different operating voltages are mounted on the NAS board of this embodiment and the voltages that are required by these circuit components are supplied by the plurality of DC/DC converters 271 to 273.

Figure 7:
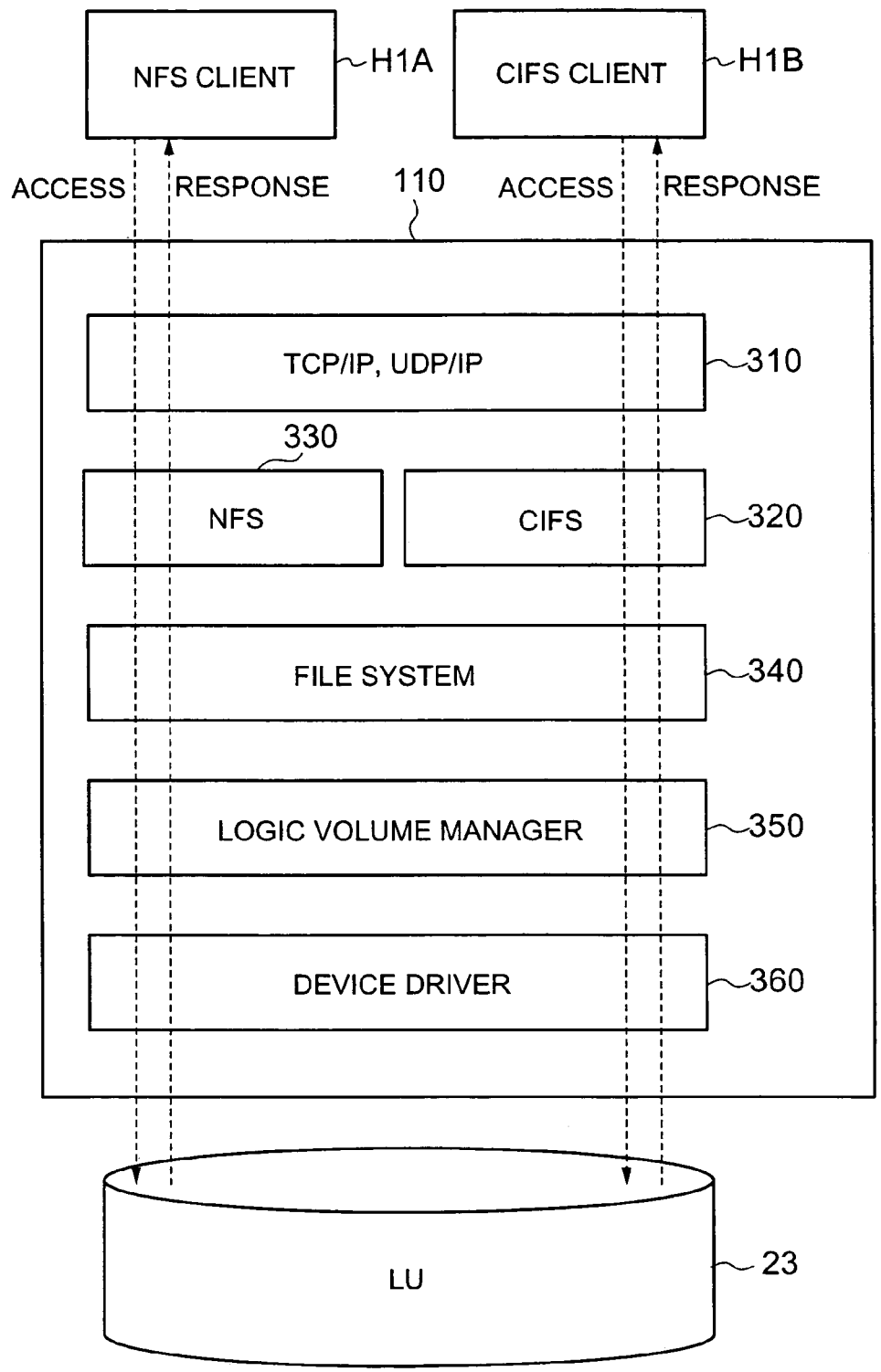
FIG. 7 is a diagram showing schematically the software construction of a NAS board.

FIG. 7 is a block diagram showing schematically the software construction of a CHA 110 for use as a NAS (NAS board). The NAS board may comprise for example a network protocol layer 310, file access protocol layers 320, 330, a file system 340, a logical volume manager (hereinbelow abbreviated to "LVM") 350, a device driver group 360, and a plurality of LUs 23 (only one shown).

The network protocol layer 310 supports protocols such as for example TCP/IP or UDP/IP and performs exchange of data using these protocols. The file access protocol layers 320, 330 support a file sharing protocol for for example file access. For example one file axis protocol 320 may be NFS while the other file access protocol 330 may be CIFS. In this case, for example the client H1A operating on a server H1 may be an NFS client while the client H1B operating on another server H1 may be a CIFS client.

The file system 340 is a program that controls for example input/output of files to each LU 23. The file system 340 receives from clients H1A, H1B commands specifying a directory name and filename. Using the received command, the file system 340 converts files requested from the clients H1A, H1B to volume position information and requests data access to the LVM 350.

The LVM 350 is a program that provides management functions of the LUs 23. The LVM 350 for example bundles a plurality of LUs 23 and divides these into volumes of capacity that can easily be employed by a user. Also, the LVM 350 may comprise a snapshot function. A snapshot is a static image of data at a given time-point. When the LVM 350 receives an access request from a file system 340, it converts this into a block address on an LU 23 and this block address is then handed over to the device driver group 360.

The device driver group 360 provides data in the form of a special file for causing the host LVM 350 to access the LU 23 that is the storage access unit. The device driver group 360 reads the file data by accessing the LU 23 using the block address received from the LVM 350. The file data that is thus read is transmitted to the clients H1A, H1B.

Figure 8:
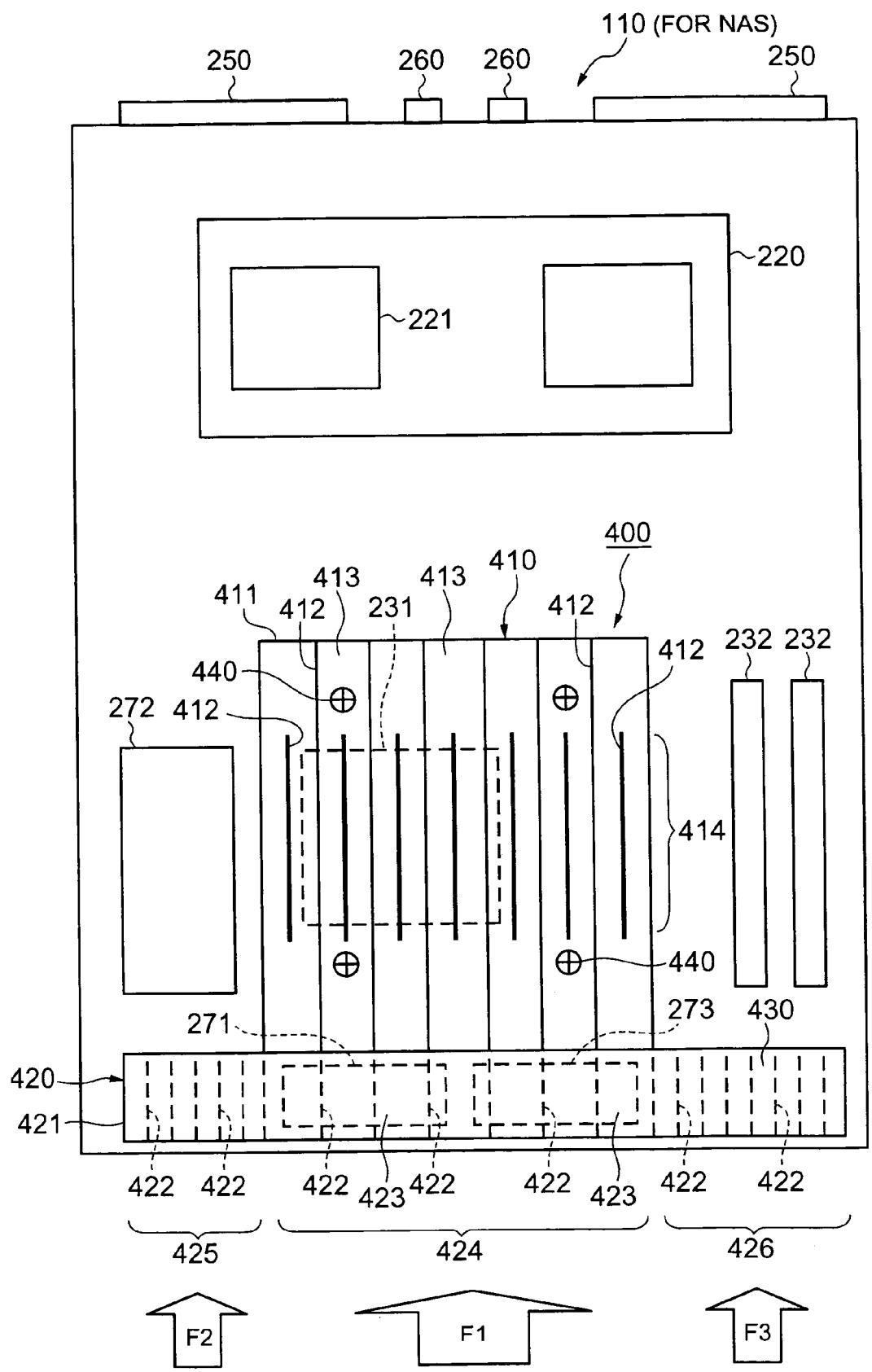
FIG. 8 is a plan view of a NAS board.

Next, the cooling structure of the NAS board 110 will be described with reference to FIG. 8. FIG. 8 is a schematic plan view of a NAS board 110. On the NAS board 110, for example the various circuit components described with reference to FIG. 6 are mounted. Only the main circuit components are shown in FIG. 8.

In the front part of the NAS board 110, there are arranged for example the CPU 231, memory 232, DC/DC converters 271 to 273, and in the rear part of the NAS board 110 there is arranged for example the input/output control section 220.

Also, at the rear end of the NAS board 110, there are respectively provided connectors 250, 260.

A heat sink 400 is mounted on the upper surface of the CPU 231. As described above, the CPU 231 executes various types of control for implementing the NAS function and its processing load is therefore large. Consequently, the amount of heat generated by the CPU 231 is larger than for example the amount of heat generated by a CPU such as is employed in a so-called blade server.

A blade server is constituted by mounting a plurality of server blades (control circuit boards that realize server functionality) within an enclosure having a height dimension of for example 3 U or 4 U (1 U is 44.45 mm). A large number of server blades can be accommodated as an entire rack unit by mounting a plurality of enclosures in a rack of for example 19 inch width. In this way, in the case of a blade server, the server function is centralized by accommodating a large number of server blades in a restricted space. Thus, in a blade server, rather than the performance of the individual server blades, the number of installed server blades is regarded as important. In contrast, in the case of a disc array device 10 incorporating NAS boards 110, although the number of NAS boards 110 that are incorporated is regarded as important, the performance of the individual NAS boards 110 is also regarded as important. For this reason, high-performance CPUs 231 are mounted on the NAS boards 110 and are driven with a comparatively high frequency. The amount of heat generated by the CPUs 231 therefore tends to become particularly large. Accordingly, in this embodiment, in order to cool the CPUs 231 which are bodies that generate a considerable quantity of heat, a heat sink 400 having a characteristic structure is adopted.

As shown in FIG. 8, when the heat sink 400 is viewed looking down from above, a DC/DC converter 272 dedicated for use by the CPU 231 is arranged on the left-hand side of the heat sink 400 and a memory 232 is arranged on the right-hand side of the heat sink 400. Also, the other DC/DC converters 271, 273 are respectively arranged below the heat sink 400, positioned in front of the CPU 231. It should be noted that, as is clear from the embodiments to be described below, the circuit arrangement shown in FIG. 8 is merely an example and other circuit arrangements could be adopted.

The heat sink 400 may for example be formed in a T shape from a rear cooling section 410 and front cooling section 420 and the aperture surface of the cooling section 420 may be covered by a top plate 430. The heat sink 400 may be mounted on the NAS board 110 with the aid of for example a plurality of screws 440.

The heat sink 400 may be formed of for example a metallic material of comparatively high thermal conductivity, such as aluminum, stainless steel, copper or an alloy of these. Also, another material may be adopted for the base material of the heat sink 400 such as for example ceramics or engineering plastics, so long as this material provides the prescribed thermal conductivity and ability to withstand heat. There is no particular restriction as to material in this embodiment.

The entire heat sink 400 may be constructed of the same material or a plurality of types of material may be employed in its construction. For example, the material constituting the base sections 411, 421, the material constituting the fins 412, 422 and the material constituting the top plate 430 may be respectively different. Also, the material constituting the front cooling section 420 and the top plate 430 and the material constituting the rear cooling section 410 may be respectively different. Alternatively, the material constituting the rear airflow guidance sections 425, 426 and the material constituting the main cooling section may be respectively different. At least the rear cooling section 410, whereby the heat from the CPU 231 may be readily conducted, is preferably constituted of material of high thermal conductivity such as a metallic material. Also, if the heat dispersion effect from the cooling section 420 and top plate 430 is set at a low level, the cooling section 420 and top plate 430 may be constructed of synthetic resin or ceramics, for example.

The rear cooling section 410 functions as the main cooling section for cooling the CPU 231. The rear cooling section 410 may comprise for example a rear base section 411 of substantially flat plate shape, a large number of fins 412 formed with a prescribed pitch p1 on one face of the rear base section 411, and flow paths 413 respectively formed between the fins 412.

Also, a main heat-radiating section 414 wherein fins 412 are formed with a pitch p2 narrower than the pitch p1 is formed in substantially the middle of the rear cooling section 410. Specifically, of the entire region of the rear base section 411, in the region corresponding to the position of mounting of the CPU 231, the pitch of the fins 412 is set to be narrower thereby increasing the total heat-radiating area of the main heat-radiating section 414. It should be noted that, since the heat of the CPU 231 is conducted also to the fins 412 that are formed with a comparatively wide pitch p1, the fins 412 that are formed with this comparatively wide pitch p1 also contribute to the cooling of the CPU 231.

The front cooling section 420 functions as an airflow guidance section for supplying a greater amount of cooling airflow to the rear cooling section 410. The front cooling section 420 may comprise for example a front base section 421, a large number of fins 422 formed with a pitch p1 on one face of the front base section 421 and flow paths 423 respectively formed between the fins 422. The base sections 411, 421 may be integrally formed and the fins 422 that are connected with the fins 412 may be integrally formed with the fins 412.

The DC/DC converters 271, 273 are respectively arranged separated in the width direction of the heat sink 400 (left/right direction in FIG. 8), on the underside of the front base section 421.

The front cooling section 420 may be divided into two functional portions. The first functional portion is a main air inlet section 424 that is positioned in the middle. The second functional portion is airflow guidance sections 425, 426 that are respectively positioned on the left and right sides of the main air inlet section 424.

The main air inlet section 424 comprises a middle portion of the base section 421 and a plurality of fins 422 that are formed with the wide pitch p1 in the middle portion thereof. The main air inlet section 424 takes in external atmosphere F1 and supplies this to the rear cooling section 410 at the rear.

The airflow guidance sections 425, 426 may comprise left and right portions of the front base section 421 and a plurality of fins 422 that are formed with the narrow pitch p2 in the portions to the left and right of these. The airflow guidance sections 425, 426 are set to have a narrower pin pitch, so the airflow resistance thereof is higher than that of the main air inlet section 424. The amount of external atmosphere F2, F3 respectively flowing into the airflow guidance sections 425, 426 is therefore correspondingly smaller than the amount of external atmosphere F1 flowing into the main air inlet section 424.

In other words, since airflow guidance sections 425, 426 of relatively higher airflow resistance are provided in the vicinity of the main air inlet section 424, air located in the vicinity of the airflow guidance sections 425, 426 tries to flow into the main air inlet section 424, where the airflow resistance is less. As a result, the amount of air flowing into the main air inlet section 424 is increased. In this way, the airflow guidance sections 425, 426 passively (or statically) guide the air towards the main air inlet section 424.

The front cooling section 420 is formed over substantially the entire length in the width direction of the NAS board 110 so as to block the path of ingress of air to the NAS board 110 (direction of advance of the external atmosphere F1 to F3). Specifically, the airflow guidance sections 425, 426 are formed so as to extend more widely to the left and right of the main cooling section, which may be constituted of the rear cooling section 410 and other sections. Consequently, the airflow guidance sections 425, 426 may respectively be formed of comparatively large size, thereby making it possible to increase the heat-radiating area of the airflow guidance sections 425, 426.

Respectively less air flows into the airflow guidance sections 425, 426 than into the main cooling section. This air removes heat from the fins 422 of the airflow guidance sections 425, 426 before flowing out at the rear. The air that has flowed out from the airflow guidance section 425 passes through and removes heat from the DC/DC converter 272 until it reaches the input/output control section 220, and cools the input/output control section 220 before flowing into the casing 11. Likewise, the air flowing out from the other airflow guidance section 426 cools the memory 232 and input/output control section 220 before flowing into the casing 11. The heat from the CPU 231 is conducted to the airflow guidance sections 425, 426, so the CPU 231 is also cooled by the cooling air currents that respectively pass through the airflow guidance sections 425, 426.

The relatively large quantity of air that is taken into the main air inlet section 424 flows respectively through the flow paths 423 of the rear cooling section 410 from the front cooling section 420 and removes heat from the CPU 231 while passing through the flow paths 423, before flowing out at the rear. The air flowing out at the rear of the heat sink 400 cools the input/output control section 220 before flowing into the casing 11.

The air that cools the various sections of the NAS board 110 before flowing into the casing 11 is fed in the upwards direction of the casing 11 by means of a cooling fan 12 provided in the vicinity of a control section 30. This air is then discharged to the outside from the upper face of the casing 11 by means of a cooling fan 13 that is provided at the top of the casing 11.

Figure 9:
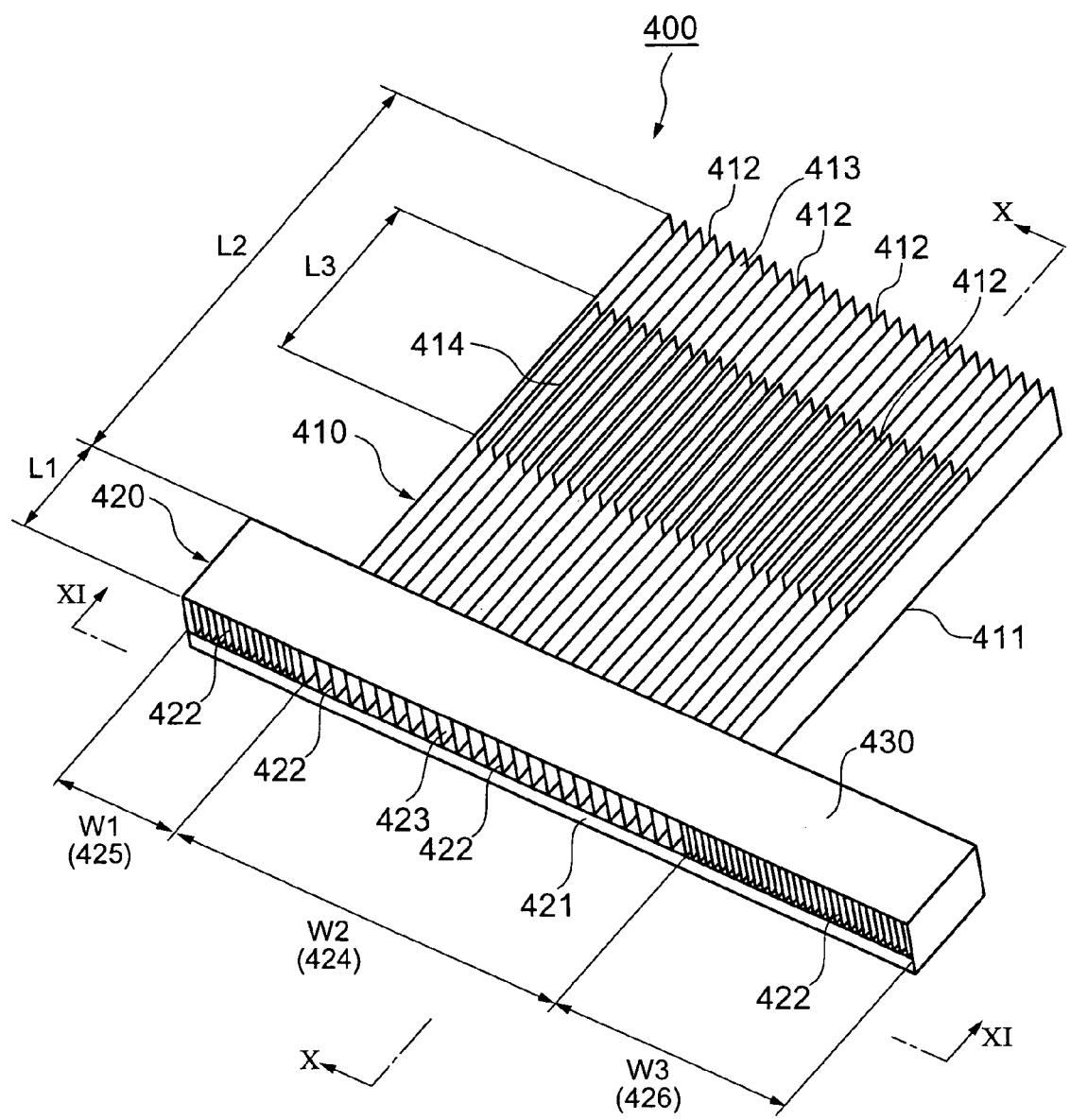
FIG. 9 is a perspective view of a heat sink.

FIG. 9 is a perspective view of the heat sink 400. As described above, the heat sink 400 is formed in T shape of for example a rear cooling section 410 having a length dimension (depth direction) L2 and width dimension W2 and a front cooling section 420 having a length dimension L1 and width dimension (W1+W2+W3). The aperture face of the cooling section 420 (at the top in FIG. 9) is covered by a top plate 430.

Also., in the middle of the rear cooling section 410, there is provided a main heat-radiating section 414 of narrow fin pitch, corresponding to the mounting position of the CPU 231. This main heat-radiating section 414 may be formed in a region of length dimension L3 and width dimension W2. Of course, it is not the case that the heat of the CPU 231 is dispersed into the air solely from the main heat-radiating section 414. The heat of the CPU 231 is chiefly released into the air from the main heat-radiating section 414 and the fins 412. In addition to this, the heat of the CPU 231 is also conducted to the front cooling section 420, so it is released into the air through the fins 422 of the front cooling section 420 and the top plate 430.

A main air inlet section 424 having a length dimension L1 and width dimension W2 is formed in the front cooling section 420, and airflow guidance sections 425, 426 are formed on the left and right of the main air inlet section 424. The width dimensions of the airflow guidance sections 425, 426 can be respectively differently set, taking into account for example the position of installation and size of the other circuit components. It should be noted that, as is clear from the embodiments to be described, it is not necessary to provide the airflow guidance sections 425, 426 at the front of the main cooling section 410 and, if required, they could be provided at another location.

Figure 10:
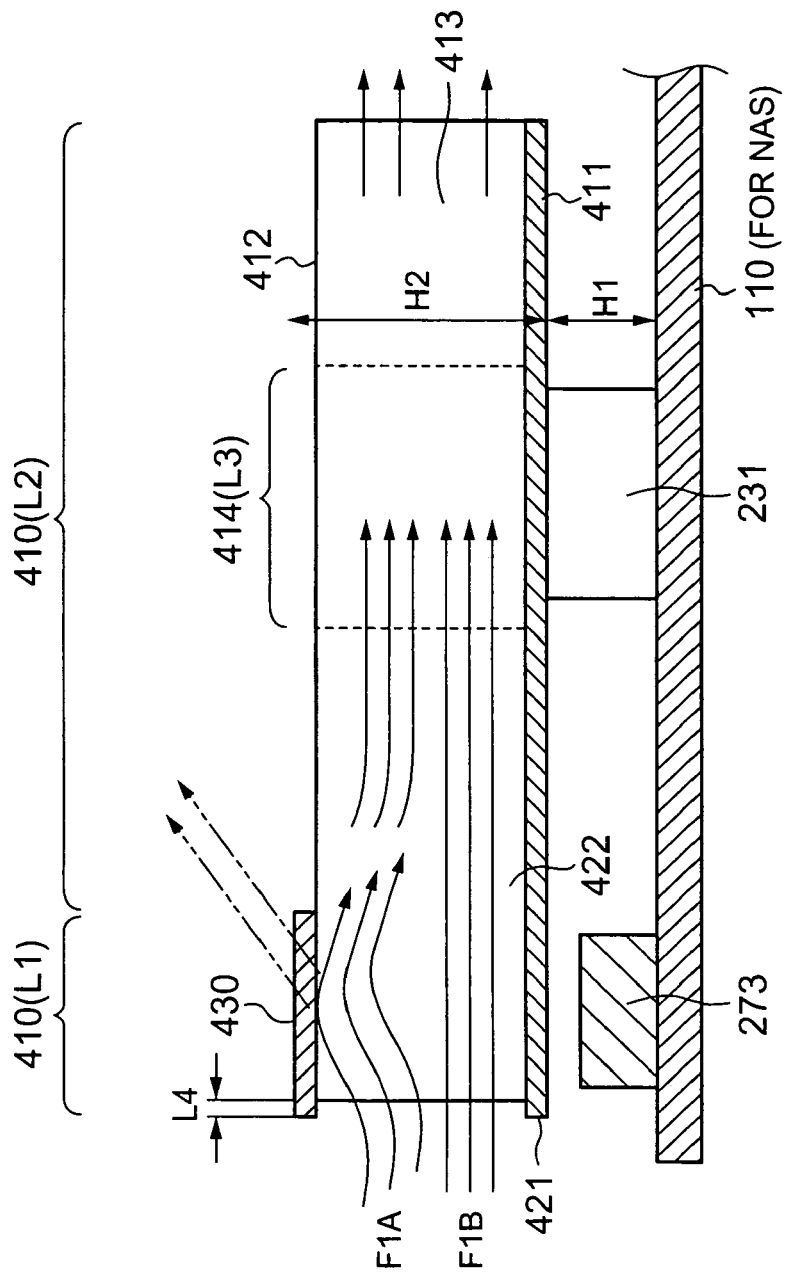
FIG. 10 is a cross-sectional view of a heat sink.

FIG. 10 is a cross-sectional view of the heat sink 400 seen from the X-X direction indicated by the arrows in FIG. 9. The role of the top plate 430 and other associated members will be described using FIG. 10. The top plate 430 can be arranged for example so as to project to the outside by the amount of a dimension L4 beyond the fins 422. In other words, the fins 422 of the front cooling section 420 can be provided so as to be positioned deeper by a dimension L4 than the top plate 430 and the front base section 421. However, there is no restriction to this, and it would be possible for example for the front edge of the top plate 430, the front edge of the front base section 421, and the front edge of the fins 422 (the "front" direction as referred to here is the left/right direction in FIG. 10) to be formed in aligned fashion. Also, the front edge of the fins 422 could be constituted so as to project further forward than the top plate 430 and the front base section 421.

To give a description of the flow of the air currents in general terms, it may be considered that some of the air F1A of the air that flows into the front cooling section 420 flows through the flow paths 423 being prevented from departing from the flow paths 423 by the top plate 430. The remainder of the air F1B may be considered to pass directly straight through the flow paths 423. If the top plate 430 were not present, the portion of the air F1A would flow out towards the outside where there is little resistance, as shown by the double-dotted chain line arrow in FIG. 10.

However, in this embodiment, escape of air immediately after inflow is prevented by means of the top plate 430, so a drop in the amount of airflow can be prevented. The air F1A that is returned into the flow paths by the top plate 430 is shaped while passing through the flow paths 423 and flow paths 413, removes heat while passing through the main heat-radiating section 414 and flows out at the rear.

After passing the undersurface of the top plate 430, the portion F1A of the air might escape to the outside (upwards in FIG. 10) from the flow paths 423, 413. However, due to the flow shaping effect of the flow paths 423, 413, it is believed that the amount that escapes is small. Also, the heat from the CPU 231 is conducted to the front cooling section 420 and top plate 430, so the heat of the CPU 231 can be removed within the front cooling section 420.

As shown in the embodiments described later, the top plate 430 may also be provided so as to cover the whole or more than half of the heat sink 400. In this case, the air flowing into the heat sink 400 can be prevented from escaping to the outside before abstracting heat. However, since the resistance within the heat sink 400 is increased, it may be expected that the amount of air inflow will drop as the area of the top plate 430 is made larger.

As shown in FIG. 10, in this embodiment, the height dimension of the CPU 231 is taken as H1 and the height dimension of the heat sink 400 (i.e. its thickness) is taken as H2. Attention is paid in the following embodiments to the height (H1+H2) from the NAS board 110 to the upper surface of the heat sink 400.

Figure 11:
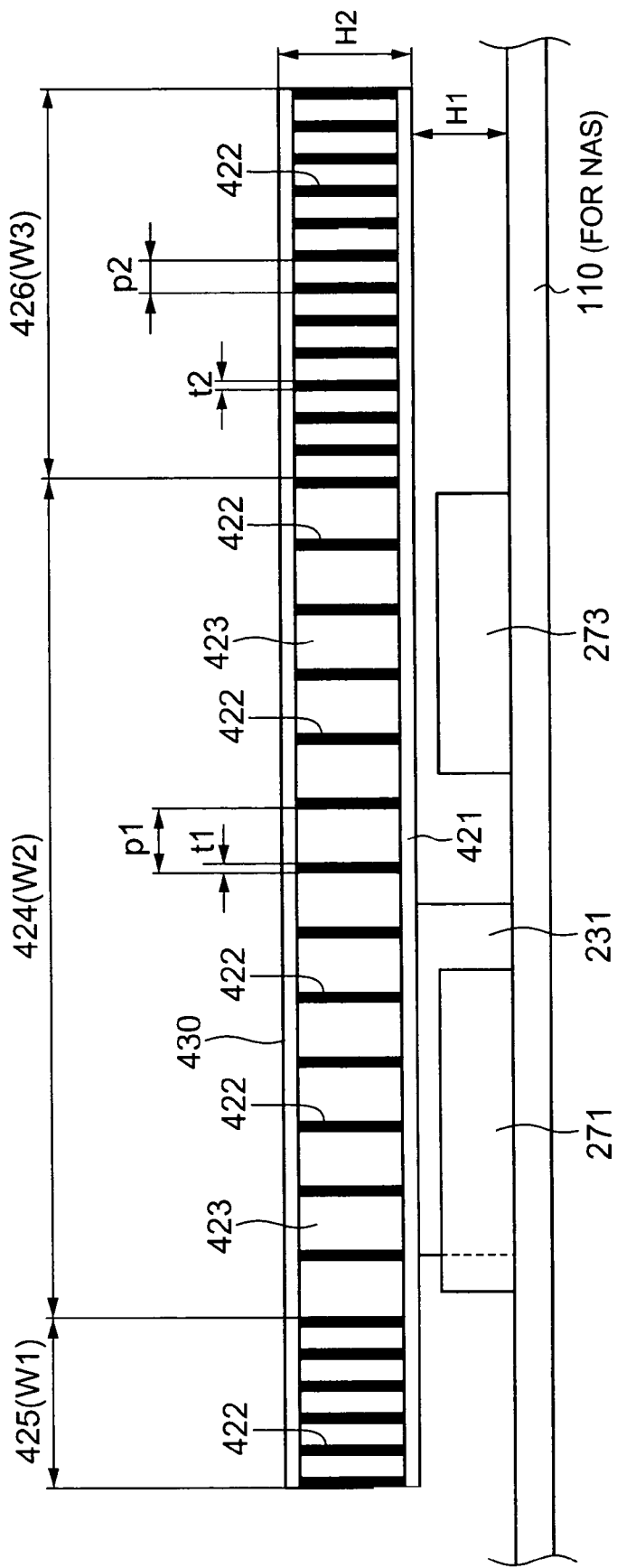
FIG. 11 is a front view of a heat sink.

FIG. 11 is a front view of the heat sink 400. As already stated, two different pitches are employed for the heat sink 400. The first pitch p1 is employed for the main cooling section. The second pitch p2 is employed for the airflow guidance sections 425, 426 and the main heat-radiating section 414. By setting the fin pitch of the main air inlet section 424 that is connected with the main cooling section as p1 and setting the fin pitch of the airflow guidance sections 425, 426 as p2, the airflow resistance of the main air inlet section 424 can be made relatively smaller, thereby making it possible to relatively increase the amount of air inflow. Also, by employing a narrow pitch p2 at the main heat-radiating section 414, the heat-radiating area can be made larger by increasing the number of fins.

Thanks to the construction of this embodiment as described above, the following effects are obtained. In this embodiment, by providing airflow guidance sections 425, 426 at the heat sink 400, air can be guided into the main air inlet section 424, increasing the amount of cooling air and so making it possible to improve the cooling performance. That is, since, in this embodiment, the airflow guidance sections 425, 426 are respectively provided in the vicinity of the main air inlet section 424, and the airflow resistance of the airflow guidance sections 425, 426 is set at a relatively higher level than that of the main air inlet section 424, an increase in the amount of air flowing into the main air inlet section 424 can be achieved.

Since, in this embodiment, the aperture face of the main air inlet section 424 is covered by the top plate 430, the air can be prevented from immediately escaping towards the outside from the flow paths 423 immediately after inflow and the incoming cooling airflow can be shaped. In this way, lowering of the amount of flow of the cooling air flowing through the heat sink 400 can be prevented, making it possible to maintain the cooling performance.

In this embodiment, the main heat-radiating section 414 is formed with narrow pitch p2, so the heat-radiating area in the vicinity of the CPU 231 can be increased, making it possible to disperse the heat of the CPU 231 into the air more effectively.

In this embodiment, the airflow guidance sections 425, 426 are provided on the outside along the direction of arrangement of the fins 422, 412, so the cooling performance can be improved without increasing the thickness dimension of the heat sink 400. It should be noted that, if there is no objection to increasing the thickness dimension of the heat sink 400, a construction could be adopted in which the periphery of the main air inlet section 424 is surrounded by airflow guidance sections.

In this embodiment, by setting the fin pitch p2 of the airflow guidance sections 425, 426 narrower than the fin pitch p1 of the main air inlet section 424, the airflow resistance of the airflow guidance sections 425, 426 can be set at a relatively high level. That is, since the airflow guidance sections 425, 426 are of a construction that permits inflow of air rather than a construction that cuts off inflow of air, cooling of the circuit components arranged to the rear of the airflow guidance sections 425, 426 can be achieved. For example, circuit components that generate little heat and that have heat withstanding ability can be cooled with a small amount of air. By arranging such circuit components to the rear of the airflow guidance sections 425, 426 in this way, the installation surface of the NAS board 110 can be effectively utilized.

Figure 12:
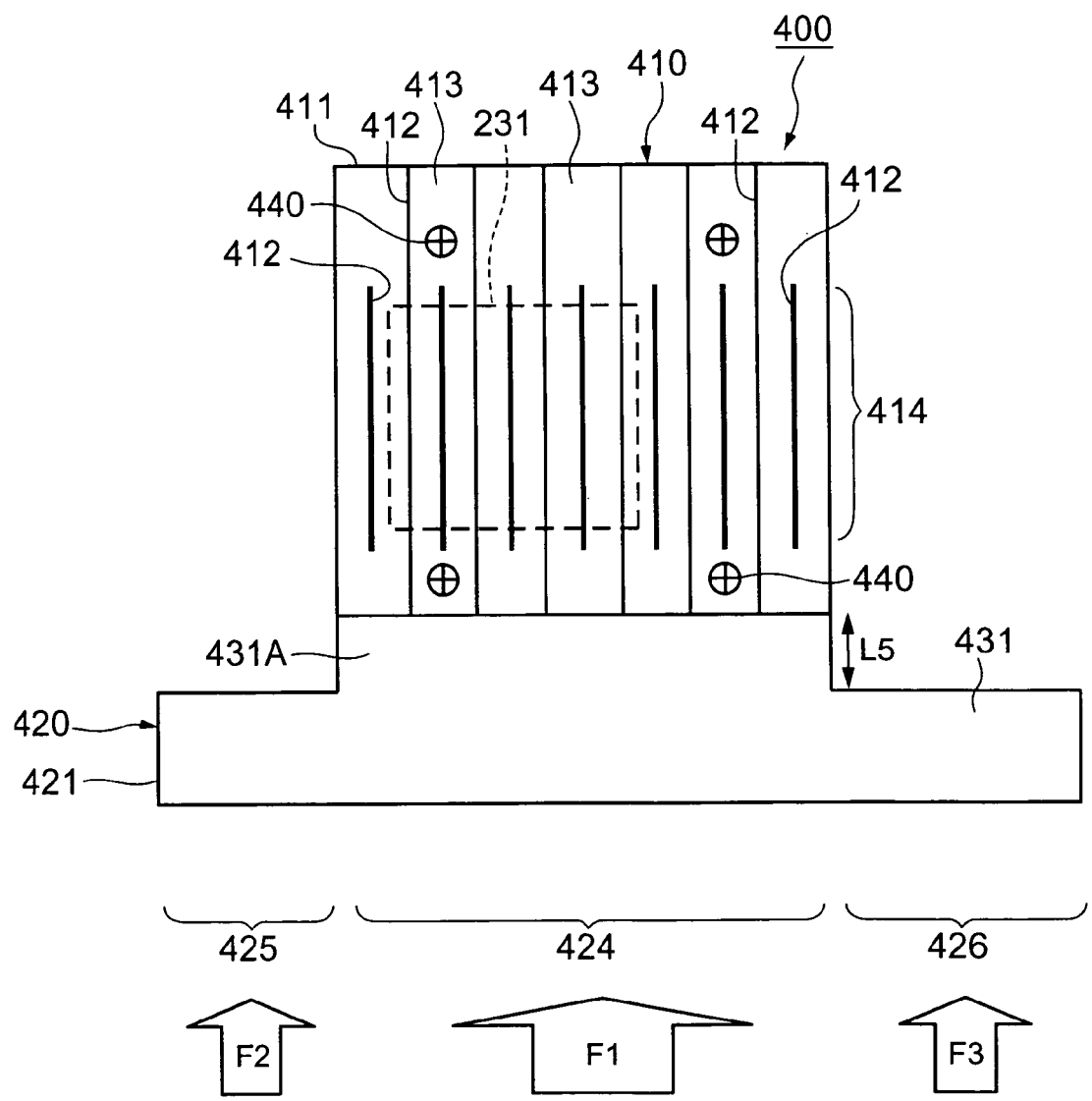
FIG. 12 is a plan view of a heat sink according to a modified example.

A modified example of this embodiment is described below. As shown in the plan view of FIG. 12, for example rather than covering merely the aperture face of the cooling section 420 by the top plate 430, also part of the rear cooling section 410 may be covered by a top plate 431A.

Figure 13A:
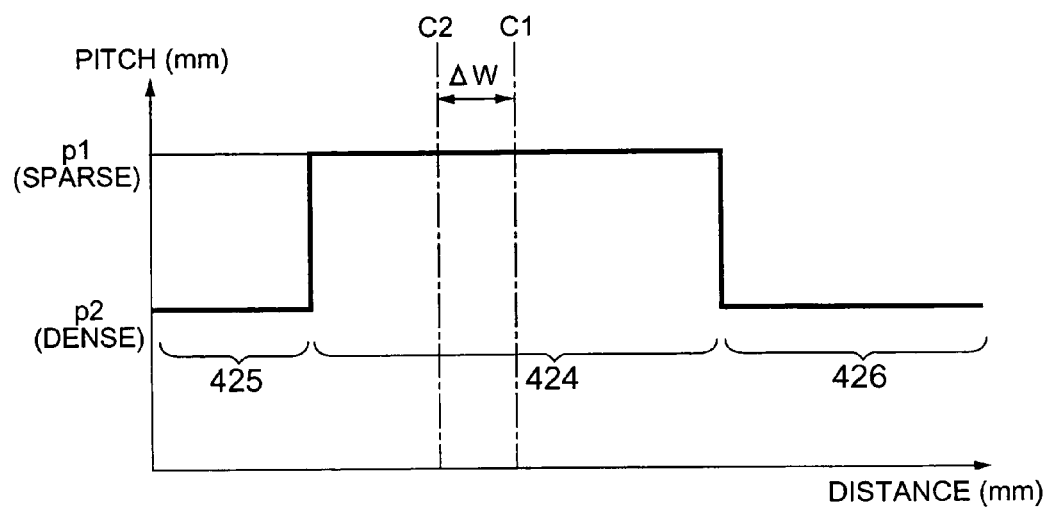
FIG. 13 is a diagram showing a method of setting the fin pitch of a heat sink according to a modified example.
Figure 13B:
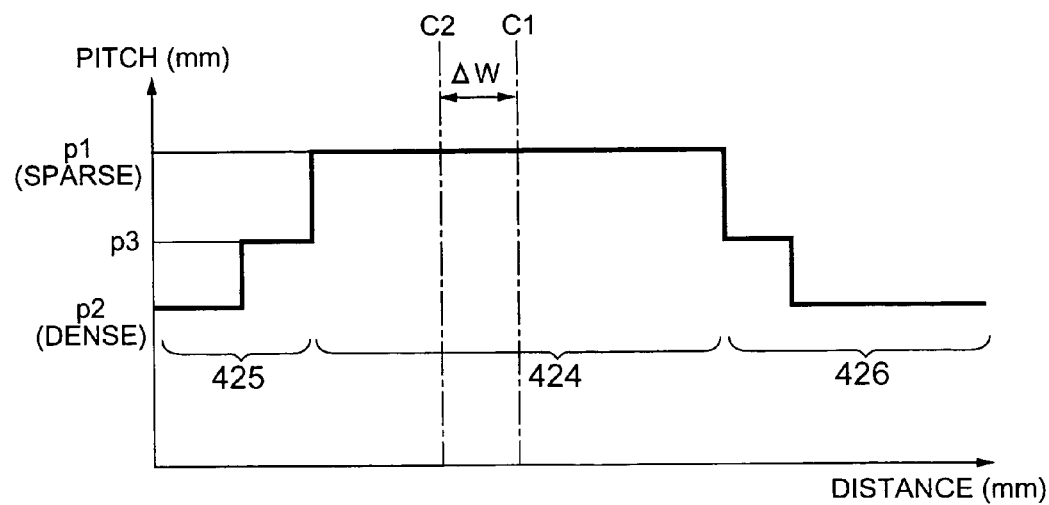

FIG. 13 shows a further modified example illustrating a method of setting the fin pitch. In the Figure, the vertical axis shows the pitch of the fins and the horizontal axis shows the distance of the airflow guidance section 425, taking the outermost side (left side in the Figure) as the origin, respectively.

As shown in FIG. 13($a$), a relatively wide pitch p1 and a relatively narrow pitch p2 may be adopted. The wider the pitch, the wider are the gaps between the fins (i.e. the flow paths) and the narrower the pitch the narrower are the gaps between the pins. The narrow pitch p2 is set in the case of the airflow guidance sections 425, 426 and the wide pitch p1 is set in the case of the main air inlet section 424. In this way, a difference in density of arrangement is produced in the aperture (inflow port of each flow path) at the front face of the front cooling section 420. C1 in the Figure indicates the center line of the main air inlet section 424 and C2 indicates the center line of the CPU 231. Although C2 is offset from C1 by an amount ΔW on the side of the air guidance section 425, the two center lines C1, C2 may be made to coincide.

As shown in FIG. 13($b$), a third pitch p3 may also be adopted. The airflow guidance sections 425, 426 may be set to have two different pitches, namely, the narrowest pitch p2 and an intermediate pitch p3. The area of the aperture may then be increased proceeding in the direction of the center of the main air inlet section 424.

Figure 14A:
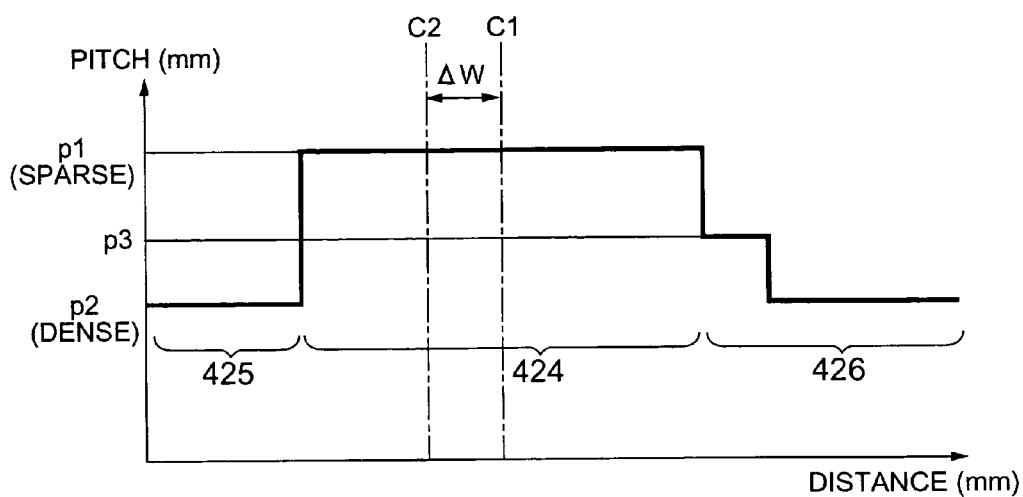
FIG. 14 is a diagram showing a method of setting the fin pitch of a heat sink according to another modified example.
Figure 14B:
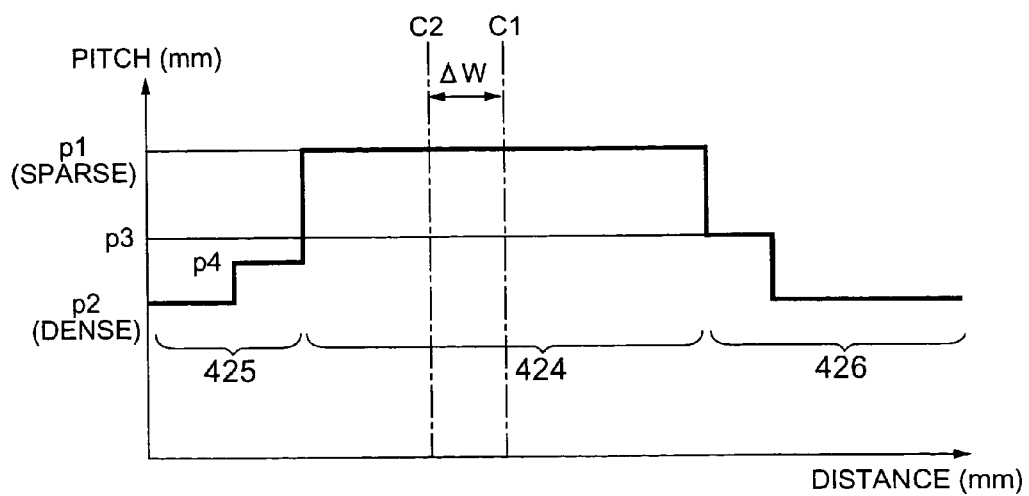

As shown in FIG. 14($a$), the fin pitch of one or other of the airflow guidance sections only may be changed in a plurality of steps. Also, as shown in FIG. 14($b$), the fin pitches of the airflow guidance sections 425, 426 may be made respectively different. For example, the airflow guidance section 425 could be set with a pitch p2 and pitch p4 corresponding to the position of the fins while the airflow guidance section 426 could be set with a pitch p2 and a pitch p3 in accordance with the position of the fins.

The relationship of the respective pitches p1 to p4 is: p1>p3>p4>p2.

Figure 15:
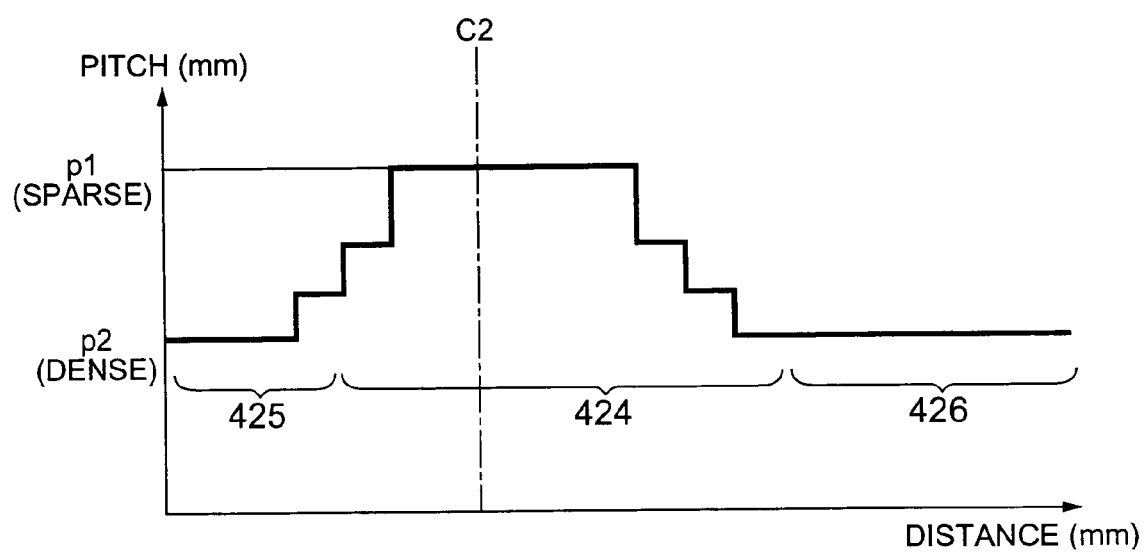
FIG. 15 is a diagram showing a method of setting the fin pitch of a heat sink according to yet a further modified example.

As shown in FIG. 15, the fin pitch could be changed in stepwise fashion moving towards the main air inlet section 424 from the respective airflow guidance sections 425, 426.

Figure 16:
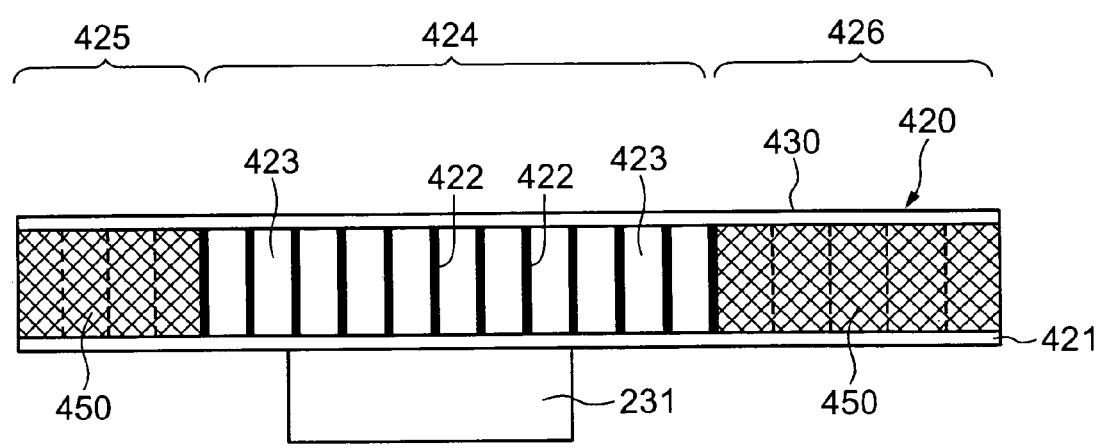
FIG. 16 is a front view of a heat sink wherein the air inlet resistance (airflow resistance) is changed by means of for example a filter instead of the density of the fin pitch.

FIG. 16 is a front view of a heat sink according to a further modified example. In this example, the fin pitches of the main air inlet section 424 and airflow guidance sections 425, 426 are all set to a fixed value (for example p1). A difference in airflow resistance is generated between the main air inlet section 424 and the airflow guidance sections 425, 426, by providing an airflow resistor 450 in the form of a mesh at the front faces of the airflow guidance sections 425, 426. The airflow resistor 450 can be obtained by forming a large number of small holes in for example a metallic material, resin material or ceramics material. It should be noted that a construction could also be adopted in which inflow of air is cut off by forming the airflow resistor 450 from for example a metal plate that is not provided with holes. When air inflow to the airflow guidance sections 425, 426 is cut off, no cooling airflow issues from the airflow guidance sections 425, 426, so a construction may be adopted in which the DC/DC converter 272 and memory 232 which are arranged to the rear of the airflow guidance sections 425, 426 are shifted rearwards of the rear cooling section 410.

Figure 17A:
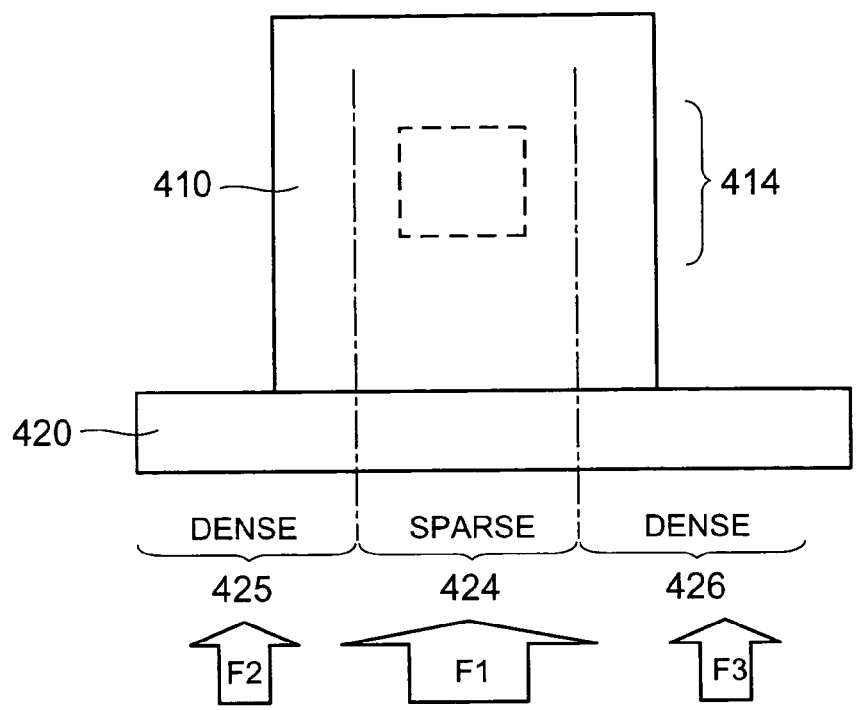
FIG. 17 is a diagram showing schematically the arrangement relationship of a heater element, main air inlet section and airflow guidance section.
Figure 17B:
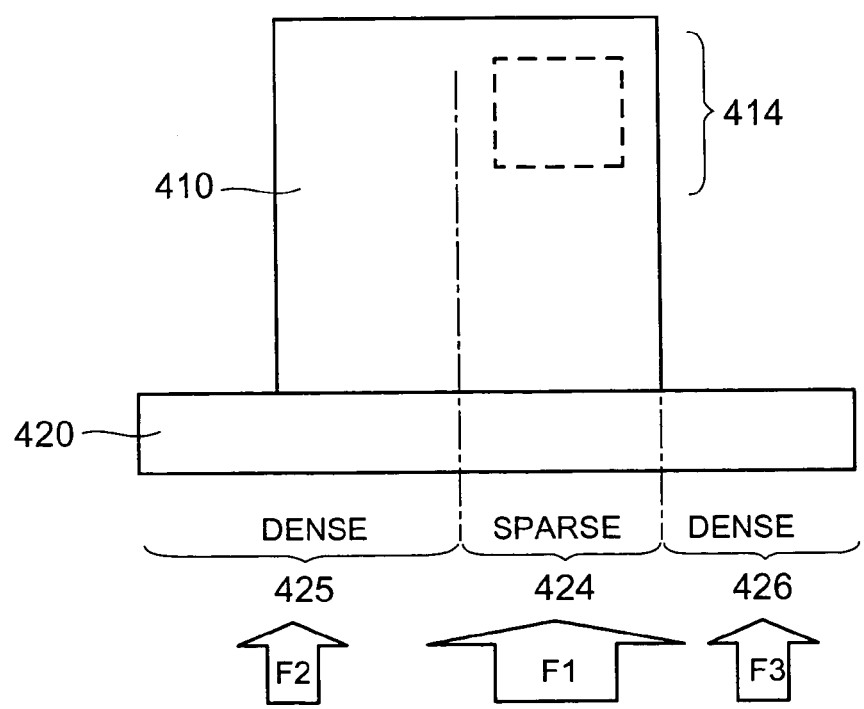

FIG. 17 is a diagram showing schematically the relationship between the mounting position of the CPU 231 and the heat sink 400. As shown in FIG. 17(*a*), the CPU 231 may be provided in substantially the middle of the rear cooling section 410. In this case, the position of formation of the main air inlet section 424 and main heat-radiating section 414 may be set matching the position of the CPU 231. Likewise, as shown in FIG. 17(*b*), if the CPU 231 is provided further towards the end of the rear cooling section 410, the position of formation of the main air inlet section 424 and main heat-radiating section 414 may be set matching the position of the CPU 231.

2. Second Embodiment

A second embodiment will now be described with reference to FIG. 18. The characteristic feature of this embodiment is that the fins of the airflow guidance sections 425 and 426 are arranged inclined in a prescribed direction. It should be noted that the following embodiments correspond to modified examples of the first embodiment.

Figure 18:
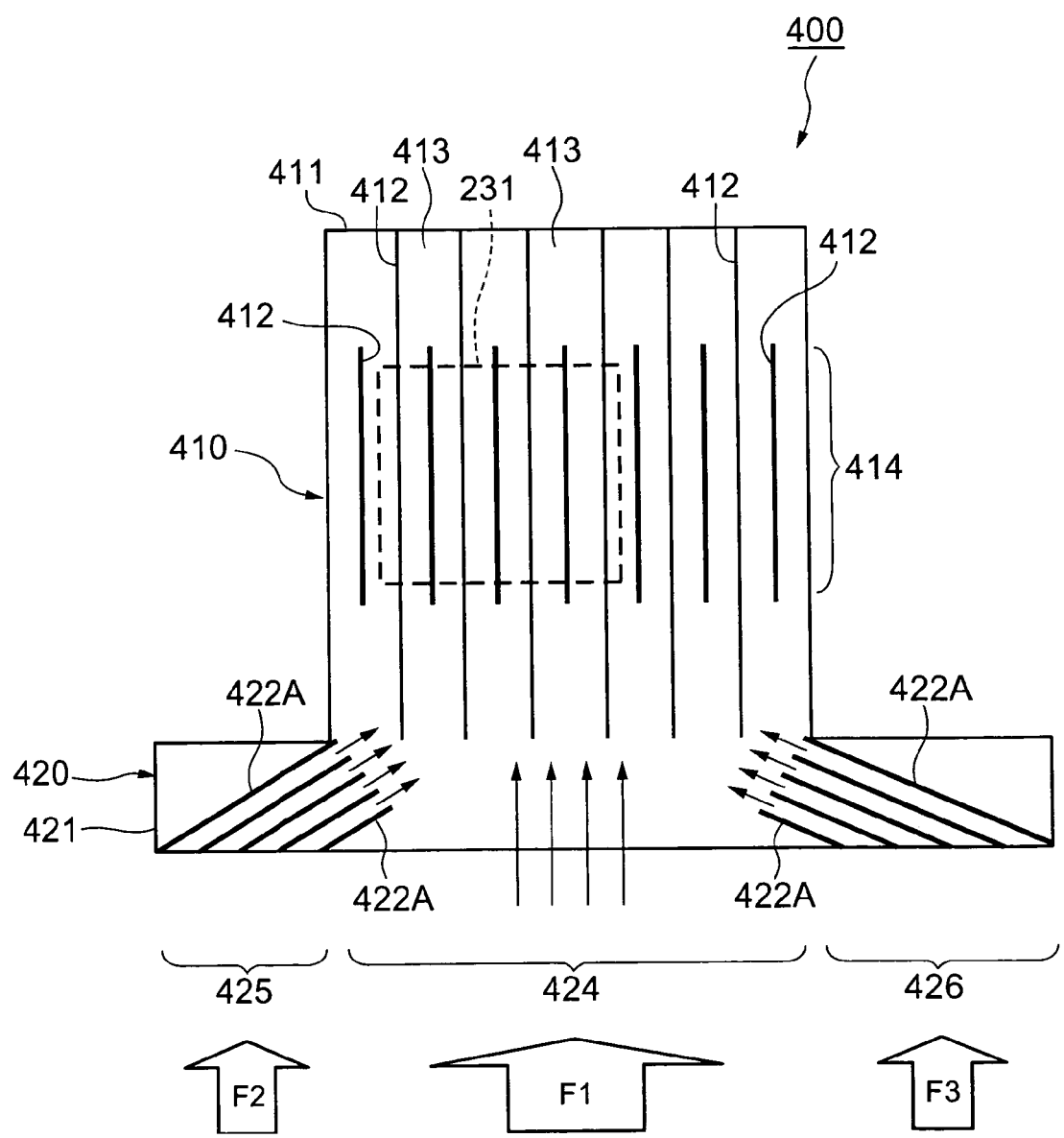
FIG. 18 is a plan view of a heat sink according to a second embodiment.

FIG. 18 is a plan view of the heat sink 400. The fins 422A of the airflow guidance sections 425, 426 are formed in inclined fashion so as to face the center of the rear cooling section 410, respectively. The air flowing in between the fins 422A of the airflow guidance sections 425, 426 respectively flows into the flow paths 413 of the rear cooling section 410 rather than flowing out at the rear of the airflow guidance sections 425, 426. In this way, more cooling airflow can be delivered to the rear cooling section 410, making it possible to increase the cooling performance.

FIG. 19 is a modified example. The DC/DC converter 272 and the memory 232 which were arranged to the rear of the airflow guidance sections 425, 426 in the first embodiment can be respectively provided to the rear of the rear cooling section 410. In this embodiment, the air flowing into the airflow guidance sections 425, 426 is collected at the rear cooling section 410, so circuit components are not arranged to the rear of the airflow guidance sections 425, 426 but circuit components are mounted to the rear of the rear cooling section 410.

3. Third Embodiment

Figure 20A:
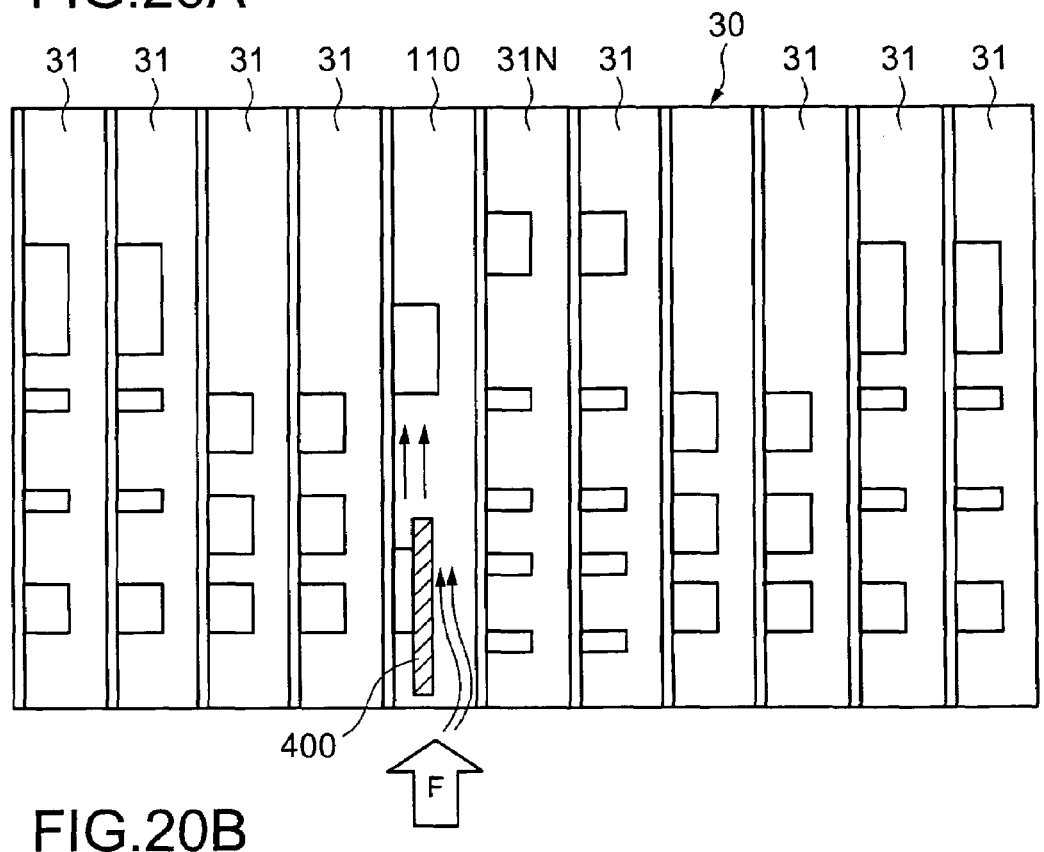
FIG. 20 is a plan view of a control section employed in describing the layout of a third embodiment.
Figure 20B:
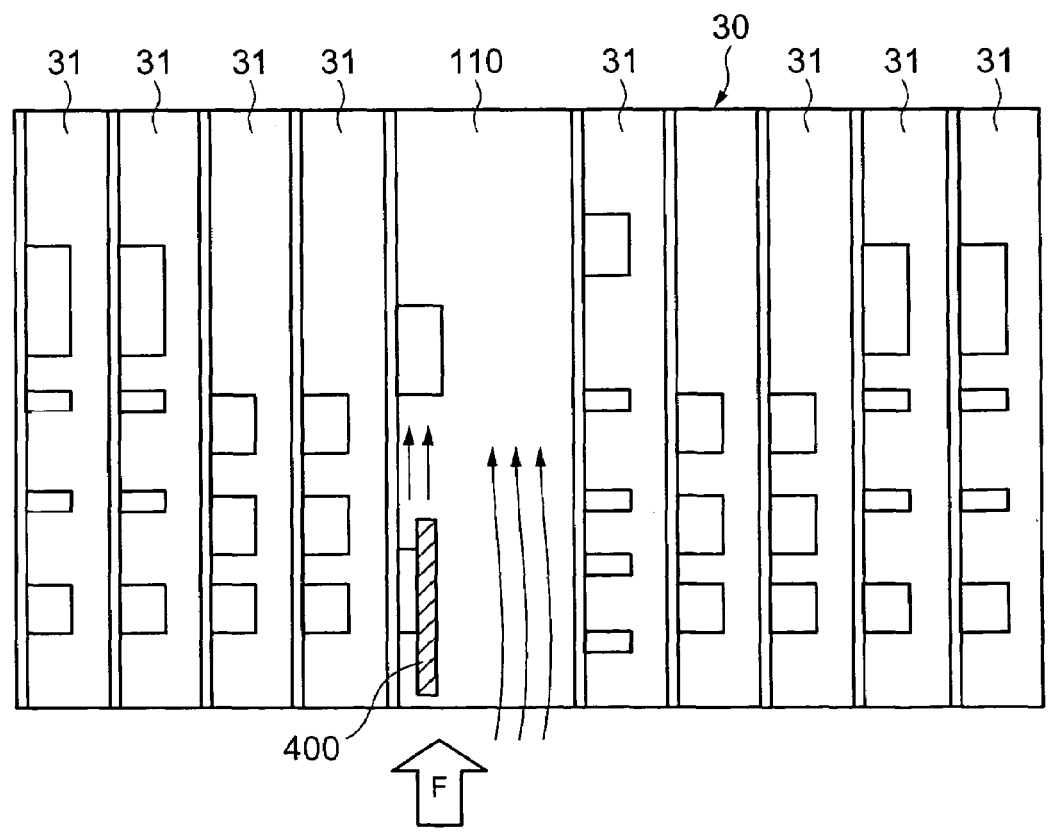

A third embodiment is described with reference to FIG. 20 to FIG. 22. FIG. 20 is a diagram given in explanation of this embodiment. A plan view of a control section 30 is schematically shown in FIG. 20.

Part of the air F that enters the NAS board 110 flows into the heat sink 400 while the other part flows into the air space between the NAS board 110 and another logic circuit board 31N adjacent to the NAS board 110.

However, in the control section 30, there are only mounted the necessary number of logic circuit boards 31 required in accordance with the specification requested for the disc array device 10 (for example, the number of connections of host devices). It may therefore not necessarily always be the case that a logic circuit board 31N is present adjacent to the aperture face of the heat sink 400 (i.e. on the right side thereof in FIG. 20).

As shown in FIG. 20(*b*), if no logic circuit board 31N is present adjacent to the heat sink 400, the space between the NAS board 110 and the other logic circuit boards becomes wider. The airflow resistance of the space between the circuit boards therefore becomes smaller than that of the NAS board 110 where the heat sink 400 and circuit components are provided. More air can therefore flow into the space between the circuit boards and be sucked into the casing 11 without contributing to cooling of the CPU 231. In other words, the adjacent circuit board 31N functions as a second top plate for the heat sink 400.

Figure 21A:
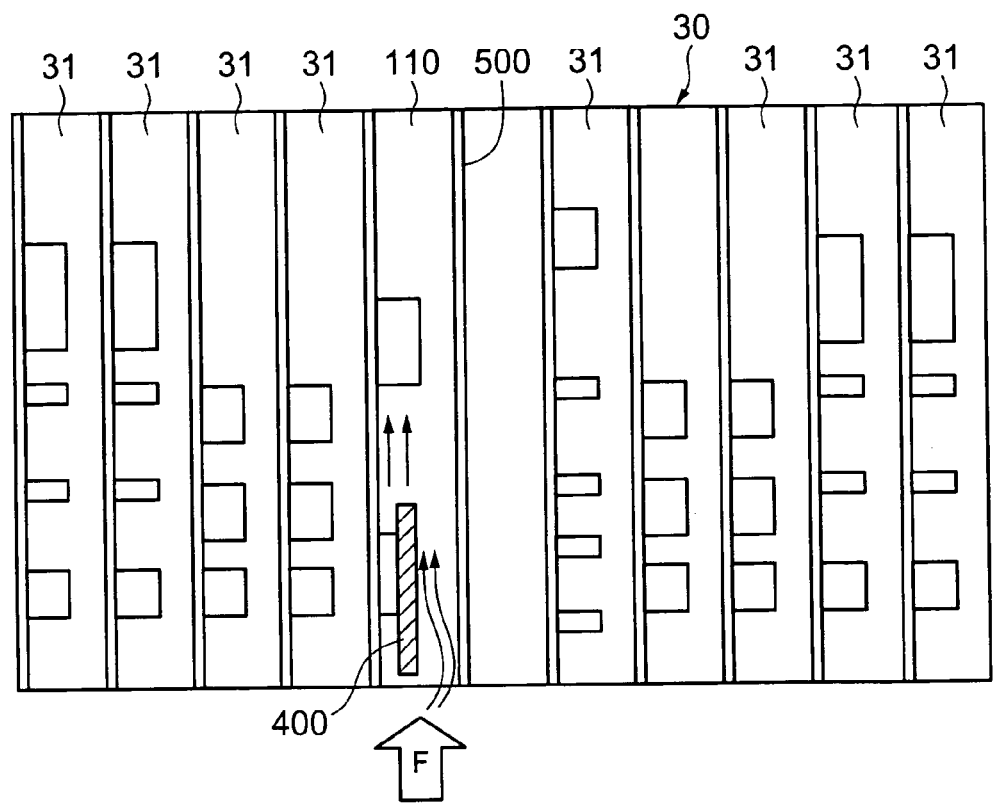
FIG. 21A is a plan view of a control section according to a third embodiment and FIG. 21B is a diagram showing schematically a heat sink and other parts to a larger scale.

Accordingly, as shown in FIG. 21A, if a logic circuit board 31N is not mounted at the aperture face of the heat sink 400 because for example of reasons to do with the requested specification, a dummy circuit board 500 may be mounted there instead of this logic circuit board 31N. It should be noted that this dummy circuit board 500 need not be formed of a printed circuit board and could for example be formed merely of metallic material or resin material in a substantially a flat plate shape.

Figure 21B:
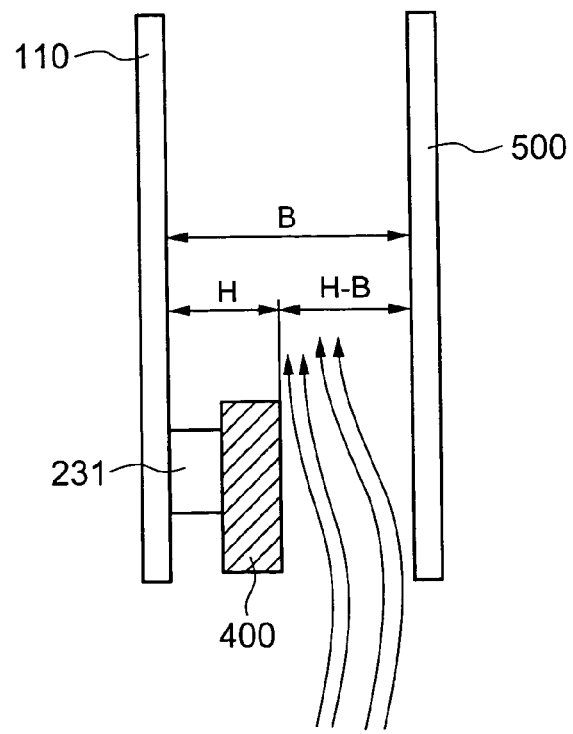

If, as shown in FIG. 21B, the height dimension of the heat sink 400 is taken as H and the separation dimension between the NAS board 110 and the dummy circuit board 500 is taken as B, the separation dimension between the upper surface of the heat sink 400 (i.e. the face on the aperture side) and the dummy circuit board 500 is H–B.

Figure 22:
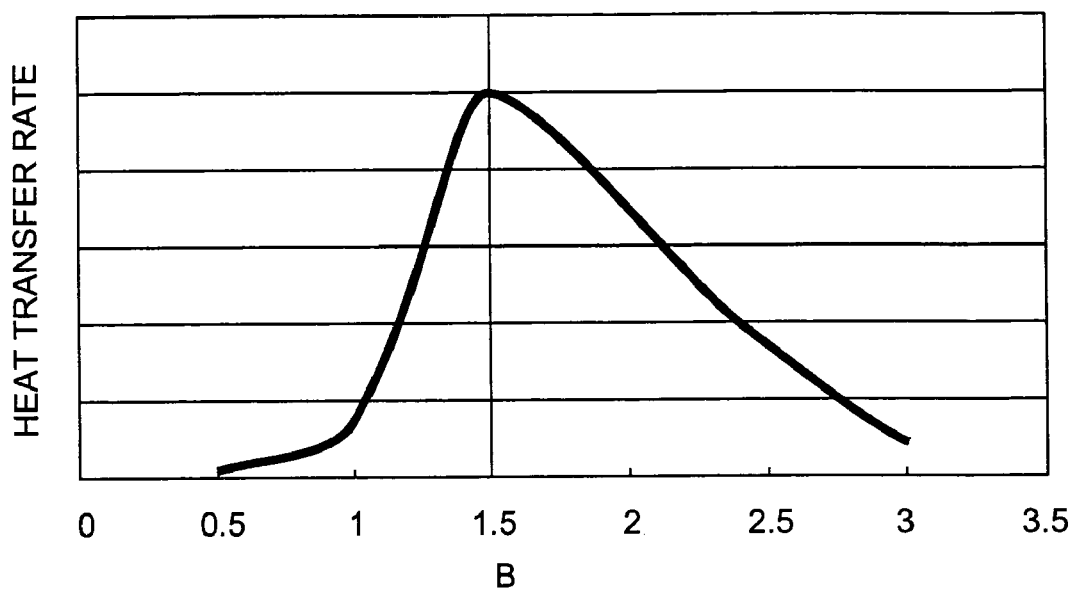
FIG. 22 is a characteristic showing schematically the way in which cooling performance changes depending on the relationship between the height of arrangement of a dummy circuit board for guiding cooling air towards a heat sink and the height of a heat sink.

FIG. 22 is a characteristic showing schematically the relationship between the dimension B of the height of setting of the dummy circuit board 500 and the heat transfer rate. Using this characteristic, taking the height dimension H of the heat sink 400 as 1, it is possible to predict how the cooling performance of the heat sink 400 will change in response to setting the height dimension B of installation of the dummy circuit board 500 at a given value.

According to this characteristic, if the installation height dimension B of the dummy circuit board 500 is set to about 1.5 times the height dimension H of the heat sink 400, it appears that high cooling performance can be achieved. If therefore the value of B is set to a value of about 1.3 to 1.7 times the value of H, a large cooling airflow can be concentrated on the heat sink 400.

Thus it appears that, if the aperture ratio is defined as (B–H)/H, and the position of the dummy circuit board 500 is set such that the aperture ratio is for example about 0.3, this dummy circuit board 500 can be made to function as a second top plate, making it possible to guide more cooling airflow onto the heat sink 400.

4. Fourth Embodiment

Figure 23:
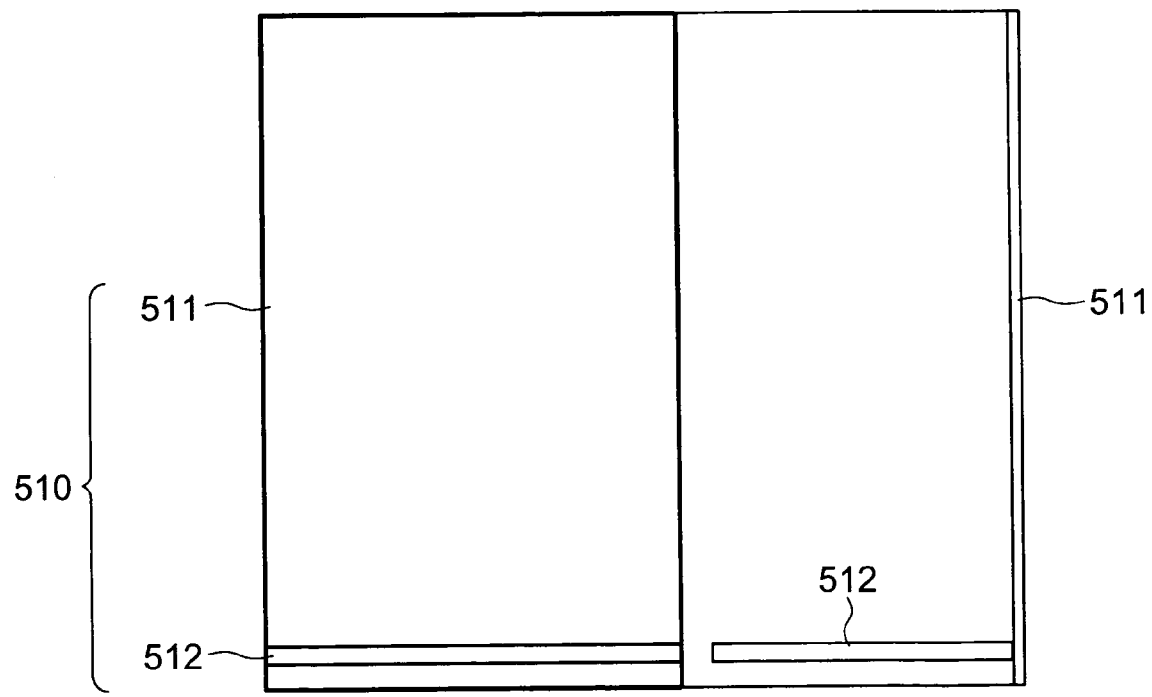
FIG. 23 is a diagram showing a dummy circuit board according to a fourth embodiment.

A fourth embodiment is described with reference to FIG. 23 and FIG. 24. In this embodiment, a dummy circuit board 510 is provided with a projection 512. Specifically, as shown in FIG. 23, the dummy circuit board 510 comprises for example a flat plate section 511 and a flat plate-shaped projection 512 arranged towards one end of the flat plate section 511 and formed projecting outwards over the entire width direction thereof.

Figure 24A:
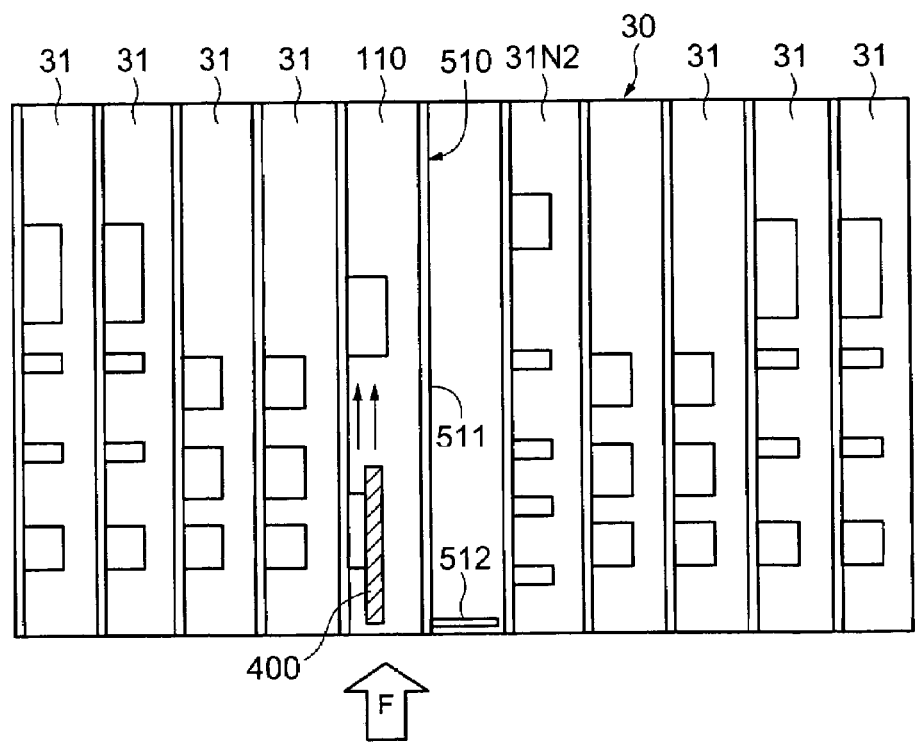
FIG. 24A is a plan view of a control section showing the condition in which the dummy circuit board is mounted and FIG. 24B is a cross-sectional view of a heat sink and other parts.

As shown in the plan view of FIG. 24A, the projection 512 is provided so as to project into the space (i.e. the space between the dummy circuit board 510 and a logic circuit board 31N2 adjacent to the dummy circuit board 510) on the opposite side to the space facing the heat sink 400 (i.e. the space between the NAS board 110 and the dummy circuit board 510). The dimension of this projection is set such that the projection 512 does not interfere with the logic circuit board 31N2.

Figure 24B:
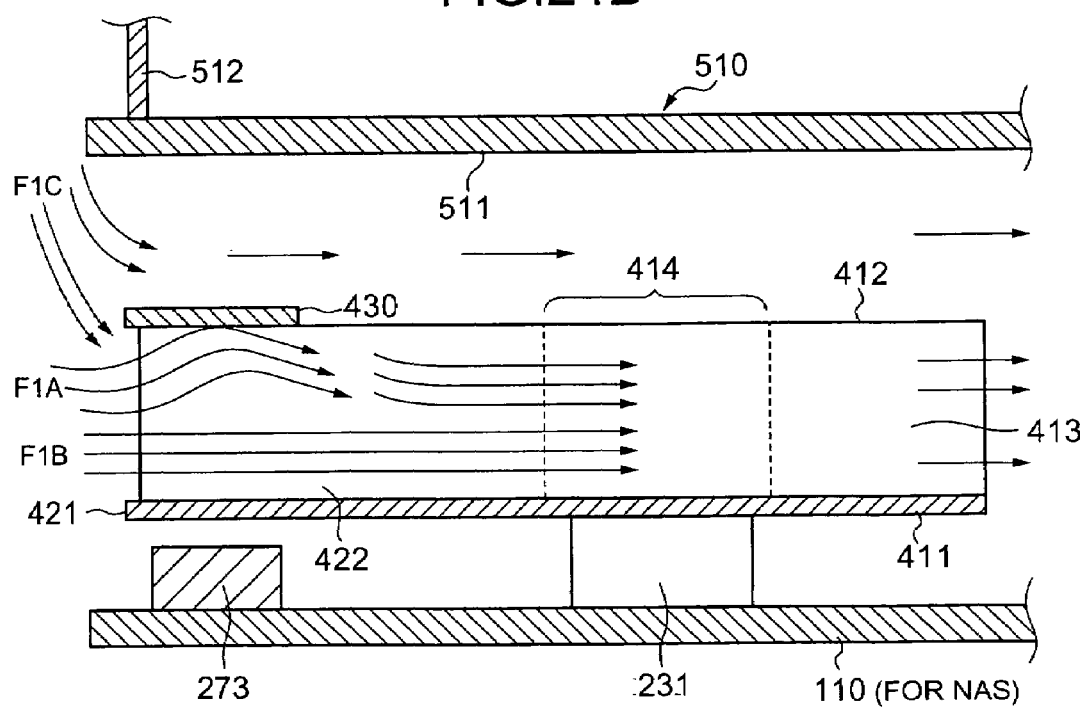

As shown in FIG. 24B, the projection 512 increases the airflow resistance of the space formed between the dummy circuit board 510 and the logic circuit board 31N2 by projecting into the space on the opposite side to the heat sink 400. The amount of air flowing into the gap between the dummy circuit board 510 and the logic circuit board 31N2 is therefore decreased and the amount of air flowing into the heat sink 400 is to that extent increased. That is, part of the air F1C that is located in the vicinity of the dummy circuit board 510 flows into the space between the dummy circuit board 510 and the heat sink 400, while the remainder thereof flows into the heat sink.

5. Fifth Embodiment

Figure 25:
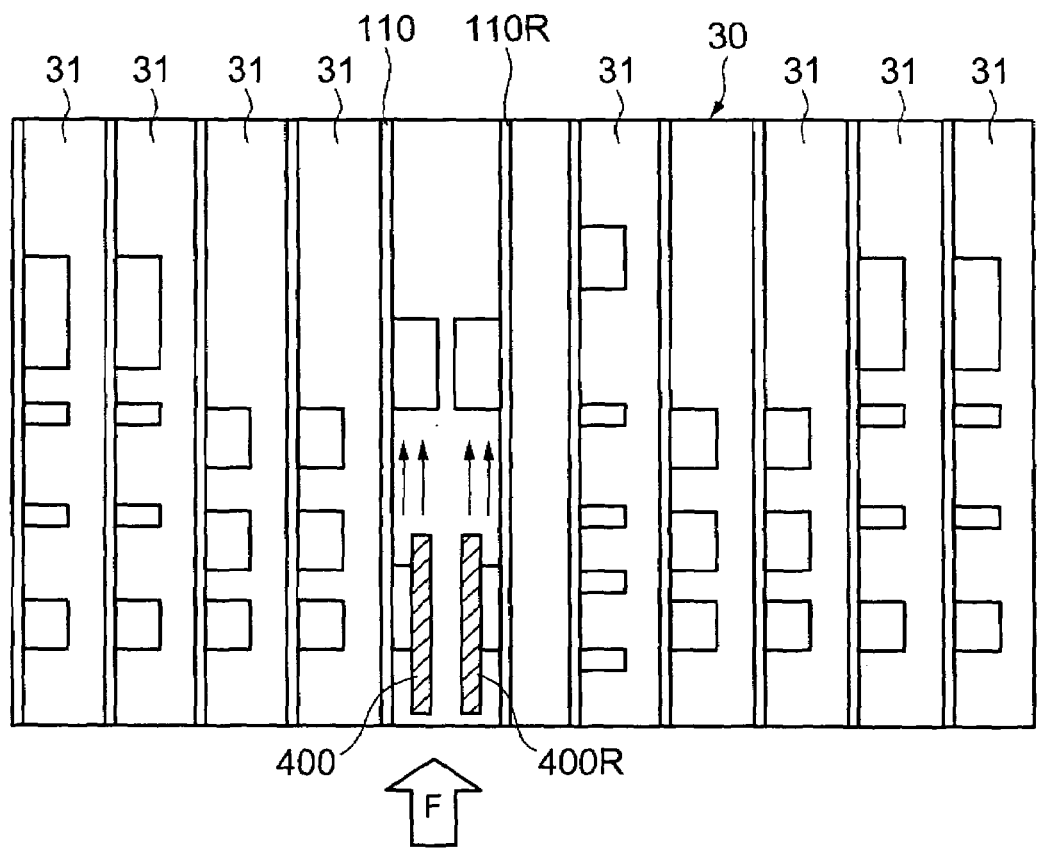
FIG. 25 is a plan view of a control section according to a fifth embodiment.

A fifth embodiment is described with reference to FIG. 25. FIG. 25 is a plan view of a control section 30. In this embodiment, two NAS boards 110, 110R are employed and the control section 30 is mounted facing these NAS boards 110, 110R.

The NAS board 110R is constructed symmetrically with the NAS board 110 such that its heat sink 400R faces the heat sink 400 of the NAS board 110. In this way, for the one heat sink 400, the other heat sink 400 has the function of a second top plate and for the other heat sink 400R the one heat sink 400 has the function of a second top plate. The amount of air that is sucked into the casing 11 without contributing to cooling is therefore reduced, enabling the cooling performance to be improved.

6. Sixth Embodiment

Figure 26A:
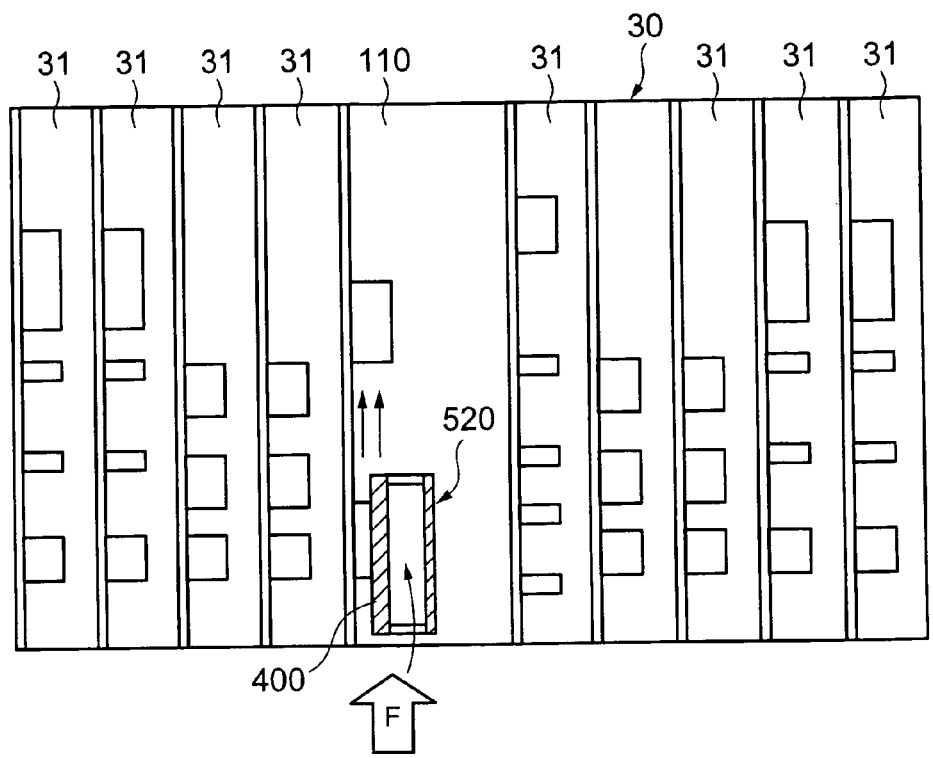
FIG. 26A is a plan view of a control section according to a sixth embodiment and FIG. 26B is a cross-sectional view of a heat sink and other parts.
Figure 26B:
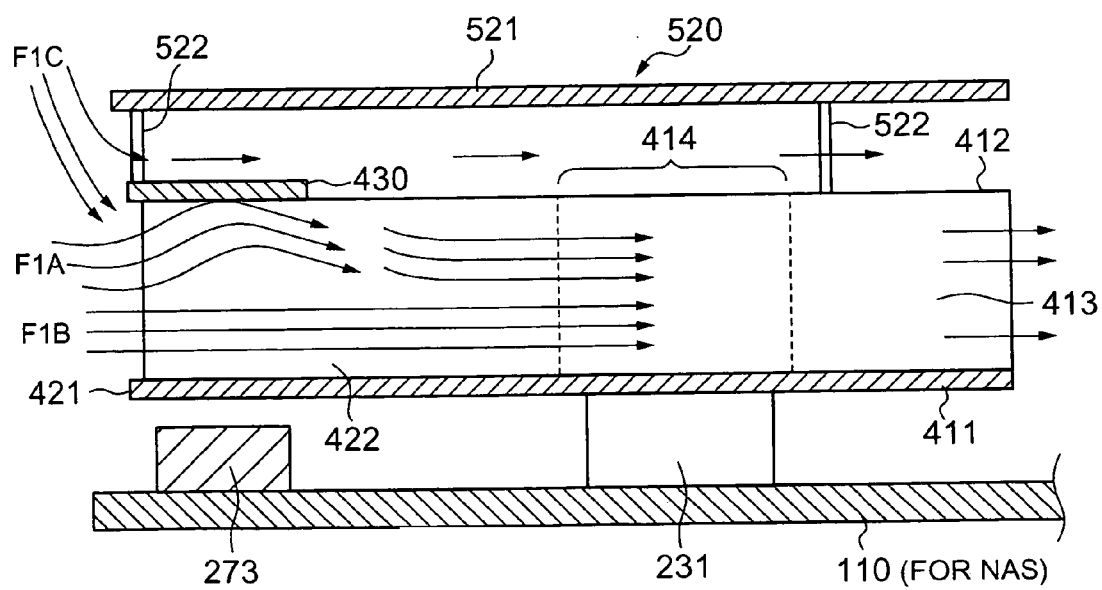
Figure 28:
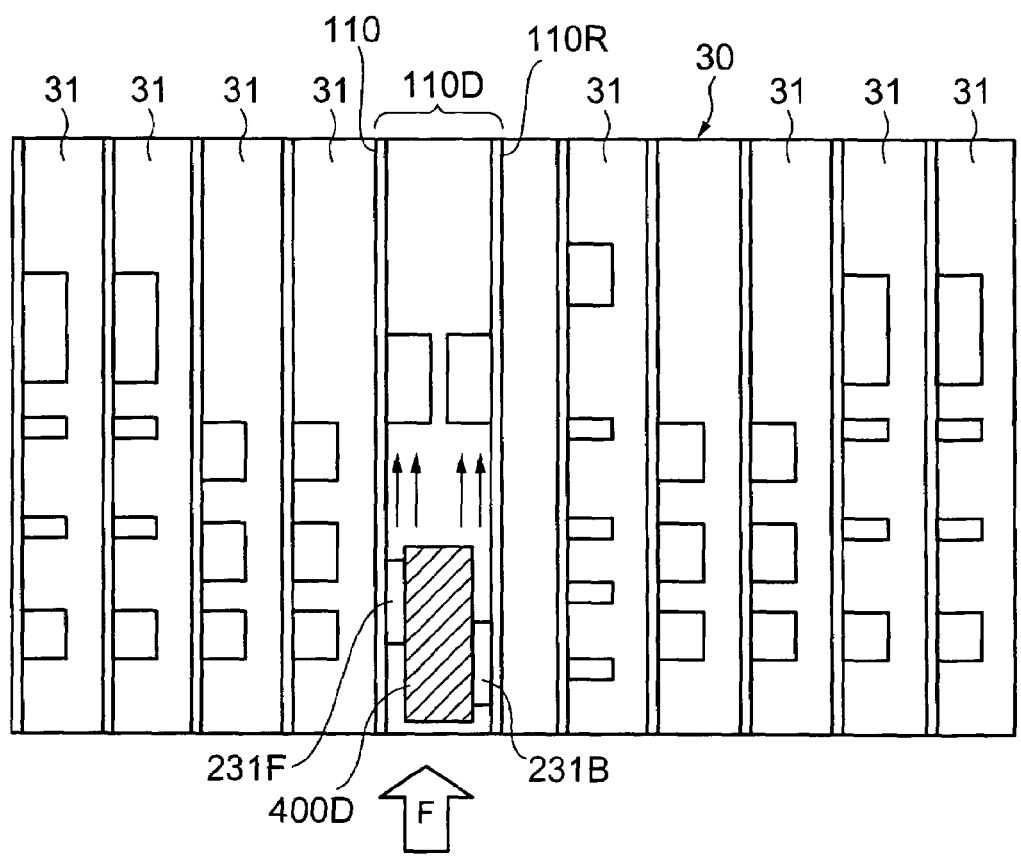
FIG. 28 is a plan view of a control section according to a seventh embodiment.

A sixth embodiment is described with reference to FIG. 26. FIG. 26A shows a plan view of the control section 30; in this embodiment, a shutter section 520 is provided above the heat sink 400. As shown in the cross-sectional view of FIG. 26B, the shutter section 520 comprises for example a flat plate section 521 and support sections 522 that support the flat plate section 521 at a plurality of locations. The circuit board side of the support sections 522 is respectively fixed to the heat sink 400 and the tips of the support sections 522 are respectively fixed to the flat plate section 521. The support sections 522 are constructed for example of rods of small diameter so as not to obstruct the cooling airflow flowing through the space between the shutter section 520 and the heat sink 400 (i.e. so that they do not present much airflow resistance). Also, by constructing the support sections 522 and shutter section 520 of material of high thermal conductivity, the heat of the heat sink 400 can be conducted to the shutter section 520. In this way, the shutter section 520 can act as a heat-radiating plate.

By arranging the shutter section 520 in separated fashion at the aperture face of the heat sink 400 (i.e. the upper surface thereof in FIG. 23(b)), a larger amount of cooling airflow can be guided to the heat sink 400 even when there is no logic circuit board 31N adjacent to the NAS board 110. It should be noted that the cooling airflow that flows through the space between the shutter section 520 and the heat sink 400, i.e. at least part thereof, contributes to cooling of the heat sink 400.

As shown in FIG. 27, a construction could be adopted in which use of a dummy circuit board 500 and a shutter section 520 is combined. In this case, cooling airflow can be guided to the space between this and the logic circuit board by the dummy circuit board 500 and cooling airflow can be concentrated onto the heat sink 400 by means of the shutter section 520. Also, the top plate 430 suppresses peeling off of the airflow from the flow paths 423 and so guides the cooling airflow towards the heat generating section (position where the CPU 231 is mounted).

7. Seventh Embodiment

A seventh embodiment is described with reference to FIG. 28 to FIG. 31. As shown in the plan view of FIG. 28, in this embodiment, two NAS boards 110 and 110R are integrated to constitute a single NAS board 110D. Thus the CPUs 231F, 231B of the NAS boards 110, 110R are cooled by a common heat sink 400D.

Figure 29:
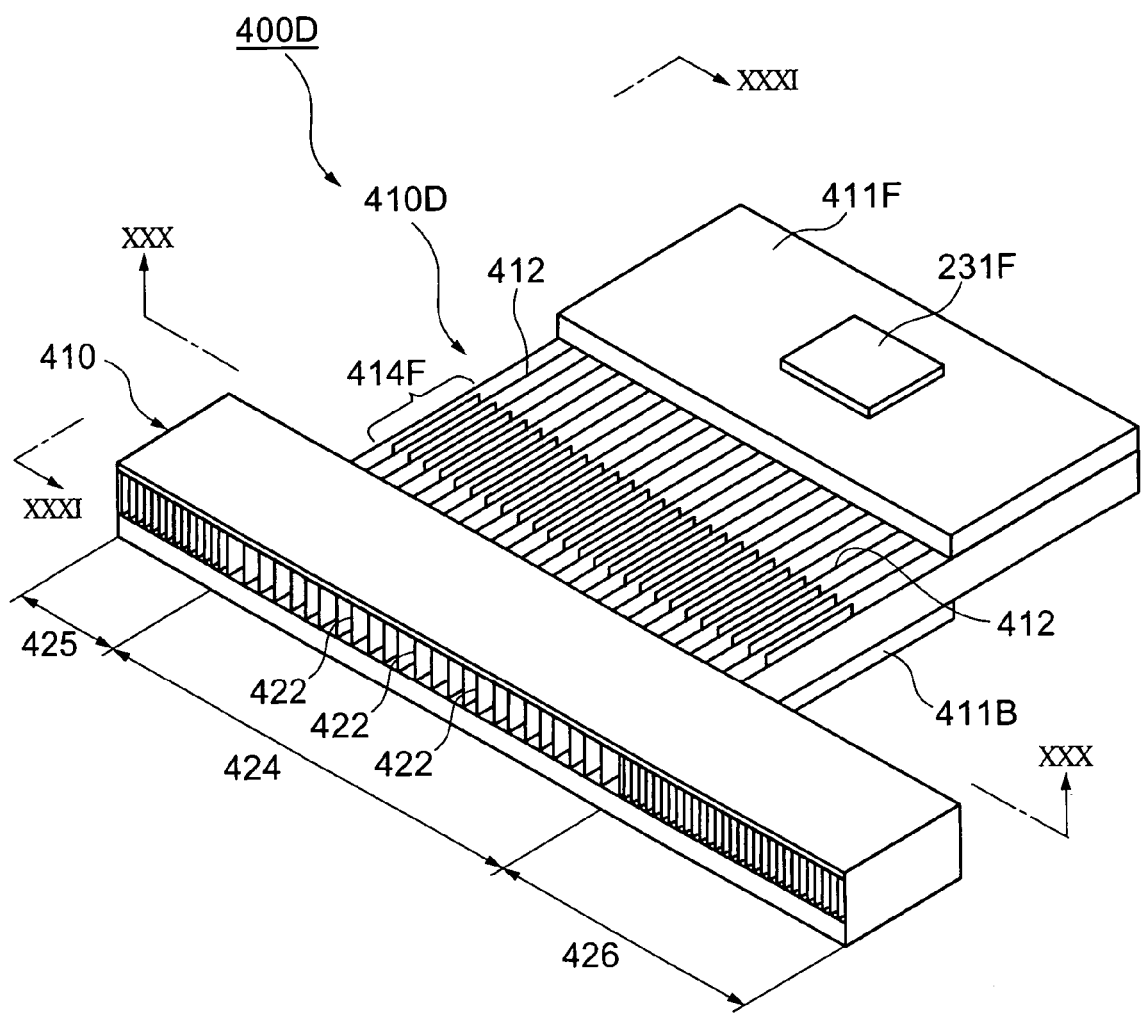
FIG. 29 is a perspective view of a heat sink.

FIG. 29 is a perspective view of a heat sink 400D that is capable of cooling simultaneously the two CPUs 231F, 231B. A base section 411F is provided at the rear (the rear side in the direction of the airflow) of the rear cooling section 410D and the CPU 231F is mounted on this base section 411F.

Figure 30:
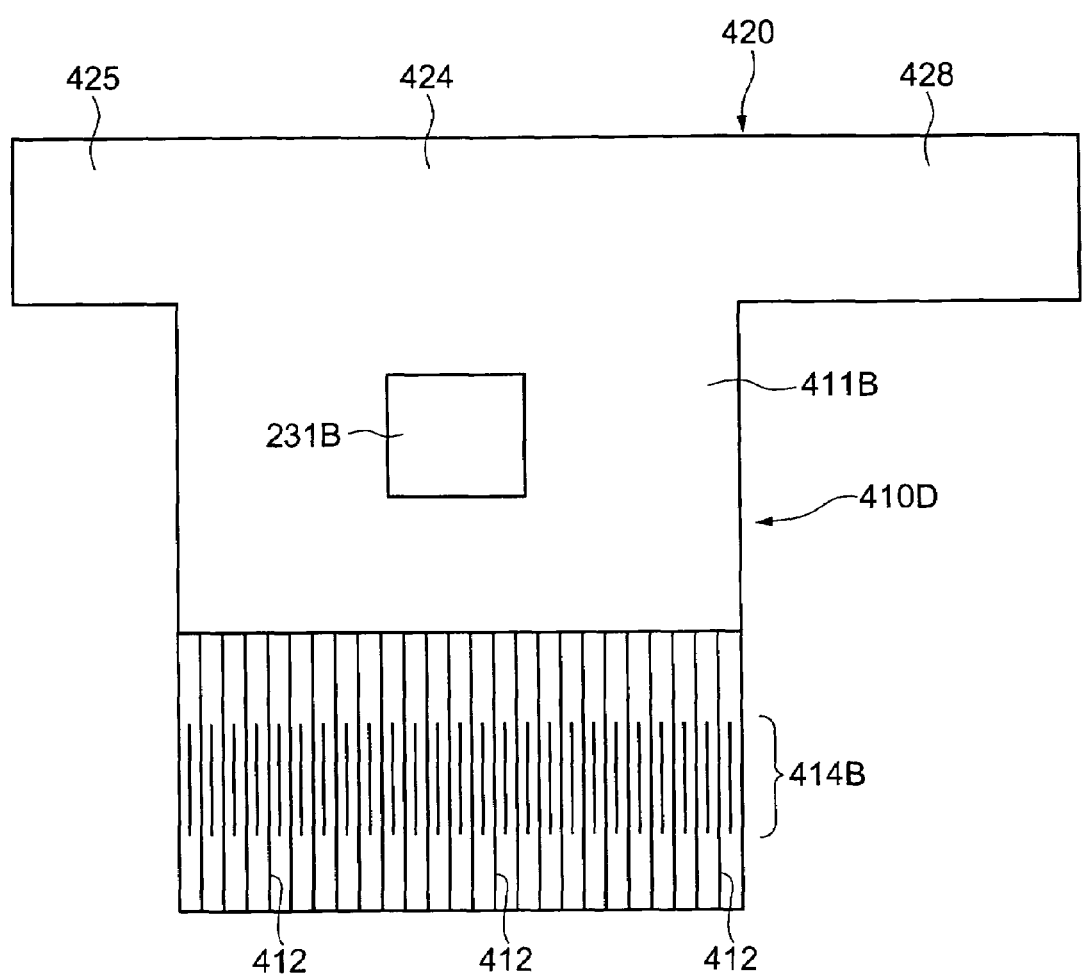
FIG. 30 is a bottom face view of a heat sink.

As shown in the rear view of FIG. 30 and the side view of FIG. 31, a further base section 411B is provided on the inside of the heat sink 400D and a further CPU 231B is mounted on this base section 411B. Thus the CPU 231F is cooled by for example the main heat-radiating section 414B and the CPU 231B is cooled by for example the main heat-radiating section 414F, respectively.

In this way, the two CPUs 231F, 231B can be respectively cooled by means of a single heat sink 400D, by integrating two NAS boards 110, 110R as a single NAS board 110D. In this way, the overall construction can be simplified by mutually employing circuit boards each respectively as a second circuit board for the other.

8. Eighth Embodiment

Figure 32A:
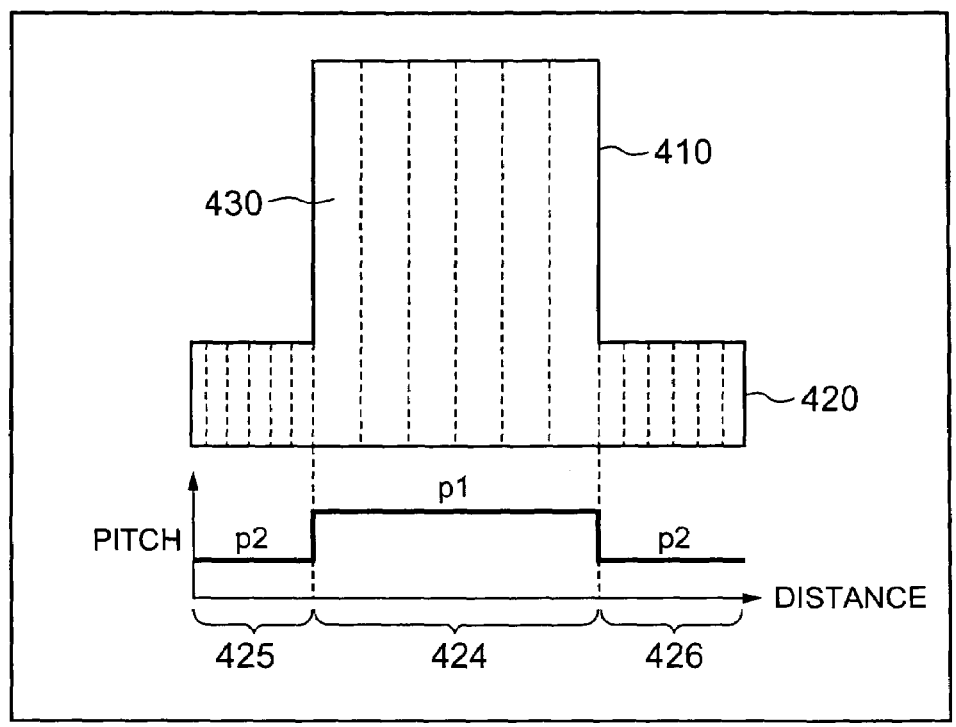
FIG. 32 is a plan view of a heat sink according to an eighth embodiment.
Figure 32B:
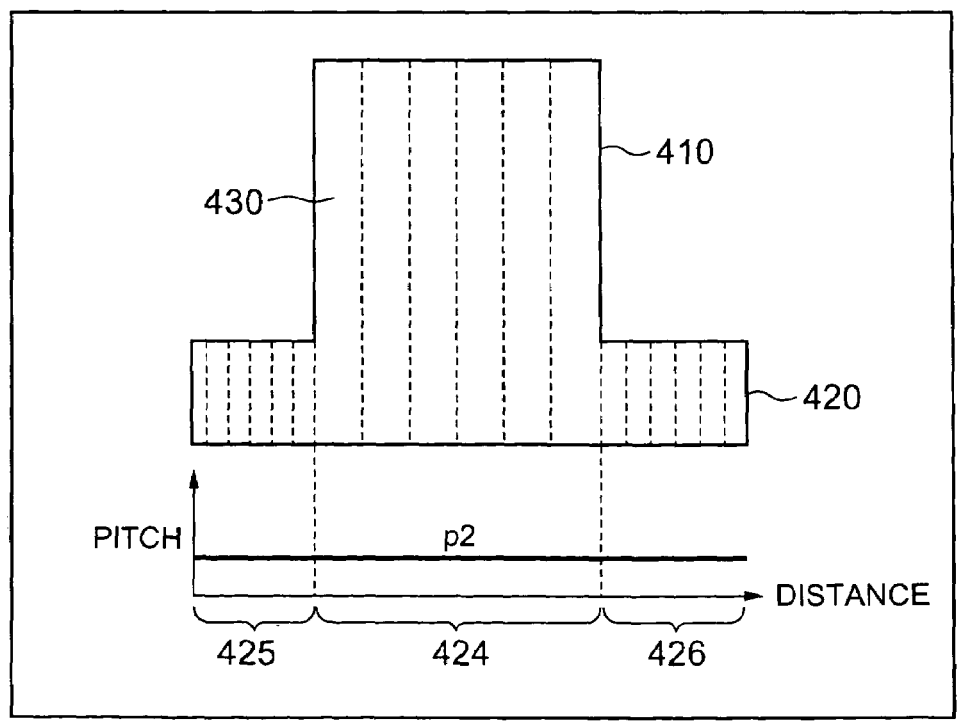

A brief description will now be given of FIG. 32 to FIG. 37 regarding for example the combination of density of the fin pitch and presence/absence of a top plate. As shown in FIG. 32(a), the entire aperture face of the heat sink may be covered by means of a top plate 430. As shown in FIG. 32(b), the entire aperture is covered by the top plate 430 and the fin pitch can also be kept constant.

Figure 33:
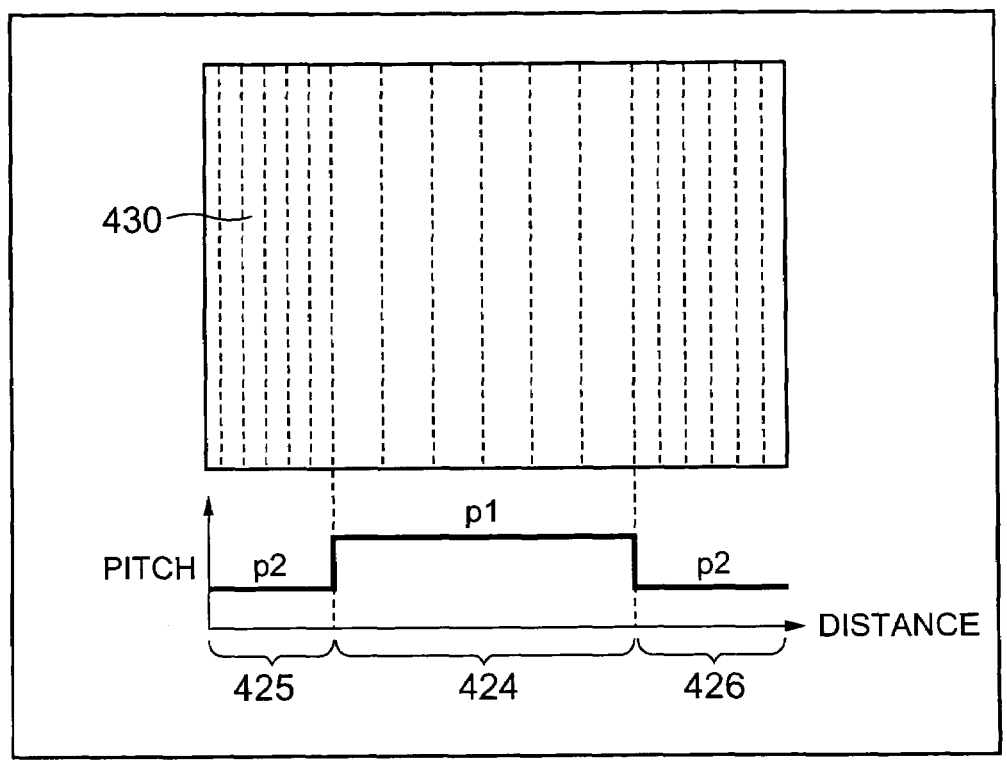
FIG. 33 is a plan view of a heat sink showing a modified example.

As shown in FIG. 33, the airflow guidance sections 425, 426 may be respectively formed within the heat sink rather than being provided so as to project at both sides of the heat sink. In this case, the entire heat sink may be covered by the top plate 430.

Figure 34A:
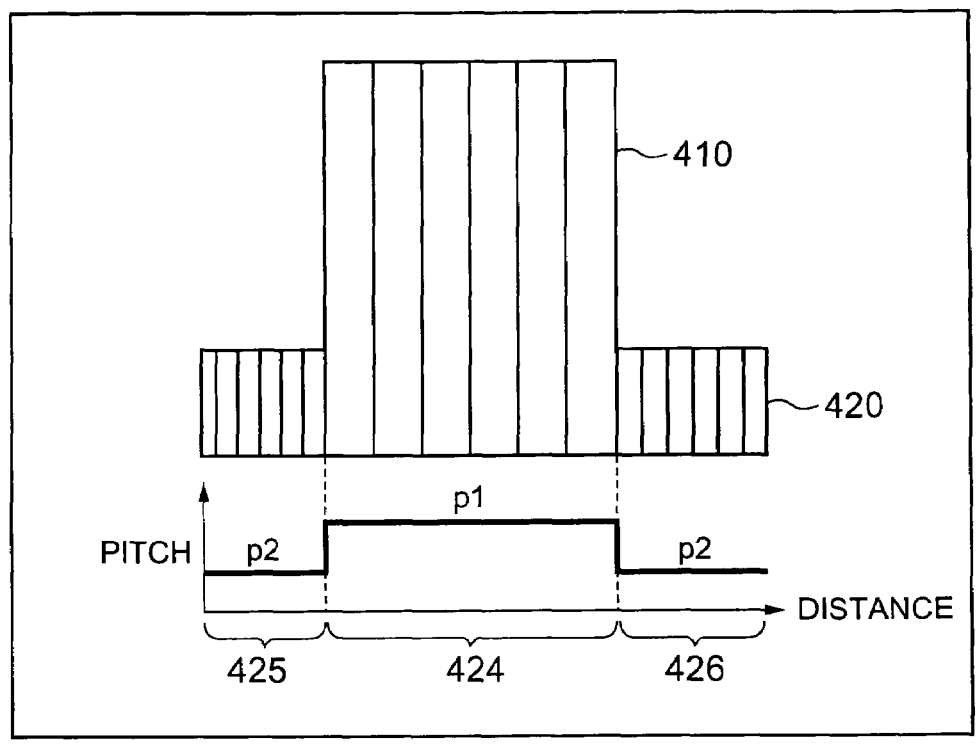
FIG. 34 is a plan view of a heat sink showing another modified example.
Figure 34B:
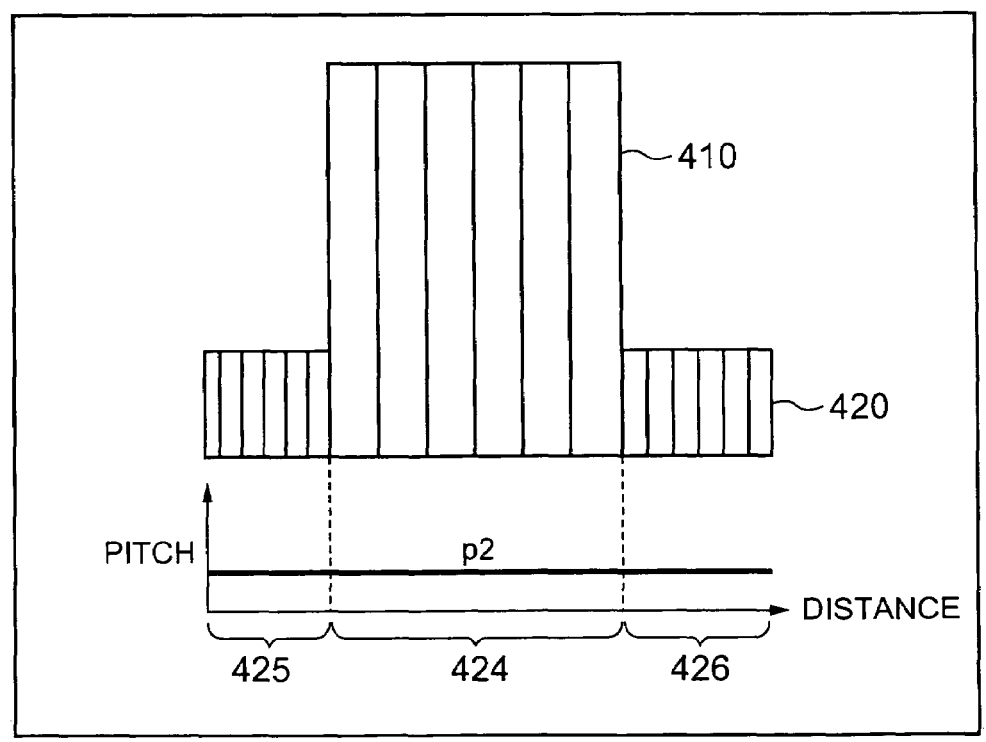

As shown in FIG. 34, the top plate may also be removed from the heat sink. In this case, as shown in FIG. 34(a), the fin pitch may be altered or, as shown in FIG. 34(b), the fin pitch may be kept constant.

Figure 35:
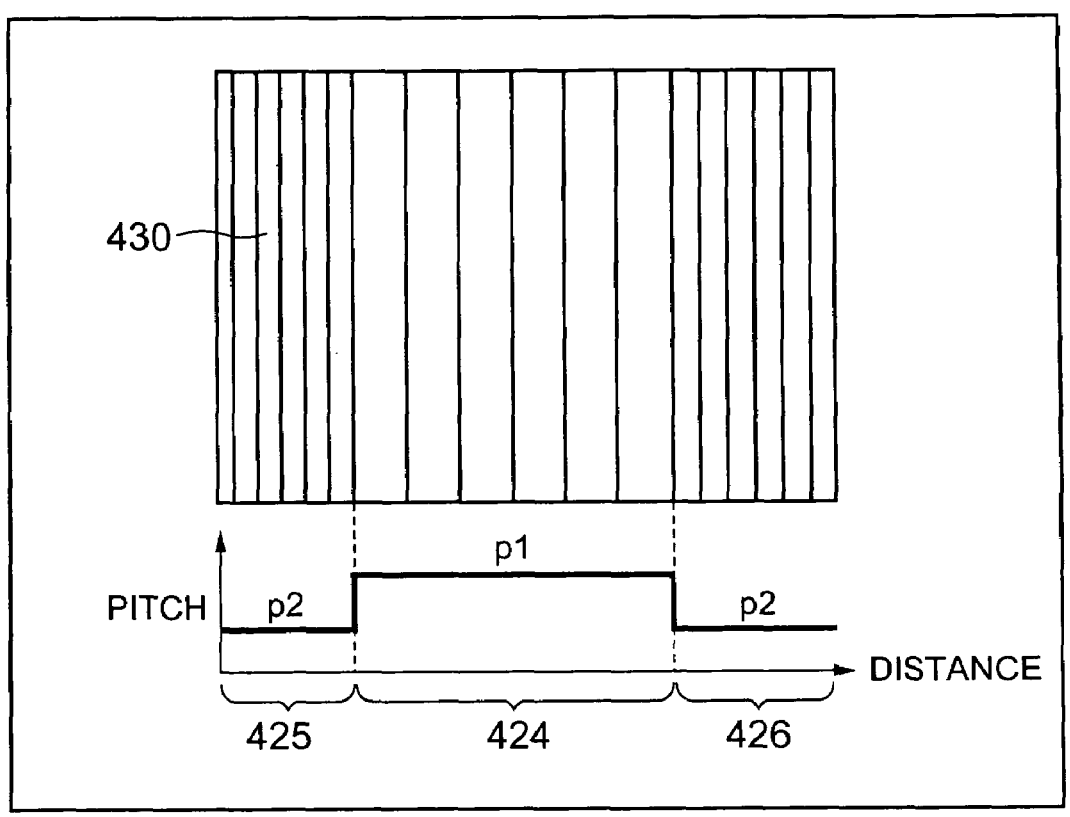
FIG. 35 is a plan view of a heat sink showing yet a further modified example.

As shown in FIG. 35, the top plate may be removed from the heat sink and the airflow guidance sections 425, 426 may be constructed so as not project outwards.

Figure 36A:
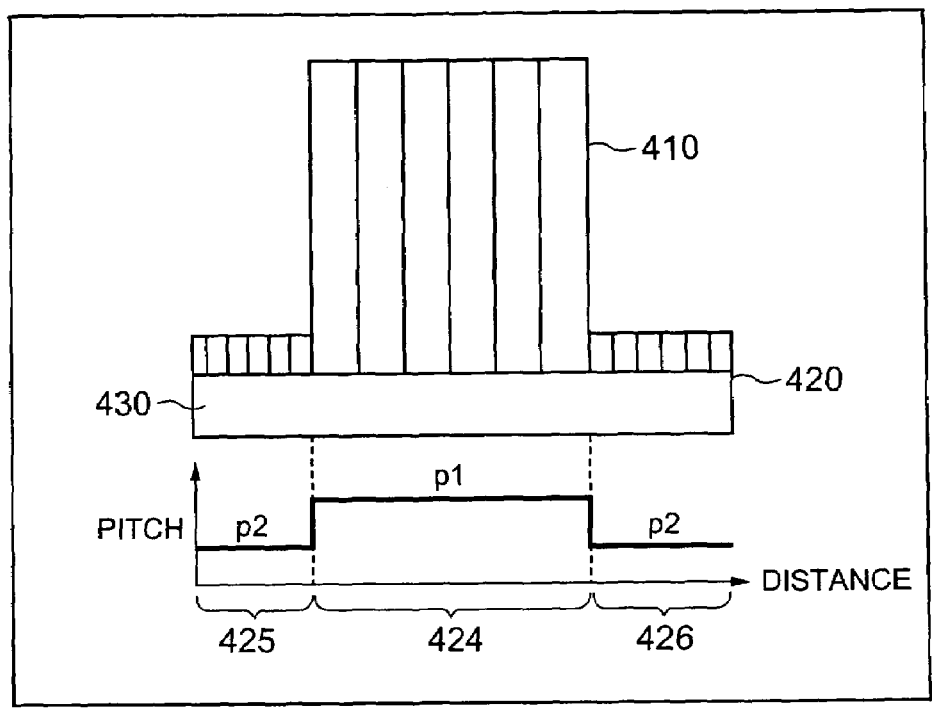
FIG. 36 is a plan view of a heat sink showing another modified example.
Figure 36B:
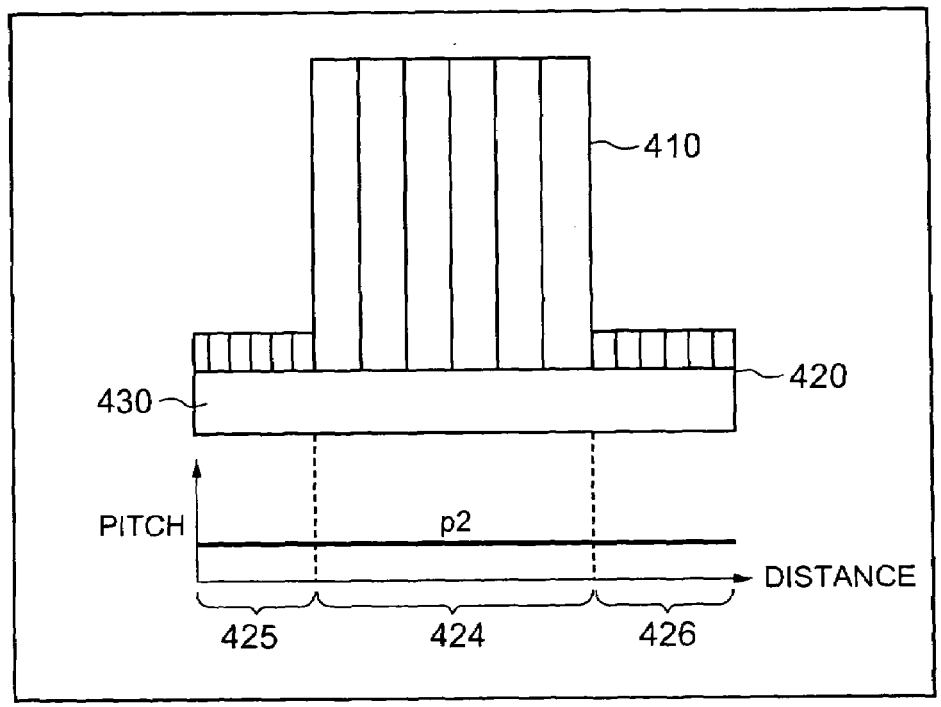

As shown in FIG. 36, it is also possible to provide only part of the front cooling section 420. In this case, the top plate 430 may be partially provided towards the upstream side in the direction of air flow. Also, as shown in FIG. 36(a), different fin pitches may be employed or, as shown in FIG. 36(b), the fin pitch may be kept constant.

Figure 37A:
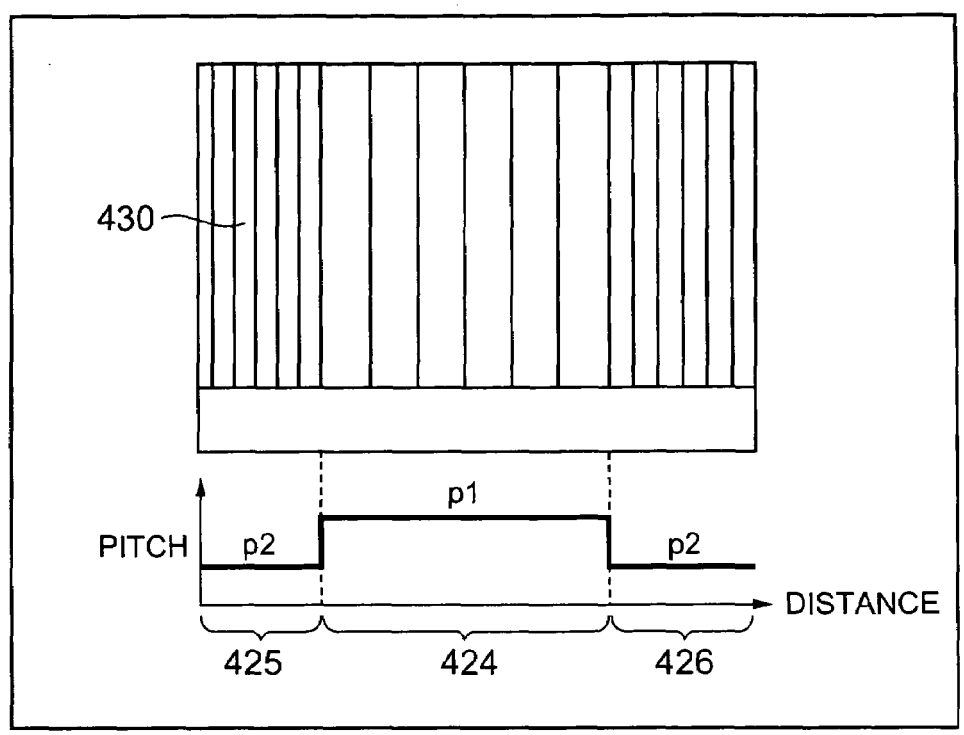
FIG. 37 is a plan view of heat sink showing yet a further modified example.
Figure 37B:
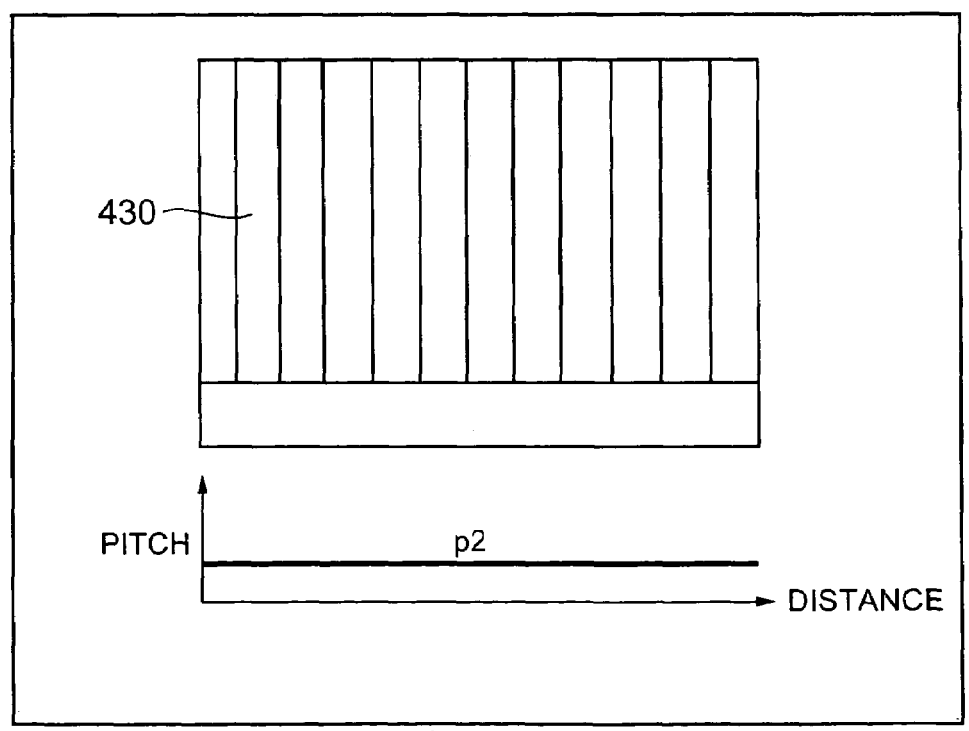

As shown in FIG. 37, the airflow guidance sections 425, 426 may be constructed so as not to project and the top plate 430 may be provided solely in the portion towards the upstream side of the direction of air flow. Also, as shown in FIG. 37(a), the fin pitches may be made different or, as shown in FIG. 37(b), the fin pitch may be kept constant.

9. Ninth Embodiment

Figure 38A:
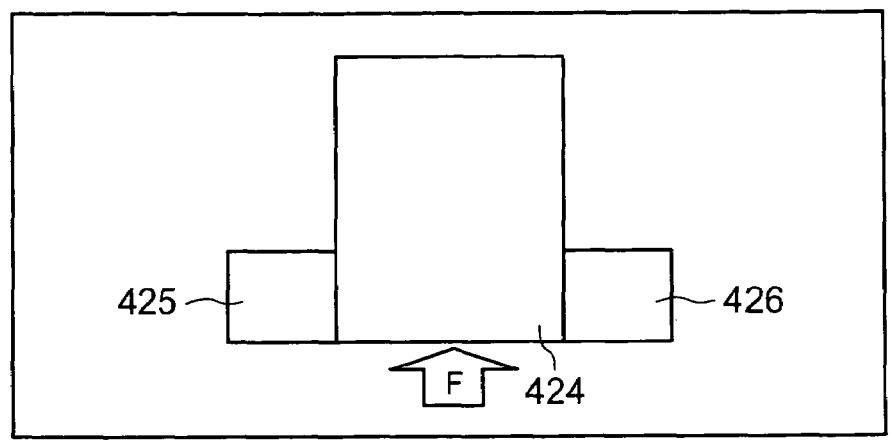
FIG. 38 is a plan view showing schematically a heat sink according to a ninth embodiment.
Figure 38B:
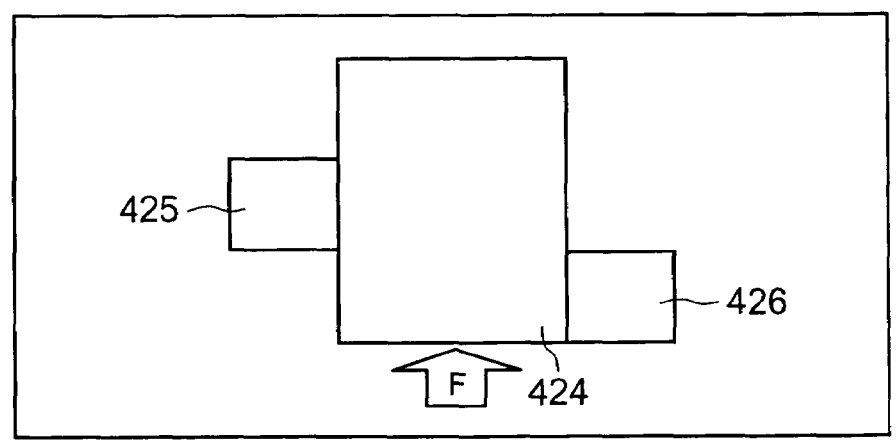
Figure 38C:
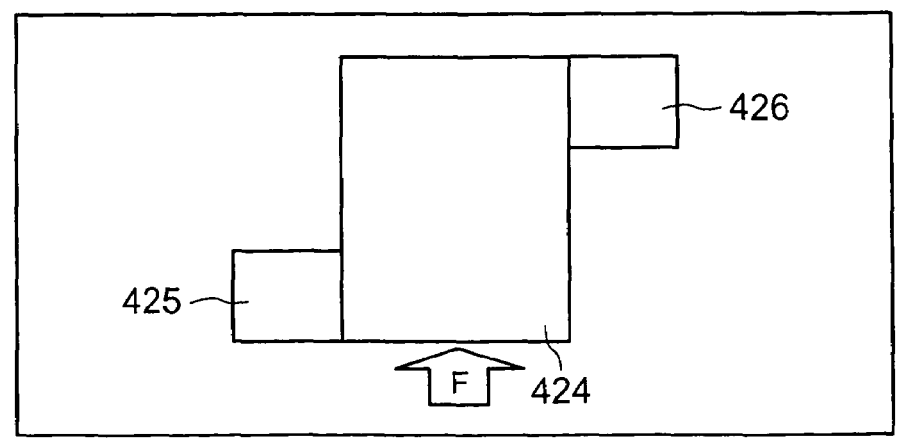

A brief description of various modified examples of the method of installing the airflow guidance sections 425, 426 will now be given with reference to FIG. 38 to FIG. 42. As shown in FIG. 38(a), the respective airflow guidance sections 425, 426 may be provided positioned on the upstream side of the airflow direction, on both the left and right sides of the main air inlet section 424. This construction was described in the first embodiment. As shown in FIG. 38(b), by displacing the position of one of the airflow guidance sections 425 in the downstream direction, it could be arranged in substantially the middle of the heat sink. As shown in FIG. 38(c), the position of the other airflow guidance section 426 may be further displaced downstream, so that it is provided to the rear of the heat sink.

Figure 39A:
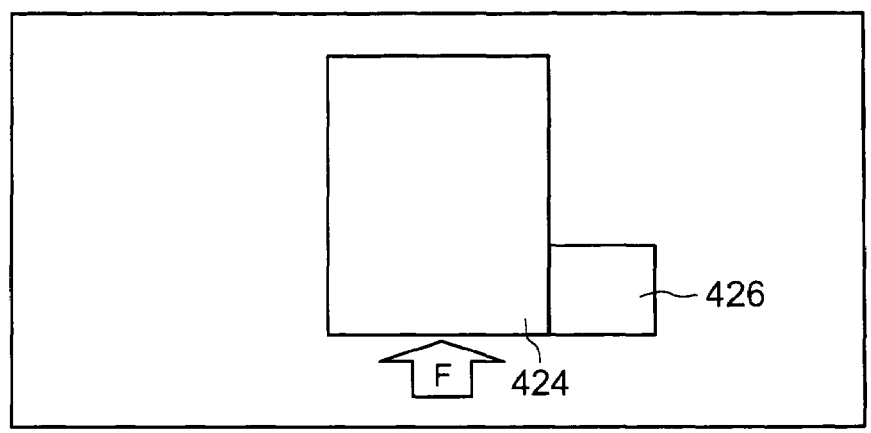
FIG. 39 is a schematic plan view of a heat sink according to a modified example.
Figure 39B:
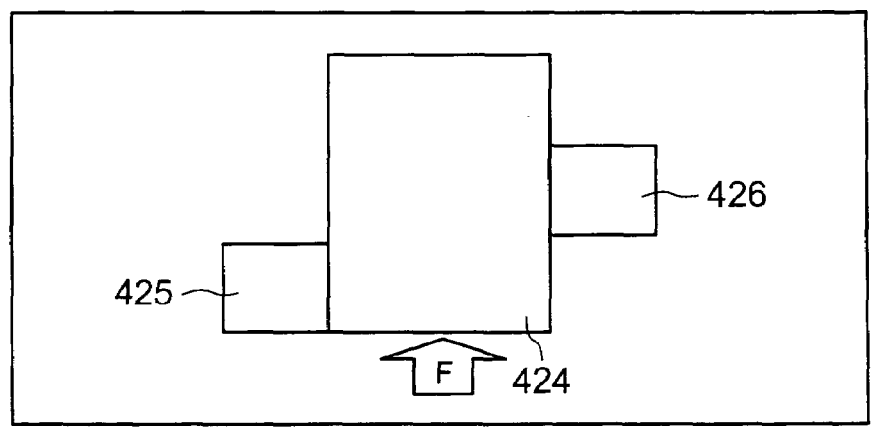
Figure 39C:
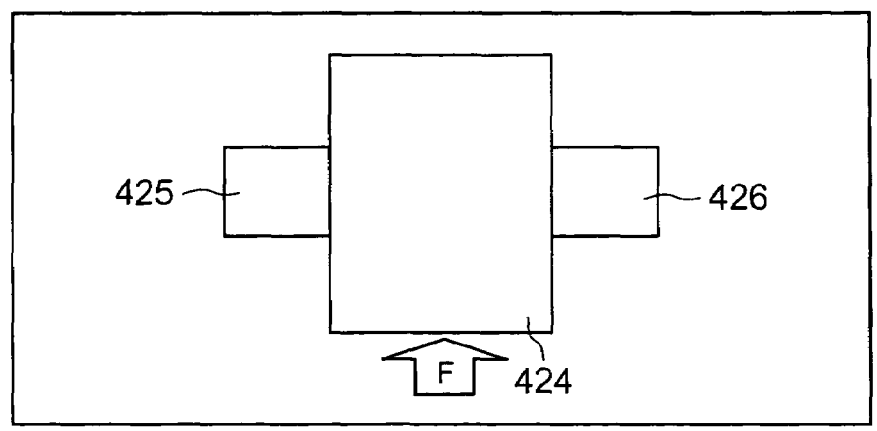

As shown in FIG. 39(a), one of the airflow guidance sections 425 could be dispensed with, only the other airflow guidance section 426 being provided. As shown in FIG. 39(b), the other airflow guidance section 426 may be provided at substantially the middle of the heat sink by displacing it in the downstream direction of the airflow. As shown in FIG. 39(c), the airflow guidance sections 425, 426 could also be respectively provided in substantially the middle of the heat sink.

Figure 40A:
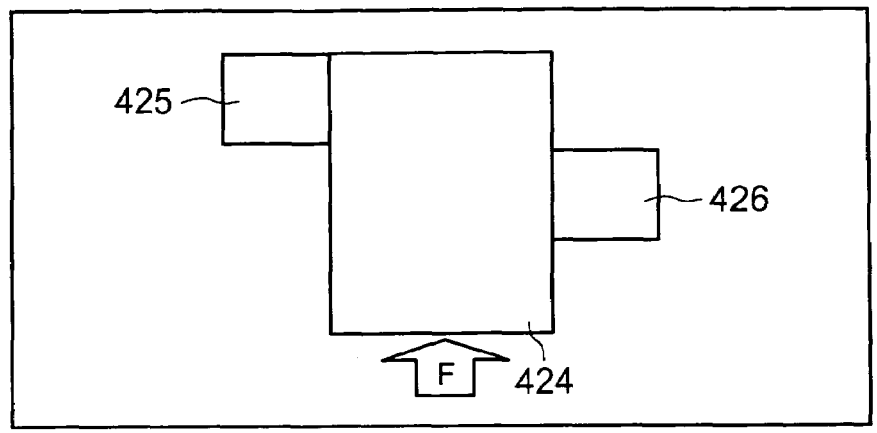
FIG. 40 is a schematic plan view of a heat sink according to another modified example.
Figure 40B:
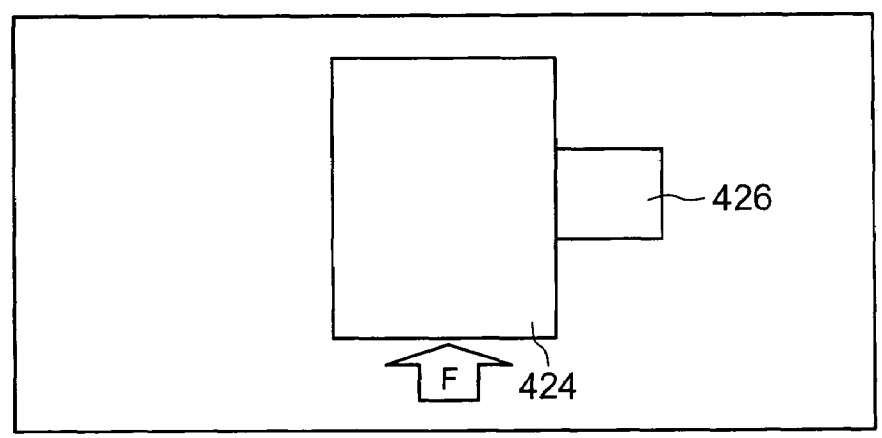
Figure 40C:
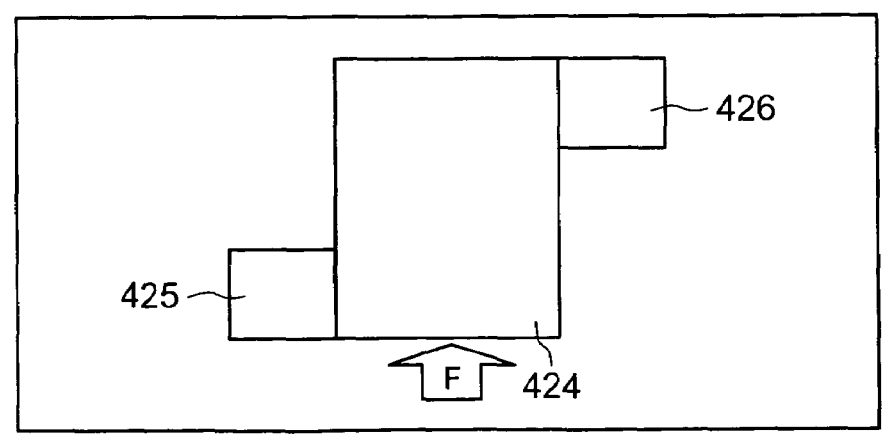

As shown in FIG. 40(a), it is also possible to provide one of the airflow guidance sections 425 to the rear of the heat sink by displacing it in the downstream direction of the air flow direction and to provide the other airflow guidance section 426 in substantially the middle of the heat sink. As shown in FIG. 40(b), it is also possible to dispense with one of the airflow guidance sections 425 and to provide the other airflow guidance section 426 in substantially the middle of the heat sink. As shown in FIG. 40(c) it is also possible to provide one of the airflow guidance sections 425 in front of the heat sink and to provide the other airflow guidance section 426 to the rear of the heat sink.

Figure 41A:
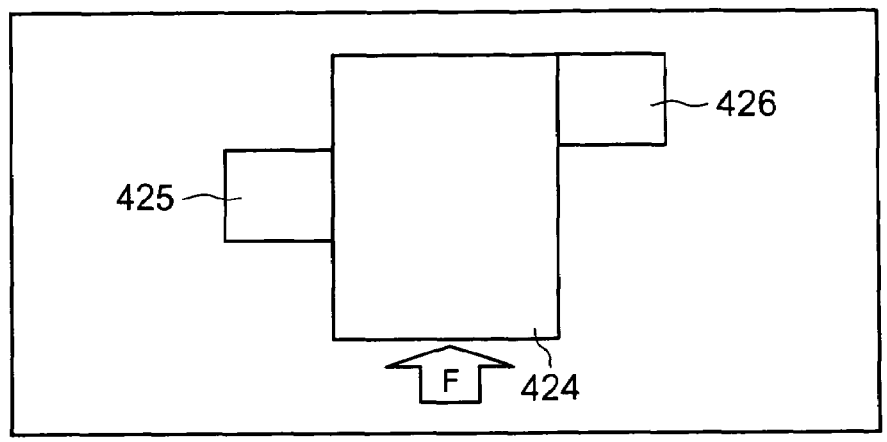
FIG. 41 is a schematic plan view of a heat sink according to yet another modified example.
Figure 41B:
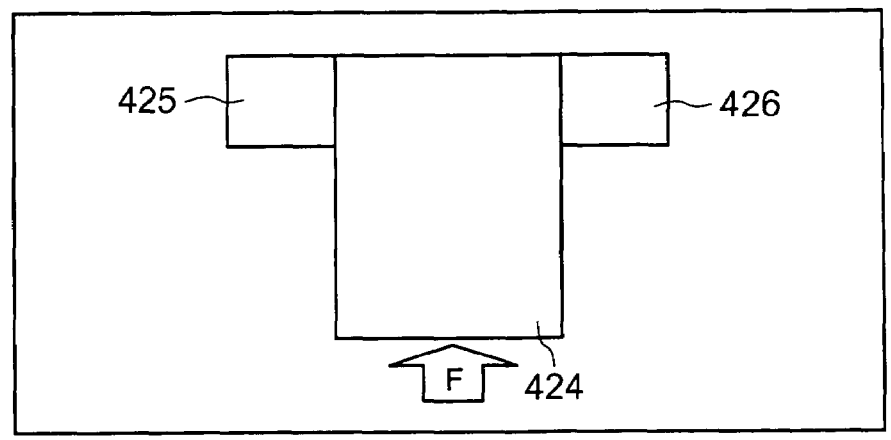
Figure 41C:
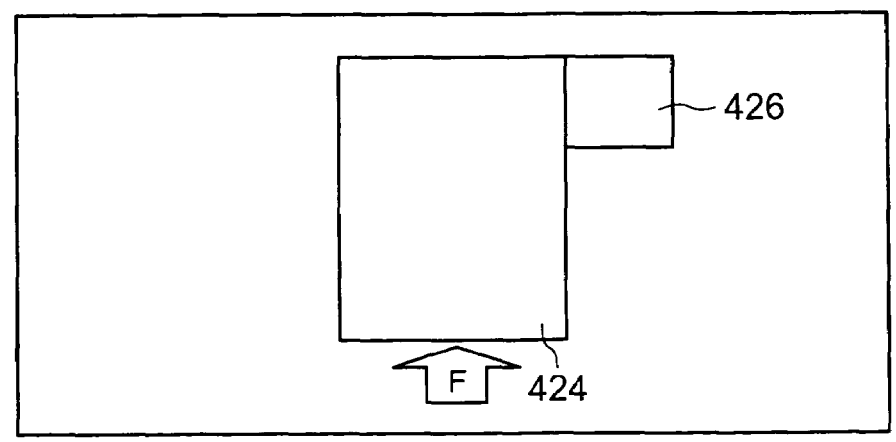
Figure 42A:
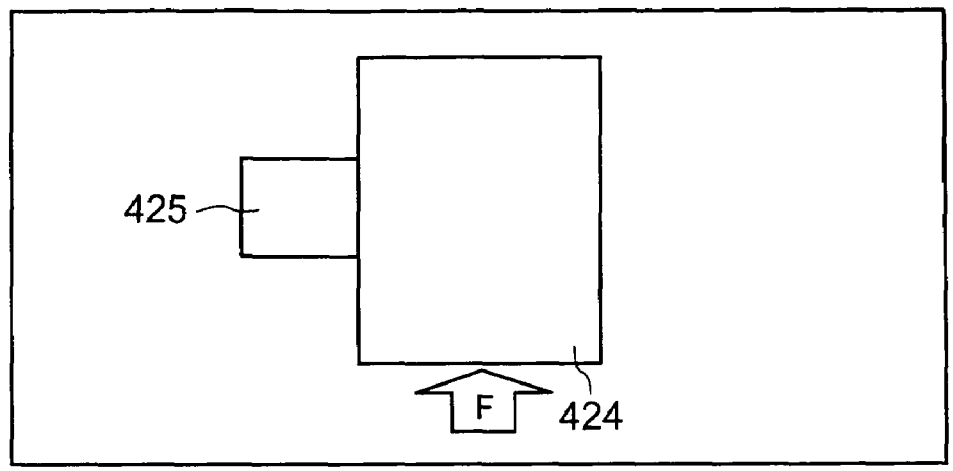
FIG. 42 is a schematic plan view of a heat sink according to another modified example.
Figure 42B:
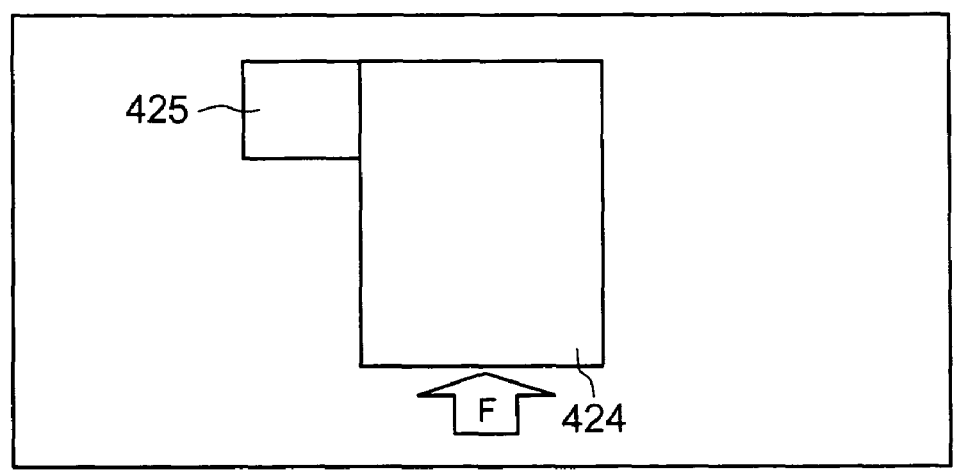

As shown in FIG. 41(a), it is also possible to provide one of the airflow guidance sections 425 in substantially the middle of the heat sink and to provide the other airflow guidance section 426 to the rear of the heat sink. As shown in FIG. 41(b), it is also possible to provide the airflow guidance sections 425, 426 respectively to the rear of the heat sink. As shown in FIG. 41(c) is also possible to dispense with one of the airflow guidance sections 425 and to provide the other airflow guidance section 426 to the rear of the heat sink.

10. Tenth Embodiment

Figure 43A:
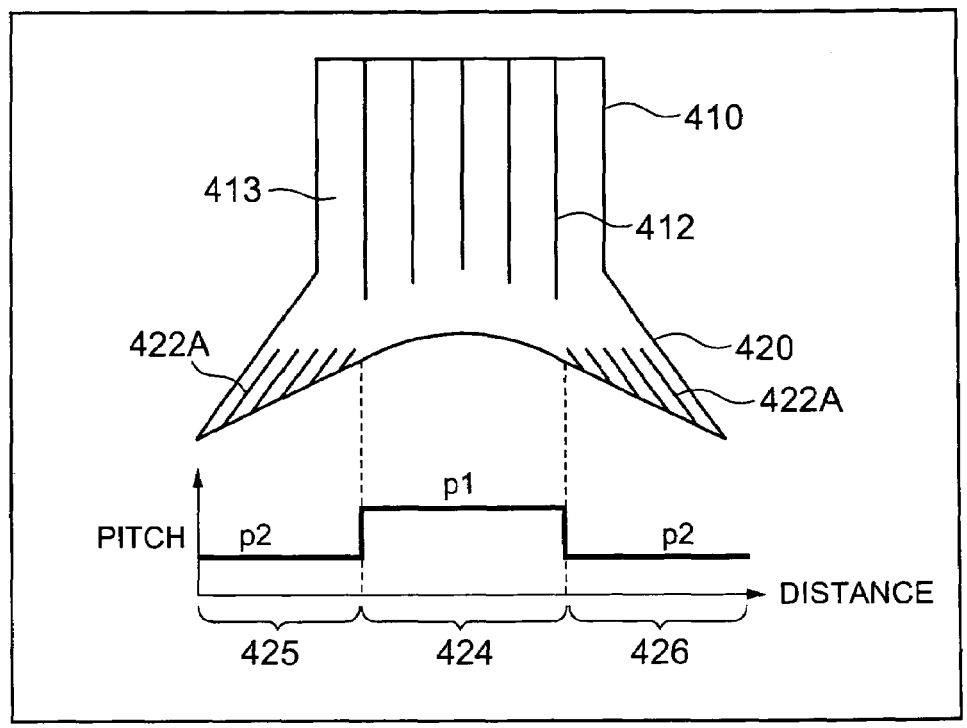
FIG. 43 is a diagram showing schematically a heat sink according to a tenth embodiment.

A tenth embodiment is described with reference to FIG. 43. As shown in FIG. 43(a), in this embodiment, the airflow guidance sections 425, 426 are formed in a curved shape so as to enter the rear cooling section 410 as they proceed from the outside towards the inside.

The upstream face in the air flow direction of the airflow guidance sections 425, 426, i.e. the face at which the air flows into the sections, has a shape that is smoothly curved as it passes from outside the heat sink towards the middle thereof, so as to enter the rear cooling section 410. Thus, the fins 422A of the airflow guidance sections 425, 426 are formed respectively inclined so as to face substantially the middle of the rear cooling section 410.

Also, the fins 412 of the rear cooling section 410 are formed matching the shape of the air inlet face of the airflow guidance sections 425, 426. Specifically, the fins 412 are formed such that the position of formation of their inlet ends is gradually displaced downstream passing from the outside (left and right sides in plan view) towards the middle.

Thanks to the above construction, air that collides with the airflow guidance sections 425, 426 can be guided towards the main air inlet section 424 and air that has flowed into the airflow guidance sections 425, 426 can be supplied to the flow paths 413 between the fins 412. It should be noted that the air inlet faces of the air inlet section 424 and airflow guidance sections 425, 426 are not restricted to being arcuate in shape or curved in shape but could also be formed of triangular shape (as seen in plan view).

Figure 43B:
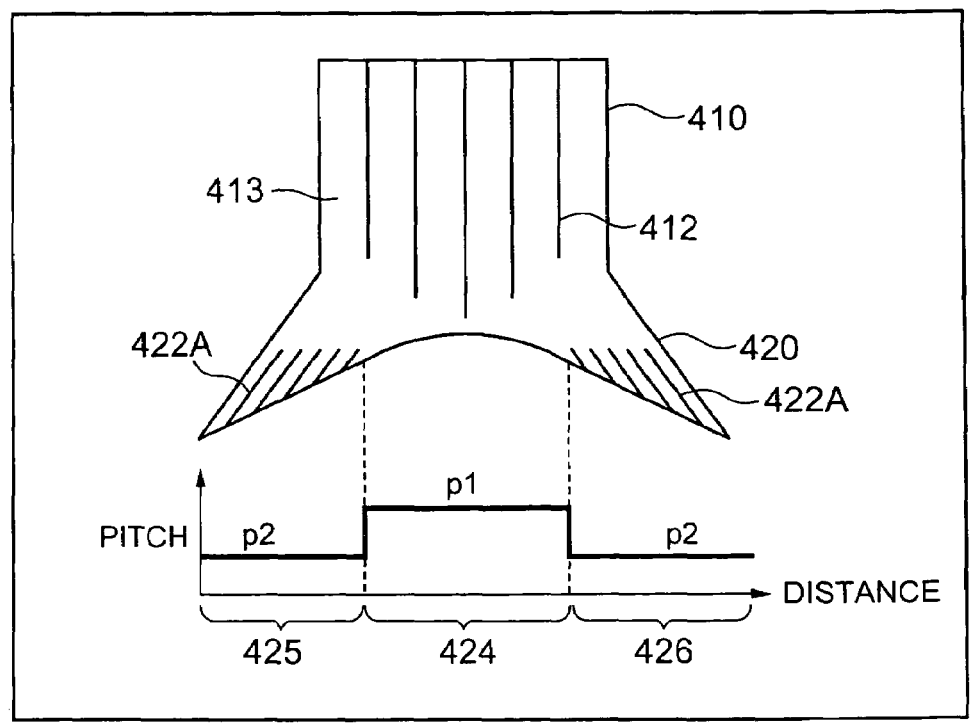

A modified example is shown in FIG. 43(b). In this modified example, the fins 412 of the rear cooling section 410 are formed such that the position of formation of their inlet ends is gradually displaced downstream passing from the middle thereof towards the outside.

As described above, by forming the face where the air flows into the airflow guidance sections 425, 426 provided on both the left and right sides of the main air inlet 424 as a curved face facing substantially the middle of the main air inlet section 424, part of the air that comes into contact with the air inlet face of the airflow guidance sections 425, 426 can be guided to the main air inlet section 424 via the curved face. It should be noted that, in the same way as described in the first embodiment, the fins 412 of the rear cooling section 410 could also be formed aligned to the same position and same length. Also, a construction could be adopted in which a top plate is provided covering all or part of the airflow guidance sections 425, 426 and/or the main air inlet section 424.

It should be noted that the present invention is not restricted to the embodiments described above. A person skilled in the art could make for example various additions or modifications within the scope of the present invention.

What is claimed is:

1. A storage device system comprising:
  a plurality of host interface control circuit boards for respectively controlling data exchange with a host device; and
  a memory circuit board useable by said host interface control circuit boards;
  wherein a prescribed host interface control circuit board of said host interface control circuit boards includes a circuit board, a plurality of circuit components provided on this circuit board and a heat sink;
  where said heat sink is constituted by integral formation of a main cooling section and at least one airflow guidance section; with the main cooling section provided with a plurality of first heat-radiating fins over the entire length of the heat sink from the airflow inlet towards the airflow outlet; and the at least one airflow guidance section provided so as to extended to both left and right sides of the main cooling section on the outside of said main cooling section along a direction of arrangement of said first-mentioned heat-radiating fins, and including a plurality of other heat-radiating fins formed with narrower pitch than the pitch of said first-mentioned heat radiating fins;
  a width dimension of said heat sink at the side where the air flows into said heat sink, is set to span the inflow path of air to said host interface circuit board; and
  in a prescribed heat sink region corresponding to a position of a prescribed circuit component to be cooled by said heat sink, a pitch of said heat-radiating fins is set to be narrower than a pitch of said heat-radiating fins in other heat sink regions of said main cooling section, second heat-radiating fins of shorter length than said first heat-radiating fins are provided between said first heat-radiating fins.

2. The storage device system according to claim 1, wherein said airflow guidance section is provided in the vicinity of the air inlet side of the inflow path respectively formed between said heat-radiating fins.

3. The storage device system according to claim 1, wherein said airflow guidance section comprises a top plate section provided so as to cover at least the air inlet side of said inflow path.

4. The storage device system according to claim 1, wherein said plurality of other heat-radiating fins of said airflow guidance section are arranged towards the direction of said prescribed circuit component.

5. The storage device system according to claim 1, wherein the pitch is set to become narrower in stepped fashion from said first-mentioned heat-radiating fins towards said other heat-radiating fins.

6. The storage device system according to claim 1, wherein another prescribed circuit component is arranged on the air outlet side of said airflow guidance section.

7. The storage device system according to claim 1, wherein said airflow guidance section is constituted so as to cut off inflow of air.

8. The storage device system according to claim 1, wherein another prescribed circuit component is arranged on the air outlet side of said main cooling section.

9. The storage device system according to claim 1, wherein an airflow guidance plate is arranged in an opposite position separated from the air flow paths between said heat-radiating fins.

10. The storage device system according to claim 9, wherein another circuit board provided adjacent to said prescribed host interface control circuit board opposite to the mounting surface of said heat sink is employed as said airflow guidance plate.

11. The storage device system according to claim 9, wherein said airflow guidance plate is a dummy circuit board arranged adjacent to said prescribed host interface control circuit board opposite to the mounting surface of said heat sink.

12. The storage device system according to claim 9, wherein a projection projecting towards the outside from the face on the opposite side to the face opposite to said heat sink is provided on said airflow guidance plate.

13. The storage device system according to claim 9, wherein said airflow guidance plate is mounted on said heat sink so as to cover the entirety of said heat sink.

14. The storage device system according to claim 1, wherein said heat sink cools also a prescribed circuit component provided on a further prescribed host interface control circuit board provided in a condition facing said prescribed host interface control circuit board, in addition to said first-mentioned prescribed circuit component.

15. The storage device system according to claim 1, wherein the front face side of said airflow guidance section is formed so as to be inclined towards said prescribed component.

16. The storage system according to claim 1, wherein said prescribed host interface control circuit board performs data exchange at file level using TCP/IP, and said prescribed circuit component is an operation processing circuit that controls said data exchange.

17. The storage device system according to claim 1, wherein said heat sink is T-shaped, with the main cooling section forming an upright portion of the T, and with the at least one airflow guidance section forming overhanging portions of the T.

18. The storage device system according to claim 1, wherein said heat sink including the main cooling section and the at least one airflow guidance section, is of monolithic construction.

* * * * *